United States Patent
Lu et al.

(10) Patent No.: US 12,101,979 B2
(45) Date of Patent: Sep. 24, 2024

(54) DISPLAY SUBSTRATE WITH AN AUXILIARY CATHODE LAYER, METHOD OF MANUFACTURING THE SAME, AND DISPLAY DEVICE

(71) Applicant: BOE TECHNOLOGY GROUP CO., LTD., Beijing (CN)

(72) Inventors: Jiangnan Lu, Beijing (CN); Libin Liu, Beijing (CN); Jie Zhang, Beijing (CN); Mei Li, Beijing (CN); Yuhan Qian, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 475 days.

(21) Appl. No.: 17/435,363

(22) PCT Filed: Mar. 15, 2021

(86) PCT No.: PCT/CN2021/080757
§ 371 (c)(1),
(2) Date: Aug. 31, 2021

(87) PCT Pub. No.: WO2021/190334
PCT Pub. Date: Sep. 30, 2021

(65) Prior Publication Data
US 2022/0328611 A1 Oct. 13, 2022

(30) Foreign Application Priority Data
Mar. 23, 2020 (CN) .......................... 202010207082.2

(51) Int. Cl.
*H10K 59/12* (2023.01)
*H10K 50/813* (2023.01)
(Continued)

(52) U.S. Cl.
CPC ....... *H10K 59/1315* (2023.02); *H10K 50/813* (2023.02); *H10K 50/824* (2023.02);
(Continued)

(58) Field of Classification Search
CPC ........... H10K 59/1213; H10K 59/1201; H10K 59/351; H10K 50/824; H10K 50/813; H10K 71/00
(Continued)

(56) References Cited

U.S. PATENT DOCUMENTS

| | | |
|---|---|---|
| 2008/0197778 A1 | 8/2008 | Kubota |
| 2015/0144922 A1* | 5/2015 | Moon .................. H10K 59/131 257/40 |

(Continued)

FOREIGN PATENT DOCUMENTS

| | | |
|---|---|---|
| CN | 107331691 A | 11/2017 |
| CN | 107604306 A | 1/2018 |

(Continued)

OTHER PUBLICATIONS

Extended European Search Report for Application No. 21758299.8, dated Sep. 5, 2023, 8 Pages.
(Continued)

*Primary Examiner* — Phuc T Dang
(74) *Attorney, Agent, or Firm* — Brooks Kushman P.C.

(57) ABSTRACT

The display substrate includes: a substrate, an auxiliary cathode layer, a first insulating layer, an anode layer, a second insulating layer, and a cathode layer that are sequentially stacked on the substrate in a direction away from the substrate; the anode layer includes a plurality of anode patterns spaced apart from each other, and an anode spacing area is formed between adjacent anode patterns; an orthographic projection of the auxiliary cathode layer on the substrate and an orthographic projection of the cathode layer
(Continued)

on the substrate have an auxiliary overlapping area, and the auxiliary cathode layer is electrically connected to the cathode layer through a connection via hole in the auxiliary overlapping area; an orthographic projection of the connection via hole on the substrate is located inside the orthographic projection of the anode spacing area on the substrate.

18 Claims, 23 Drawing Sheets

(51) Int. Cl.
  *H10K 50/824* (2023.01)
  *H10K 59/131* (2023.01)
  *H10K 71/00* (2023.01)
  *H10K 59/35* (2023.01)
(52) U.S. Cl.
  CPC ......... *H10K 71/00* (2023.02); *H10K 59/1201* (2023.02); *H10K 59/351* (2023.02)
(58) Field of Classification Search
  USPC ........................................................ 257/89
  See application file for complete search history.

(56) References Cited

U.S. PATENT DOCUMENTS

| | | |
|---|---|---|
| 2016/0293888 A1 | 10/2016 | Shim et al. |
| 2018/0261797 A1 | 9/2018 | Lee |
| 2019/0074338 A1 | 3/2019 | Gu |
| 2019/0140030 A1 | 5/2019 | Huangfu et al. |
| 2021/0135149 A1 | 5/2021 | Xin et al. |

FOREIGN PATENT DOCUMENTS

| | | | | |
|---|---|---|---|---|
| CN | 108899348 A | * | 11/2018 | ........... G09G 3/3258 |
| CN | 109273516 A | * | 1/2019 | ......... H10K 59/1201 |
| CN | 110192282 A | * | 8/2019 | ......... H01L 27/3246 |
| CN | 110752243 A | | 2/2020 | |
| CN | 110854290 A | | 2/2020 | |

OTHER PUBLICATIONS

International Search Report and Written Opinion for Application No. PCT/CN2021/080757, dated Jun. 23, 2021, 7 Pages.

* cited by examiner

DISPLAY SUBSTRATE WITH AN AUXILIARY CATHODE LAYER, METHOD OF MANUFACTURING THE SAME, AND DISPLAY DEVICE

CROSS-REFERENCE TO RELATED APPLICATIONS

This application is the U.S. national phase of PCT Application No. PCT/CN2021/080757 filed on Mar. 15, 2021, which claims priority to Chinese Patent Application No. 202010207082.2 filed on Mar. 23, 2020, which are incorporated herein by reference in their entireties.

TECHNICAL FIELD

The present disclosure relates to the field of display technology, in particular to a display substrate, a method of manufacturing the same and a display device.

BACKGROUND

With the continuous development of the display technology, the application range of the display device is increasing, and the performance requirements of the display device are increasing, in which the power consumption of the display device attracts more attention as an important indicator of the performance of the display device.

SUMMARY

In a first aspect, the present disclosure provides in some embodiments a display substrate, includes: a substrate, and an auxiliary cathode layer, a first insulating layer, an anode layer, a second insulating layer, and a cathode layer that are sequentially stacked on the substrate in a direction away from the substrate; wherein the anode layer includes a plurality of anode patterns spaced apart from each other, and an anode spacing area is formed between adjacent anode patterns; an orthographic projection of the auxiliary cathode layer on the substrate and an orthographic projection of the cathode layer on the substrate have an auxiliary overlapping area, and the auxiliary cathode layer is electrically connected to the cathode layer through a connection via hole in the auxiliary overlapping area; an orthographic projection of the connection via hole on the substrate is located inside an orthographic projection of the anode spacing area on the substrate.

Optionally, the auxiliary cathode layer is formed in a mesh structure, and the orthographic projection of the auxiliary cathode layer on the substrate is located inside the orthographic projection of the anode spacing area on the substrate.

Optionally, the auxiliary overlapping area includes a strip area extending in a first direction, and the orthographic projection of the connection via hole on the substrate is a strip pattern extending in the first direction.

Optionally, the auxiliary cathode layer is formed in a mesh structure, and an orthographic projection of a first part of the auxiliary cathode layer on the substrate is located inside the orthographic projection of the anode spacing area on the substrate, an orthographic projection of a second part of the auxiliary cathode layer on the substrate is located inside the orthographic projection of the anode pattern on the substrate.

Optionally, the anode pattern includes a body portion and a connection portion of an integral structure, the body portion has at least one symmetry axis, and an orthographic projection of a target portion in the second part of the auxiliary cathode layer on the substrate is axially symmetrical along the at least one symmetry axis and an orthographic projection of the target portion on the substrate is located inside an orthographic projection of the body portion on the substrate.

Optionally, the display substrate further includes a second electrode located in a non-display area of the display substrate, and the second electrode is electrically connected to the auxiliary cathode layer and the cathode layer.

Optionally, the second electrode includes a first conductive pattern and a second conductive pattern that are stacked, and the first conductive pattern is located between the substrate of the display substrate and the second conductive patterns; the first conductive pattern includes: an annular portion surrounding a display area and having an opening, and the opening of the annular portion having a first end and a second end; a first wire inlet portion electrically connected to the first end; and a second wire inlet portion electrically connected to the second end; wherein the second conductive pattern has an annular shape, and an orthographic projection of the second conductive pattern on the substrate of the display substrate and an orthographic projection of the annular portion on the substrate have a first overlapping area, the second conductive pattern is electrically connected to the annular portion in the first overlapping area.

Optionally, the display substrate further includes: a first conductive connection portion arranged on a same layer and made of a same material as the second conductive pattern, and the second conductive pattern being coupled to the auxiliary cathode layer through the first conductive connection portion; wherein the orthographic projection of the second conductive pattern on the substrate and the orthographic projection of the cathode layer on the substrate have a third overlapping area, the second conductive pattern is electrically connected to the cathode layer in the third overlapping area.

Optionally, the display substrate further includes: a second conductive connection layer located between the substrate and the anode layer, wherein the auxiliary cathode layer and the second conductive connection layer are arranged on the same layer and made of the same material, and the auxiliary cathode layer and the second conductive connection layer are insulated from each other.

Optionally, the display substrate further includes: a driving circuit layer located between the substrate and the anode layer, and the driving circuit layer includes pixel driving circuits corresponding to the anode patterns in a one-to-one manner; the second conductive connection layer includes a plurality of second conductive connection patterns, and the second conductive connection patterns correspond to the anode patterns in a one-to-one manner, and the pixel driving circuit is electrically connected to a corresponding anode pattern through a corresponding second conductive connection pattern.

Optionally, a minimum distance between the orthographic projection of the second conductive connection pattern on the substrate and the orthographic projection of the auxiliary cathode layer on the substrate is greater than a threshold.

Optionally, the driving circuit layer includes a first source-drain metal layer and a second source-drain metal layer, the auxiliary cathode layer, the second conductive connection layer and the second source-drain metal layer are arranged in the same layer and made of the same material.

Optionally, the display substrate further includes: a plurality of repeating units, wherein each repeating unit includes at least three sub-pixels arranged at intervals, and each sub-pixel includes one anode pattern, an anode spacing area is formed between anode patterns of two adjacent sub-pixels.

Optionally, the auxiliary cathode layer is formed as a mesh structure, the mesh structure includes a body portion, the body portion defines a plurality of third enclosed areas, the third enclosed areas correspond to the repeating units in a one-to-one manner, and orthographic projections of the third enclosed areas on the substrate of the display substrate surround orthographic projections of the anode areas in the repeating units on the substrate in a one-to-one manner, and the anode area includes the anode pattern included in each sub-pixel in the repeating unit.

Optionally, the auxiliary cathode layer is formed as a mesh structure, and the mesh structure includes a body portion that defines a plurality of fourth enclosed areas; all the sub-pixels included in the plurality of repeating units are divided into a plurality of sub-pixel groups, and each sub-pixel group includes at least one of the sub-pixels; orthographic projections of the fourth enclosed areas on the substrate of the display substrate surround orthographic projections of the anode areas in the sub-pixel group on the substrate in a one-to-one manner, and the anode area includes the anode pattern included in each sub-pixel in the sub-pixel group.

Optionally, the sub-pixel group includes at least one sub-pixel of the same color; and/or, the sub-pixel group includes at least two sub-pixels of different colors.

Optionally, each repeating unit includes one red sub-pixel, one blue sub-pixel, and two green sub-pixels; an orthographic projection of at least part of the body portion on the substrate of the display substrate is located between orthographic projections of the anode patterns in the two green sub-pixels on the substrate.

Optionally, wherein the plurality of repeating units are arranged in an array, each repeating unit includes a plurality of sub-pixels, and the plurality of sub-pixels includes one red sub-pixel, one blue sub-pixel, and two green sub-pixels; in each repeating unit, the two green sub-pixels are arranged along a first direction, the red sub-pixel is located on a first side of the two green sub-pixels, and the blue sub-pixel is located on a second side of the two green sub-pixels, the first side and the second side are opposite along a second direction, and the second direction is perpendicular to the first direction.

Optionally, a line connecting centers of two green sub-pixels in each repeating unit is located between centers of two adjacent red and blue sub-pixels in adjacent repeating units.

Optionally, a size of a red or blue sub-pixel is larger than a size of the blue sub-pixel in the second direction.

Optionally, the plurality of repeating units are arranged in the second direction to form a repeating unit group, and a plurality of repeating unit groups are arranged in the first direction, to form a pixel arrangement structure of the display substrate.

Optionally, adjacent repeating unit groups are staggered from each other along the second direction.

Optionally, the plurality of repeating units are distributed in array, each repeating unit includes a plurality of sub-pixels including one red sub-pixel, one blue sub-pixel and one green sub-pixel; the green sub-pixel, the red sub-pixel, and the blue sub-pixel are sequentially arranged in the second direction.

In a second aspect, a display device includes the display substrate.

In a third aspect, a method of manufacturing a display substrate, includes: forming an auxiliary cathode layer on a substrate; forming a first insulating layer on a side of the auxiliary cathode layer away from the substrate; forming an anode layer on a side of the first insulating layer away from the substrate, wherein the anode layer includes a plurality of anode patterns spaced apart from each other, and an anode spacing area is formed between adjacent anode patterns; forming a second insulating layer on a side of the anode layer away from the substrate; forming a cathode layer on a side of the second insulating layer away from the substrate, wherein an orthographic projection of the auxiliary cathode layer on the substrate and an orthographic projection of the cathode layer on the substrate have an auxiliary overlapping area, the auxiliary cathode layer and the cathode layer are electrically connected through a connection via hole provided in the auxiliary overlapping area; an orthographic projection of the connection via hole on the substrate is located within an orthographic projection of the anode spacing area on the substrate.

Optionally, the forming the auxiliary cathode layer specifically includes: forming the auxiliary cathode layer and the second conductive connection layer between the substrate and the anode layer in the display substrate through one patterning process at the same time, the auxiliary cathode layer being insulated from the second conductive connection layer.

Optionally, the first insulating layer is a planarization layer, and forming the first insulating layer on a side of the auxiliary cathode layer away from the substrate includes: forming a planarization layer on the side of the auxiliary cathode layer away from the substrate, wherein the planarization layer is provided with an auxiliary opening of the planarization layer capable of exposing at least part of the auxiliary cathode layer; the forming an anode layer on a side of the first insulating layer away from the substrate includes: forming the anode layer on the side of the planarization layer away from the substrate, and an orthographic projection of each anode pattern included in the anode layer on the substrate does not overlap the auxiliary opening of the planarization layer; the second insulating layer includes a pixel defining layer and an organic light-emitting material layer, and the forming the second insulating layer on the side of the anode layer away from the substrate includes: forming a pixel defining layer on the side of the anode layer away from the substrate; wherein the pixel defining layer is provided with a defining layer auxiliary opening and a pixel opening; an orthographic projection of the defining layer auxiliary opening on the substrate is surrounded by an orthographic projection of the auxiliary opening of the planarization layer on the substrate, the defining layer auxiliary opening exposes at least part of the auxiliary cathode layer; the pixel opening corresponds to the anode patterns in a one-to-one manner, and the pixel opening exposes at least part of the corresponding anode pattern; forming a sacrificial pattern on an exposed surface of the auxiliary cathode layer away from the substrate; forming an organic light-emitting material layer, wherein the organic light-emitting material layer includes a portion at least covering the anode pattern and a portion covering the sacrificial pattern, the portion at least covering the anode pattern and the portion covering the sacrificial pattern are independent of each other; and removing the sacrificial pattern and the portion of the organic light-emitting material layer covering the sacrificial pattern to form an connection via hole capable of exposing a part of the auxiliary cathode layer; the forming the cathode layer on the side of the second insulating layer away from the substrate includes: forming a cathode layer on the side of the organic light-emitting material layer away from the substrate, and the cathode layer is electrically connected to the auxiliary cathode layer through the connection via hole.

In a fourth aspect, a display substrate includes: a display area and a non-display area surrounding the display area, the display area including a plurality of pixel opening areas and a plurality of pixel spacing area arranged between the pixel opening areas; the display substrate further includes: a first electrode, at least a portion of the first electrode being located at the pixel spacing area, an orthographic projection of the first electrode on a substrate of the display substrate does not overlap an orthographic projection of the pixel opening area on the substrate; and a second electrode electrically connected to the first electrode, the second electrode being located in the non-display area.

Optionally, the first electrode is formed as a mesh structure.

Optionally, the display substrate further includes: a plurality of anode patterns corresponding to the plurality of pixel opening areas in a one-to-one manner, and the orthographic projection of the pixel opening areas on the substrate is within the orthographic projection of the corresponding anode pattern on the substrate; the first electrode and the anode pattern are arranged in the same layer and made of the same material, and the first electrode is insulated from the anode pattern.

Optionally, the second electrode and the first electrode may be arranged in the same layer and made of the same material.

Optionally, the second electrode may include a first conductive pattern and a second conductive pattern that are stacked, and the first conductive pattern is located between the substrate of the display substrate and the second conductive pattern; the first conductive pattern includes: an annular portion, a first wire inlet portion and a second wire inlet portion; the annular portion surrounds the display area, and has an opening, and the opening of the annular portion has a first end and a second end; the first wire inlet portion is electrically connected to the first end; the second wire inlet portion is electrically connected to the second end; the second conductive pattern is in an annular shape, the orthographic projection of the second conductive pattern on the substrate of the display substrate and the orthographic projection of the annular portion on the substrate have a first overlapping area, the second conductive pattern is electrically connected to the annular portion in the first overlapping area; the second conductive pattern is arranged in the same layer and made of the same material as the first electrode and is directly electrically connected to the first electrode.

Optionally, the first electrode further includes a portion located in the non-display area, the portion is electrically connected to the second electrode.

Optionally, the display substrate further includes: a third electrode electrically connected to the first electrode, the third electrode includes a first part, a second part, and a third part, the orthographic projection of a plurality of pixel opening areas on the substrate is located within the orthographic projection of the first part on the substrate, the second part is located in the pixel spacing area, and the third part is located in the non-display area.

Optionally, the orthographic projection of the second part of the third electrode on the substrate and the orthographic projection of the first electrode on the substrate have a second overlapping area, and the second part of the third electrode is electrically connected to the first electrode through a second via hole provided in the second overlapping area.

Optionally, the orthographic projection of the third part of the third electrode on the substrate and the orthographic projection of the second conductive pattern of the second electrode on the substrate have a third overlapping area. The third part of the third electrode is electrically connected to the second conductive pattern through a third via hole provided in the third overlapping area.

Optionally, the second electrode includes a negative power supply signal line surrounding the display area, and the third electrode includes a cathode.

Optionally, the display substrate further includes a plurality of repeating units, each repeating unit includes at least three sub-pixels arranged at intervals, and each sub-pixel includes a pixel opening area, a pixel spacing area is formed between two adjacent pixel opening areas.

Optionally, the mesh structure includes a body portion that defines a plurality of first enclosed areas, the first enclosed areas correspond to the repeating units in a one-to-one manner, and the orthographic projection of the first enclosed area on the substrate of the display substrate surrounds the orthographic projection of an opening area of the repeating unit on the substrate, and the opening area includes a pixel opening area included in each sub-pixel in the repeating unit.

Optionally, the mesh structure includes a body portion that defines a plurality of second enclosed areas; all sub-pixels included in the plurality of repeating units can be divided into multiple sub-pixel groups, and each sub-pixel group includes at least one of the sub-pixel; the orthographic projection of the second enclosed area on the substrate of the display substrate surrounds the orthographic projection of the corresponding sub-pixel group on the substrate.

Optionally, the sub-pixel group includes at least one sub-pixel of the same color; and/or the sub-pixel group may include at least two sub-pixels of different colors.

Optionally, each repeating unit includes one red sub-pixel, one blue sub-pixel, and two green sub-pixels; the orthographic projection of at least part of the body portion on the substrate is located between the orthographic projections of the first openings of the two green sub-pixels on the substrate.

Optionally, the plurality of repeating units are arranged in an array, in each repeating unit, the two green sub-pixels are arranged along a first direction, and the red sub-pixels are located on a first side of the two green sub-pixels, the blue sub-pixel is located on a second side of the two green sub-pixels, the first side and the second side are opposite in a second direction, the second direction is perpendicular to the first direction.

Optionally, the green sub-pixels are arranged in a first direction, and the sizes of the red and blue sub-pixels in the first direction are larger than sizes thereof in the second direction.

Optionally, a line connecting centers of the two green sub-pixels in each repeating unit is between centers of two adjacent red and blue sub-pixels in adjacent repeating units.

Optionally, the size of the red and blue sub-pixels in the first direction is larger than the size of the blue sub-pixel in the second direction.

Optionally, the plurality repeating units are arranged in the second direction to form a repeating unit group, a plurality of repeating unit groups are arranged in the first direction to form a pixel arrangement structure of the display substrate.

Optionally, adjacent repeating unit groups are staggered along the second direction.

Optionally, each repeating unit includes one red sub-pixel, one blue sub-pixel, and one green sub-pixel; the plurality of repeating units are arranged in an array, and the plurality of repeating units can be divided into a plurality of columns of repeating units, each column of repeating units includes a plurality of repeating units arranged in a first direction, and each column of repeating units can be divided into two columns of sub-pixels, and one column of sub-pixels includes a plurality of red sub-pixels and a plurality of blue sub-pixels, the red sub-pixels and the blue sub-pixels are alternately arranged along the first direction, and the other column of sub-pixels includes a plurality of green sub-pixels arranged along the first direction.

In a fifth aspect, a display device including the above display substrate is provided.

In a sixth aspect, a method for manufacturing a display substrate is provided. The display substrate includes a display area and a non-display area located at the periphery of the display area. The display area includes a plurality of pixel opening areas and a pixel spacing area located at the periphery of the pixel opening area; the method includes: forming a first electrode with a mesh structure, at least a part of the first electrode is located in the pixel spacing area, an orthographic projection of the first electrode on a substrate of the display substrate does not overlap the orthographic projection of the pixel opening area on the substrate; forming a second electrode electrically connected to the first electrode, and the second electrode is located in the non-display area.

Optionally, the forming the first electrode specifically includes: forming the first electrode and the anode pattern in the display substrate at the same time through a same patterning process, the first electrode is insulated from the anode pattern, and the anode patterns correspond to the plurality of pixel opening areas in a one-to-one manner, the orthographic projection of the pixel opening area on the substrate is located inside the orthographic projection of a corresponding anode pattern on the substrate.

Optionally, the steps of forming the first electrode and the second electrode specifically include: forming a first conductive pattern of the second electrode in the non-display area; the first conductive pattern includes: an annular portion surrounding the display area and having an opening, and the opening of the annular portion has a first end and a second end; a first wire inlet portion electrically connected to the first end; and a second wire inlet portion electrically connected to the second end; forming a planarization layer on a side of the first conductive pattern away from the substrate of the display substrate, and patterning the planarization layer to expose at least part of the annular portion; and forming a second conductive pattern of the second electrode, the first electrode and the anode pattern in the display substrate simultaneously by a patterning process on the side of the planarization layer away from the substrate. Wherein the second conductive pattern is electrically connected to the annular portion exposed by the planarization layer, and is directly electrically connected to the first electrode; the first electrode is insulated from the anode pattern.

Optionally, the manufacturing method further includes: forming a pixel defining layer on the side of the anode pattern away from the substrate of the display substrate. The pixel defining layer includes a third via hole, a plurality of first openings and a plurality of second via holes, the first opening corresponds to the anode pattern in a one-to-one manner, the first opening exposes at least part of the corresponding anode pattern and the second via hole can expose a part of the first electrode, the third via hole can expose a part of the second conductive pattern in the second electrode; forming a sacrificial pattern on a surface of the exposed first electrode away from the substrate; forming an organic light-emitting material layer. The organic light-emitting material layer includes a fourth part and a fifth part. The fourth part at least covers the anode pattern and the pixel isolation structure in the pixel defining layer. The fifth part covers the sacrificial pattern, and the fourth part and the fifth part are independent of each other; removing the sacrificial pattern and the fifth part of the organic light-emitting material layer to expose a part of the first electrode; and forming a third electrode on the side of the organic light-emitting material layer away from the substrate, and the third electrode is respectively coupled to the exposed second conductive pattern and the part of the first electrode.

BRIEF DESCRIPTION OF THE DRAWINGS

The drawings described herein are used to provide a further understanding of the present disclosure and constitute a part of the present disclosure, and the embodiments of the present disclosure and their description thereof are used to explain the present disclosure and does not limit the present disclosure.

DETAILED DESCRIPTION

In order to further illustrate the display substrate, the method of manufacturing the same and the display device, the detail description will be given by combing the drawings.

Figure 1A:
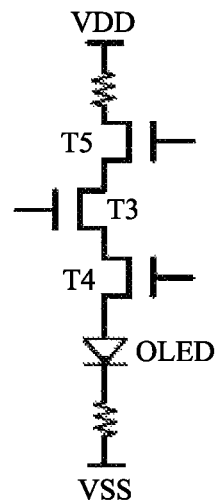
FIG. 1a is a schematic diagram of a part of pixel driving circuit provided by an embodiment of the present disclosure.

The conventional display devices generally have large power consumption, how to reduce the power consumption of the display device becomes an urgent problem. The power consumption of the display device mainly includes a chip (IC) logic power consumption and electroluminescence (EL) power consumption, EL power consumption $P=U*I$, in the case that the maximum brightness of the display device is unchanged, the total current of the display device is constant. The power consumption of EL is mainly determined by the voltage difference between a positive power signal line VDD and a negative power signal line VSS. In more detail, taking an organic light-emitting diode (OLED) display panel as an example, FIG. 1a shows a light-emitting path of the pixel circuit in the OLED display panel, from which it can be seen that the current of the OLED is related to the voltage difference between VDD and VSS.

In the display panel, in the pixel circuit without VDD compensation, VDD can be interconnected with Gate2 pattern in the display panel to reduce VDD voltage difference, where the square resistance of Gate2 pattern is about 0.5 Ω/sq. VSS is a trace located in the surrounding area of the display panel. VSS is typically formed by a first source-drain metal layer, the first source-drain metal layer can include a Ti metal film layer, an aluminum metal film layer, and a Ti metal film layer that are stacked. VSS surrounds the display area of the display panel, however, the voltage drop generated on VSS is large, which is an important factor affecting the power consumption of the display panel. Therefore, the voltage loss of the VSS can be reduced by reducing the IR-DROP generated on the VSS, thereby reducing the voltage difference between the VSS and VDD, and reducing power consumption of the display device.

Figure 1B:
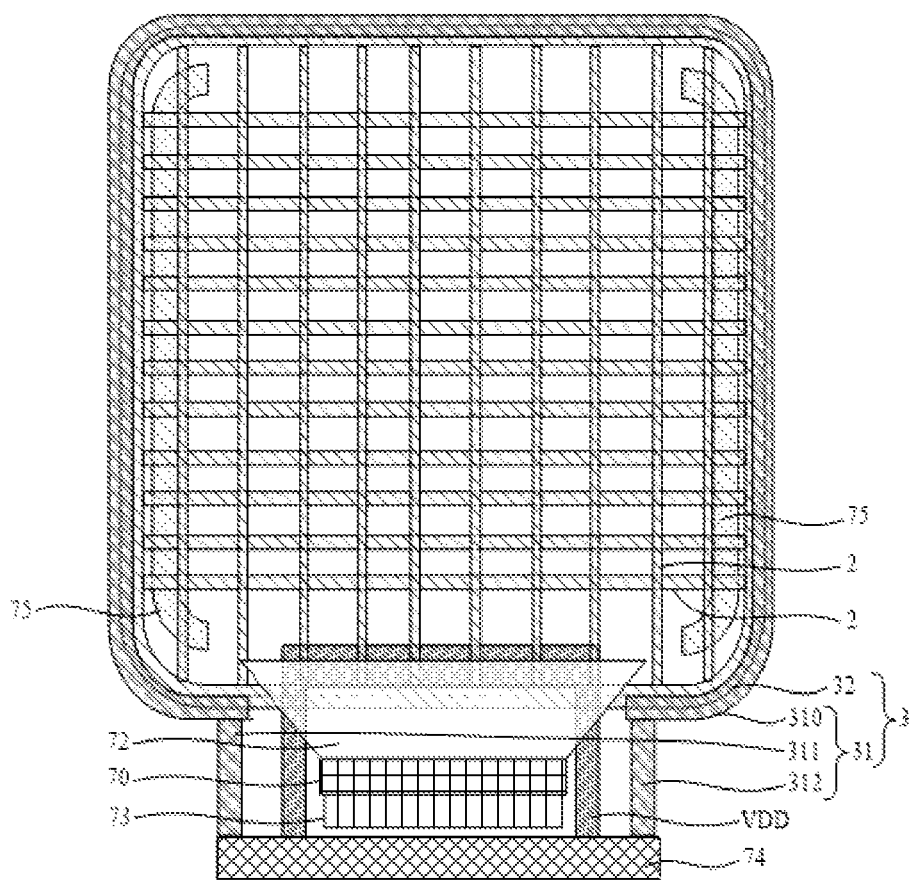
FIG. 1b is a schematic view showing a first basic structure of a display substrate provided by the embodiment of the present disclosure.
Figure 2:
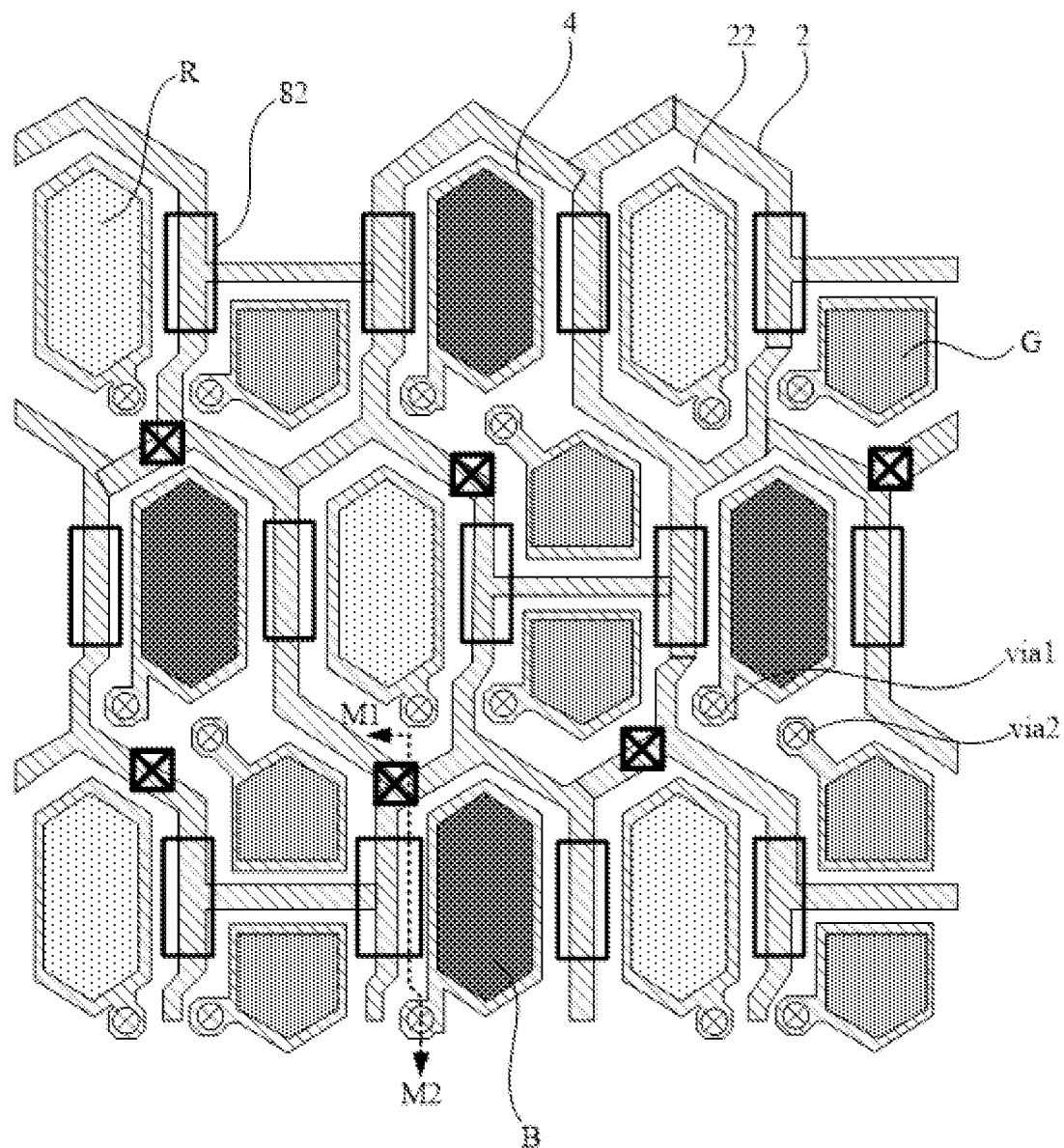
FIG. 2 is a schematic diagram of a first structure in a display area in the display substrate provided by an embodiment of the present disclosure.

Referring to FIG. 1b and FIG. 2, the present disclosure provides a display substrate including: a display area and a non-display area surrounding the display area, the display area including a plurality of pixel opening areas and a plurality of pixel spacing area arranged between the pixel opening areas; the display substrate further includes: a first electrode 2, at least a portion of the first electrode 2 being located at the pixel spacing area, an orthographic projection of the first electrode 2 on a substrate of the display substrate does not overlap an orthographic projection of the pixel opening area on the substrate; and a second electrode 3 electrically connected to the first electrode 2, the second electrode 3 being located in the non-display area.

In some embodiments, the first electrode 2 is formed as a mesh structure.

Specifically, the display substrate can include a display area and a non-display area, wherein a plurality of repeating units are provided in the display area, each repeating unit includes a plurality of sub-pixels, each sub-pixel includes a corresponding pixel opening area, a pixel spacing area is formed in the periphery area of the pixel opening area. An orthographic projection of the pixel spacing area on the substrate is closely adjacent to, but not overlaps the orthographic projection of the pixel opening area on the substrate, each pixel opening area and the pixel spacing area form an entire display area. For example, a rectangular area or a rounded rectangular area.

The non-display area surrounds the display area. Taking the display area as a rectangular area as an example, the non-display area includes four areas located above, below, left, and right of the display area. Exemplarily, a fan-out line (located in a fan-out area 72), a test circuit 70, a driving chip 73, and a flexible circuit board 74 may be provided in an area of the non-display area below the display area. The gate driving circuits 75 is arranged at left and right areas of the non-display area. Further, the display area includes gate lines and data lines crossing to each other, and both the gate lines and the data lines can be coupled to a driving chip through a corresponding fan-out line to receive a driving signal provided by the driving chip. In addition, the gate line and the data line may also be coupled to the test circuit through a corresponding fan-out line, and receive the test signal provided by the test circuit. In some examples, the gate line and the data line may be electrically connected to a driving circuit formed on the display substrate, and further connected to a driving chip or a power supply.

The specific structures of the first electrode 2 included in the display substrate are various. For example, the first electrode 2 is formed in a mesh structure, and at least part of the first electrode 2 can be located in the pixel spacing area in the display area. The orthographic projection of the first electrode 2 in the mesh structure on the substrate and the orthographic projection of each pixel opening area on the substrate do not overlap. It should be noted that although the first electrode 2 shown in FIG. 1b is represented by a line pattern crossing in the horizontal and vertical directions, the first electrode 2 in FIG. 1b is actually formed as an integral structure, that is, the first electrode 2 included in the display substrate is formed by one patterning process on the same layer of conductive material.

The second electrode 3 electrically connected to the first electrode 2 may also be provided in the non-display area. Exemplarily, the second electrode 3 may extend along the frame of the display substrate, the second electrode 3 surrounds the display area and can be electrically connected to the flexible circuit board in the display substrate, and the first electrode 2 can be electrically connected to the portions of the second electrode 3 located on the upper, lower, left, and right frames of the display substrate, respectively.

According to the specific structure of the above display substrate, in the display substrate provided by the embodiment of the present disclosure, the second electrode 3 is provided in the non-display area, the first electrode 2 in the mesh structure is provided in the pixel spacing area in the display area, and the first electrode 2 and the second electrode 3 are electrically connected to each other, so that when the first electrode 2 and the second electrode 3 are used together as the VSS in the display substrate, the resistance of the VSS can be greatly reduced. Therefore, the voltage drop of the VSS is reduced, thereby reducing the voltage difference between the VSS and the power signal line VDD in the display substrate, and reducing the power consumption of the display substrate. It is worth noting that according to the IR-Drop simulation results, the VSS voltage drop can be reduced by about 0.5V.

Moreover, since the current on the VSS can be dispersed on the first electrode 2 and the second electrode 3, the local heating phenomenon caused by the large current on the VSS is well improved. At the same time, since in the display substrate provided by the embodiment of the present disclosure, when the first electrode 2 and the second electrode 3 are used together as VSS, the width of the second electrode 3 located in the non-display area can be appropriately reduced, the width of the positive power signal line VDD included in the display substrate can be appropriately increased, so that the local heating phenomenon caused by the large current on VDD can be effectively improved.

In addition, because the first electrode 2 is arranged in the pixel spacing area, and the orthographic projection of the first electrode 2 on the substrate of the display substrate does not overlap the orthographic projection of the pixel opening area on the substrate. Therefore, the first electrode 2 will not affect the pixel aperture ratio of the display substrate.

As shown in FIG. 2, in some embodiments, the display substrate further includes: a plurality of anode patterns 4 corresponding to the plurality of pixel opening areas in a one-to-one manner, and the orthographic projection of the pixel opening areas on the substrate is within the orthographic projection of the corresponding anode pattern 4 on the substrate; the first electrode 2 and the anode pattern 4 are arranged in the same layer and made of the same material, and the first electrode 2 is insulated from the anode pattern 4.

Figure 3:
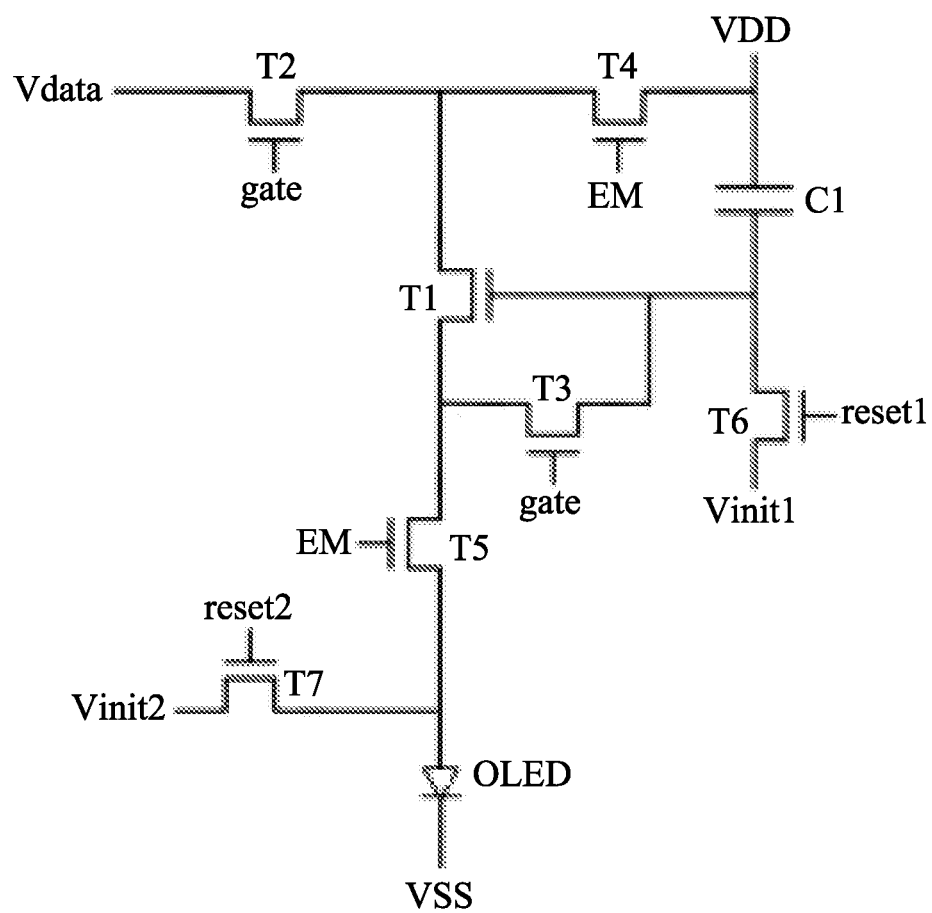
FIG. 3 is a schematic structural diagram of a pixel driving circuit provided by an embodiment of the present disclosure.

Specifically, the display substrate includes a driving circuit layer, the driving circuit layer includes a plurality of pixel driving circuits, and the specific structure of the pixel driving circuit can be set according to actual needs. Exemplarily, the pixel driving circuit adopts a 7T1C circuit, which includes seven transistors and one capacitor. As shown in FIG. 3, the 7T1C pixel circuit includes: a first transistor T1, a second transistor T2, a third transistor T3, a fourth transistor T4, a fifth transistor T5, a sixth transistor T6, a seventh transistor T7 and a first capacitor C1.

The gate electrode of the sixth transistor T6 is electrically connected to the first reset signal line reset1, the first electrode of the sixth transistor T6 is electrically connected to the first initialization signal line Vinit1, and the second electrode of the sixth transistor T6 is electrically connected to the gate electrode of the first transistor T1.

The gate electrode of the third transistor T3 is electrically connected to the gate line gate, the first electrode of the third transistor T3 is electrically connected to the second electrode of the first transistor T1, and the second electrode of the third transistor T3 is electrically connected to the gate electrode of the first transistor T1.

The first electrode of the first transistor T1 is electrically connected to the second electrode of the second transistor T2, the gate electrode of the second transistor T2 is electrically connected to the gate line gate, and the first electrode of the second transistor T2 is electrically connected to the data line Vdata.

The gate electrode of the fourth transistor T4 is electrically connected to the light emission control signal line EM, the first electrode of the fourth transistor T4 is electrically connected to the positive power signal line VDD, and the second electrode of the fourth transistor T4 is electrically connected to the first electrode of the first transistor T1.

The gate electrode of the fifth transistor T5 is electrically connected to the light emission control signal line EM, the first electrode of the fifth transistor T5 is electrically connected to the second electrode of the first transistor T1, and the second electrode of the fifth transistor T5 is electrically connected to the anode pattern 4 of the OLED in the corresponding sub-pixel.

The gate electrode of the seventh transistor T7 is electrically connected to the second reset signal line reset2, the first electrode of the seventh transistor T7 is electrically connected to the second initialization signal line Vinit2, and the second electrode of the seventh transistor T7 is electrically connected to the anode pattern 4 of the OLED in the corresponding sub-pixel. It should be noted that the timing of the second reset signal transmitted on the second reset signal line reset2 may be the same as or different from the timing of the scan signal transmitted on the gate line gate.

In more detail, the display substrate includes a plurality of repeating units, each repeating unit includes a plurality of sub-pixels, and the OLED in each sub-pixel includes anode patterns 4, an organic light emitting material layer and a cathode that are stacked along the direction away from the substrate. The anode pattern 4 is located on the side of the corresponding pixel driving circuit away from the substrate, and is electrically connected to the corresponding pixel driving circuit, and can receive the driving signal provided by the corresponding pixel driving circuit. The organic light-emitting material layer emits light under the action of the corresponding anode pattern 4 and the cathode.

It is worth noting that the display substrate may also include some spare sub-pixels (dummy sub-pixels) arranged at the periphery of the display area. These dummy sub-pixels may include structures such as light-emitting layers and pixel openings according to actual needs, or may not include anode patterns and pixel openings, or dummy sub-pixels can be set to have exactly the same structure as the sub-pixels included in the display area, but the dummy sub-pixels are not used for display. It can be seen that, in some cases, the anode patterns of these dummy sub-pixels may not correspond to the pixel openings in a one-to-one manner.

The specific layout modes of the anode pattern 4 are various. For example, the orthographic projection of the pixel opening area on the substrate can be set to be located inside the orthographic projection of the corresponding anode pattern 4 on the substrate. In this case, it may specifically include: the orthographic projection of the anode pattern 4 on the substrate of the display substrate surrounding the orthographic projection of the pixel opening area of the corresponding sub-pixel on the substrate.

In the actual layout of the anode pattern 4, in order to ensure the normal display function, the anode patterns 4 corresponding to each sub-pixel are independent of each other, and a gap is formed between adjacent anode patterns 4. Therefore, the first electrode 2 and the anode pattern 4 may arranged at the same layer and made of the same material, and the first electrode 2 is arranged in the gap by setting a suitable electrode shape and width, so that the first electrode 2 is formed into a mesh structure as a whole, the orthographic projection of the first electrode 2 on the substrate and the orthographic projection of the anode pattern 4 on the substrate do not overlap, so as to ensure that the first electrode 2 is insulated from the anode pattern 4.

Therefore, in the display substrate provided by the foregoing embodiment, the first electrode 2 and the anode pattern 4 are arranged in the same layer and made of the same material, so that the first electrode 2 and the anode pattern 4 can be formed in the same patterning process at the same time, which greatly simplifies the manufacturing process of the display substrate and saves the manufacturing cost. In addition, the first electrode 2 and the anode pattern 4 are arranged in the same layer, so that the positive power signal line (VDD) in the display substrate has a larger layout space, a larger area of positive power signal line can be laid out to reduce the voltage drop generated on the positive power signal line.

It is also worth noting that when the anode pattern 4 and the first electrode 2 are arranged in the same layer and made of the same material, it can be set that both the anode pattern 4 and the first electrode 2 are made of a laminated structure of indium tin oxide (ITO), silver (Ag), and ITO.

In some embodiments, the second electrode 3 and the first electrode 2 may be arranged in the same layer and made of the same material.

Specifically, when the first electrode 2 and the second electrode 3 are laid out, the first electrode 2 and the second electrode 3 can be arranged in the same layer and made of the same material, so that the first electrode 2 and the second electrode 3 can be formed at the same patterning process at the same time, and during manufacturing, the first electrode 2 and the second electrode 3 can be directly electrically connected to each other, an additional via process is not necessary, and the process reliability is high.

Further, the first electrode 2, the second electrode 3 and the anode pattern 4 can be arranged in the same layer and made of the same material, so that the first electrode 2, the second electrode 3 and the anode patterns 4 can all be formed in the same patterning process, which simplifies the manufacturing process of the display substrate and saves the manufacturing cost of the display substrate.

In other embodiments, as shown in FIG. 1b, the second electrode 3 may include a first conductive pattern 31 and a second conductive pattern 32 that are stacked, and the first conductive pattern 31 is located between the substrate of the display substrate and the second conductive pattern 32; the first conductive pattern 31 includes: an annular portion 310, a first wire inlet portion 311 and a second wire inlet portion 312; the annular portion 310 surrounds the display area, and has an opening, and the opening of the annular portion 310 has a first end and a second end; the first wire inlet portion 311 is electrically connected to the first end; the second wire inlet portion 312 is electrically connected to the second end; the second conductive pattern 32 is in an annular shape, the orthographic projection of the second conductive pattern 32 on the substrate of the display substrate and the orthographic projection of the annular portion 310 on the substrate have a first overlapping area. The second conductive pattern 32 is electrically connected to the annular portion in the first overlapping area; the second conductive pattern 32 is arranged in the same layer and made of the same material as the first electrode 2, and is directly electrically connected to the first electrode 2.

Specifically, the first conductive pattern 31 may be made of a source-drain metal layer, that is, arranged in the same layer and made of the same material as the first electrode and the second electrode of each transistor in the pixel driving circuit. For example, for a single SD process, the first conductive pattern 31 can be arranged in the same layer and made of the same material as the source-drain metal layers. For the dual SD process, the first conductive pattern 31 can be arranged in the same layer and made of the same material as the first source-drain metal layer or the second source-drain metal layer. The second conductive pattern 32 can be arranged in the same layer and made of the same material as the first electrode 2. Further, the second conductive pattern 32 can be arranged in the same layer and made of the same material as the first electrode 2 and the anode pattern 4.

Figure 6:
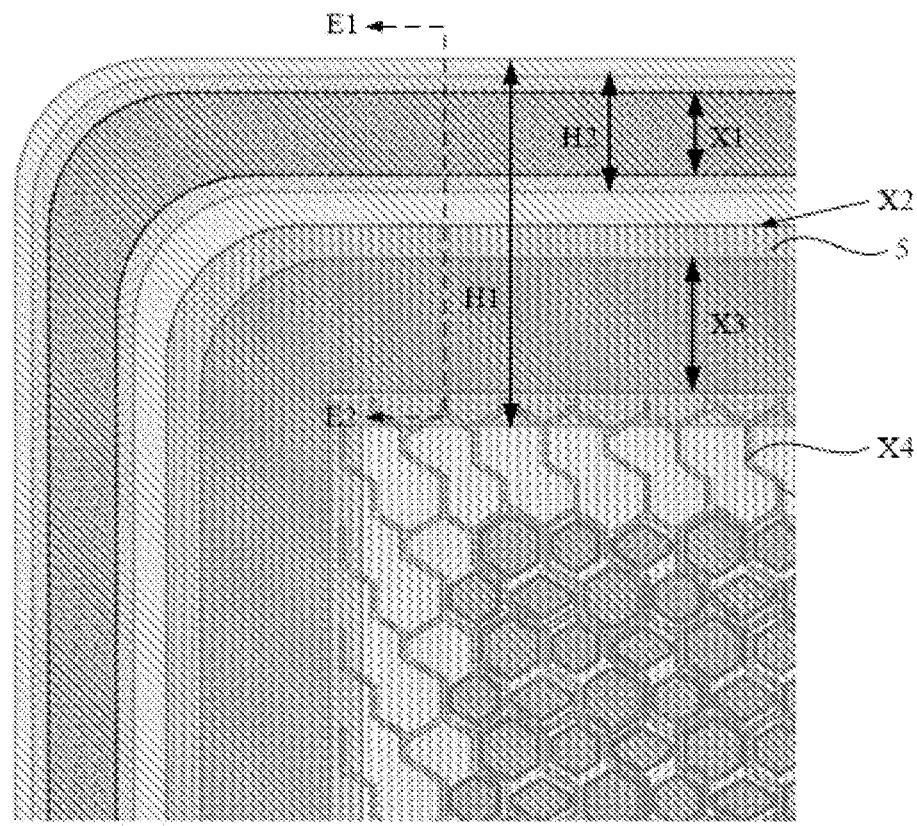
FIG. 6 is a schematic structural diagram of a corner area in the display substrate provided by an embodiment of the present disclosure.
Figure 7:
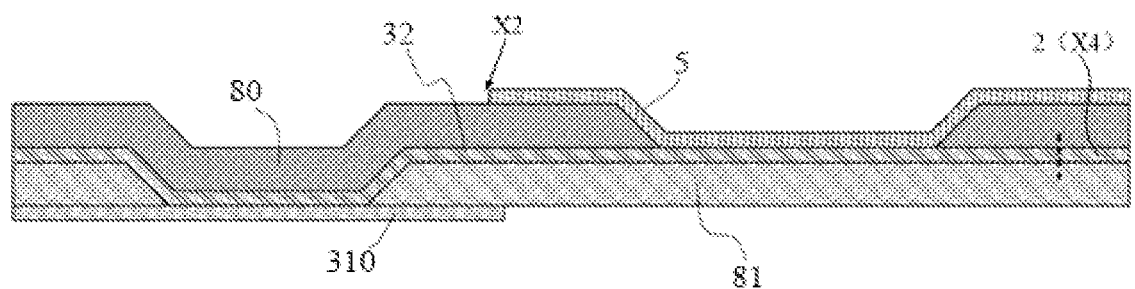
FIG. 7 is a cross-sectional view along the direction of E1E2 of FIG. 6.

With further reference to FIGS. 1b, 6 and 7, the specific shapes of the first conductive pattern 31 are various. Exemplarily, the first conductive pattern 31 includes the annular portion 310 (as shown in FIG. 6, having width of H2), the first wire inlet portion 311 and the second wire inlet portion 312, the annular portion 310 surrounds the display area, and the opening of the annular portion 310 faces the binding position of the driving chip in the display substrate. In some embodiments, the display area is approximately a rectangular area, and the opening of the annular portion 310 and the binding position of the driving chip in the display substrate are located on the same side of the display area, for example, a short side of the rectangular area. The first wire inlet portion 311 and the second wire inlet portion 312 may be electrically connected to the flexible circuit board for receiving signals provided by the flexible circuit board.

It is worth noting that the annular portion 310, the first wire inlet portion 311 and the second wire inlet portion 312 may be formed as an integral structure, but are not limited to this.

Continuing to refer to FIG. 1b, FIG. 6 and FIG. 7, the specific shapes of the second conductive pattern 32 are various. Illustratively, the second conductive pattern 32 has an annular shape (as shown in FIG. 6 with a width of H1). The second conductive pattern 32 may include two sub-patterns arranged oppositely, one of the sub-patterns is located on the left side of the display area, and the other sub-pattern is located on the right side of the display area. Alternatively, the second conductive pattern 32 may be U-shaped, that is, the second conductive pattern 32 includes parts located on the left, right, and lower sides of the display area.

It should be noted that the width H1 and the width H2 in FIG. 6 only exemplarily show the width of the annular portion 310 and the width of the second conductive pattern 32 on the display panel. In other embodiments, the annular portion 310 and the second conductive pattern 32 can be set to have the same width or different widths at different positions of the display panel, and the width refers to a width perpendicular to its extending direction. Exemplarily, a part of the annular portion 310 on the left side of the display panel and another part of the annular portion 310 on the right side of the display panel can be set to have the same width, and a part of the annular portion 310 on the upper side of the display panel and another part of the annular portion 310 on the lower side of the display panel can also be set to have the same width; the two conductive patterns 32 can also be arranged in the same way, which will not be repeated here.

Taking the shape of the second conductive pattern 32 being an annular shape as an example, the orthographic projection of the second conductive pattern 32 on the substrate and the orthographic projection of the annular portion 310 on the substrate have the first overlapping area. Exemplarily, the orthographic projection of the first overlapping area on the substrate is an annular shape with an opening, and the first overlapping area can be surrounded by an orthographic projection of a part of the annular portion 310 that does not overlap the second conductive pattern 32 on the substrate. When the first overlapping area is set to the above structure, the second conductive pattern 32 also includes a part that does not overlap the annular portion 310. A part of the orthographic projection of the part that does not overlap the annular portion 310 on the substrate is surrounded by the orthographic projection of the first overlapping area on the substrate, and another part of the orthographic projection of the part that does not overlap the annular portion 310 on the substrate is located at the opening of the orthographic projection of the first overlapping area on the substrate.

In the first overlapping area, the specific electrical connections between the second conductive pattern 32 and the annular portion 310 are various. Exemplarily, by forming a first via hole on the first overlapping area, the second conductive pattern 32 is electrically connected to the annular portion 310 through the first via hole. There are various specific structures of the first via hole. For example, the orthographic projection of the first via hole on the substrate may be in an annular shape with an opening, and the opening of the annular shape overlaps the opening of the annular portion 310. The extension direction of the other parts of the annular shape is substantially the same as the extension direction of the annular portion 310. FIG. 6 shows a part of the first via hole in an annular shape located at the upper left corner of the display panel, and X1 represents the width of the part perpendicular to its own extension direction. It should be noted that the width of the first via hole in the annular shape in the direction perpendicular to its own extension can be set according to actual needs, and the width can be the same or different in different parts of the first via hole in an annular shape.

Alternatively, the first via hole may also be configured to include a plurality of sub-via holes independent of each other, and the specific distribution modes of the plurality of sub-via holes are various. Exemplarily, the plurality of sub-via holes are evenly distributed in the first overlapping area; or the plurality of sub-via holes are sequentially spaced apart along the extension direction of the first overlapping area; or the plurality of sub-via holes is divided into a plurality of groups of sub-via holes, and the plurality of groups of sub-via holes are correspondingly distributed at different positions of the first overlapping area.

It is worth noting that the size of the plurality of sub-via holes can be set according to actual needs, as long as the orthographic projections of the plurality of sub-via holes on the substrate are located in the first overlapping area.

It should be noted that, as shown in FIGS. 6 and 7, the annular portion 310 and the second conductive pattern 32 are arranged in different layers, and an insulating layer is arranged between the annular portion 310 and the second conductive pattern 32. Exemplarily, the insulating layer includes a planarization layer 81, and the first via hole X1 is formed on the planarization layer 81 and penetrates the planarization layer 81.

It is worth noting that, in addition to the above-mentioned solution in which the second conductive pattern 32 is electrically connected to the annular portion 310 through the first via hole, the following solution is also included: in the insulating layer located between the first conductive pattern 31 and the second conductive pattern 32, a part whose the orthographic projection on the substrate can overlap the first overlapping area is removed, and the second conductive pattern in the groove is located on a surface of the annular portion 310 of the first conductive pattern 31 away from the substrate and is completely attached to the surface of the annular portion 310.

The connection modes of the first electrode 2 and the second conductive pattern 32 are various. Exemplarily, the first electrode 2 and the annular-shaped second conductive pattern 32 are connected in multiple directions, as shown in FIG. 1b, FIG. 6 and FIG. 7, and the first electrode 2 includes X4 part in the non-display area shown in FIGS. 6 and 7, the X4 part can be connected to the annular-shaped second conductive pattern 32 in four directions: up, down, left, and right. It is worth noting that the direction from left to right in FIG. 7 is a direction from the non-display area to the display area.

It should be noted that the direct electrical connection between the first electrode 2 and the second conductive pattern 32 includes: the first electrode 2 and the second conductive pattern 32 are an integral structure; or the first electrode 2 is extended from the display area to the non-display area, and continue to extend away from the display area to form a annular-shaped second conductive pattern 32; or a annular-shaped second conductive pattern 32 is formed by end points of the mesh structure connecting the first electrode 2 away from inside the display area.

In the display device provided by the above embodiment, the second electrode 3 includes the first conductive pattern 31 and the second conductive pattern 32, and the second conductive pattern 32 and the first electrode 2 are arranged in the same layer and made of the same material, the following technical effects can be achieved.

The second conductive pattern 32 can be formed in the same patterning process as the first electrode 2, and the first electrode 2 is directly electrically connected to the second conductive pattern 32 at the junction of the first electrode 2 and the second conductive pattern 32, and no additional via hole design is required, that is, no crossover-to-transfer layer is required.

Figure 8:
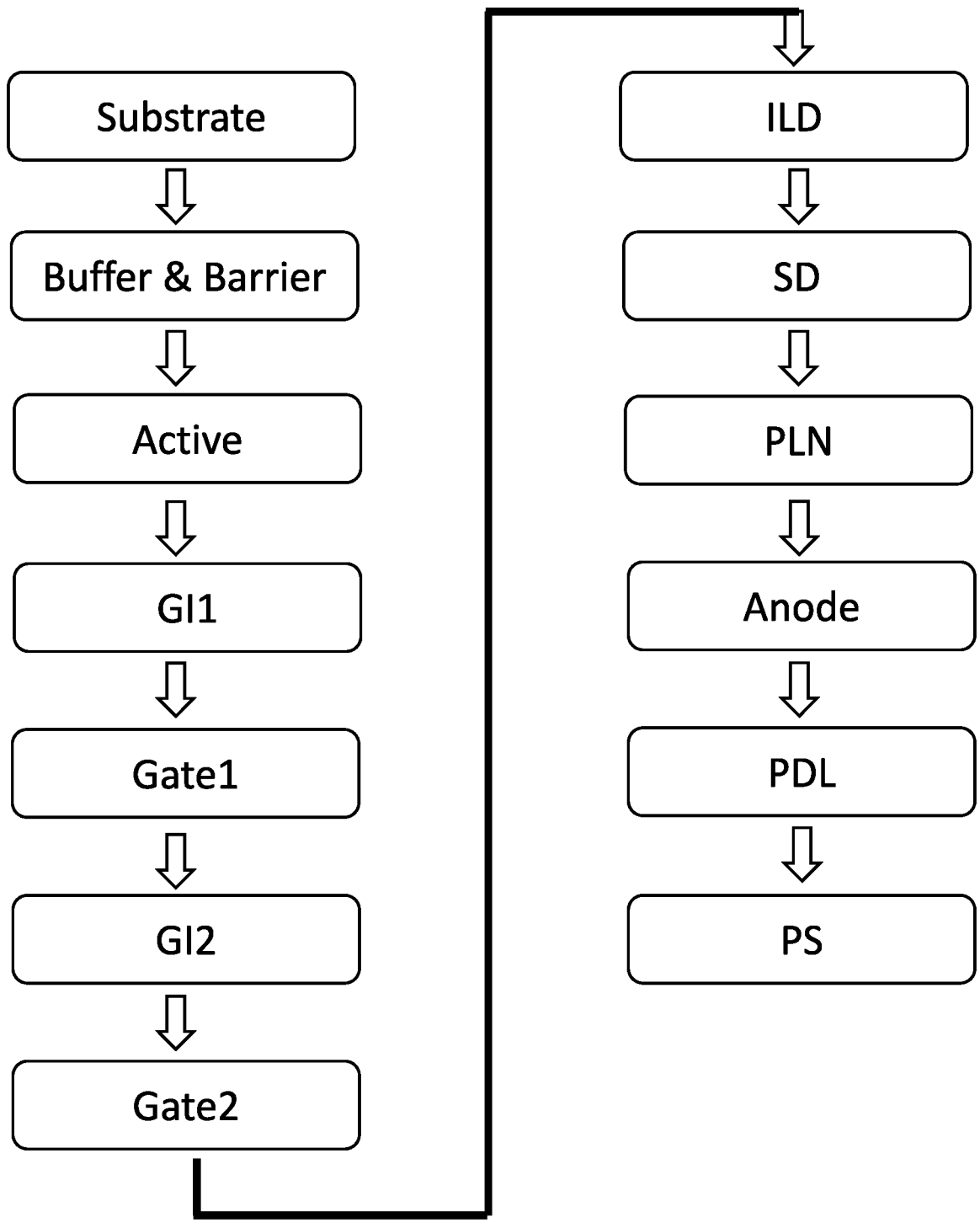
FIG. 8 is a schematic flowchart of 4 metal processes.

It is compatible with the conventional 4-layer metal process (that is, the single-layer source-drain metal layer process) without adding additional conductive film layers and patterning processes. It should be noted that, as shown in FIG. 8, the manufacturing process of the display substrate may include: in a direction away from the substrate, on the substrate (which may include a first polyimide layer, a first barrier layer, and a second polyimide layer, and a second barrier layer that are stacked in sequencer) a buffer layer Buffer, a barrier layer Barrier, an active layer Active, a first insulating layer GI1, a first gate metal layer Gate1, a second insulating layer GI2, a second gate metal layer Gate2, a third insulating layer ILD, a source-drain metal layer SD, a planarization layer 81 (PLN), an anode layer Anode, a pixel defining layer 80 (PDL) and a spacer 82 (PS) layer are sequentially formed, among which the first gate metal layer Gate1, the second gate metal layer Gate2, the source-drain metal layer SD and the anode layer Anode are all conductive layers made of at least one of metal, alloy or metal oxide, namely 4-step patterning process.

Figure 1C:
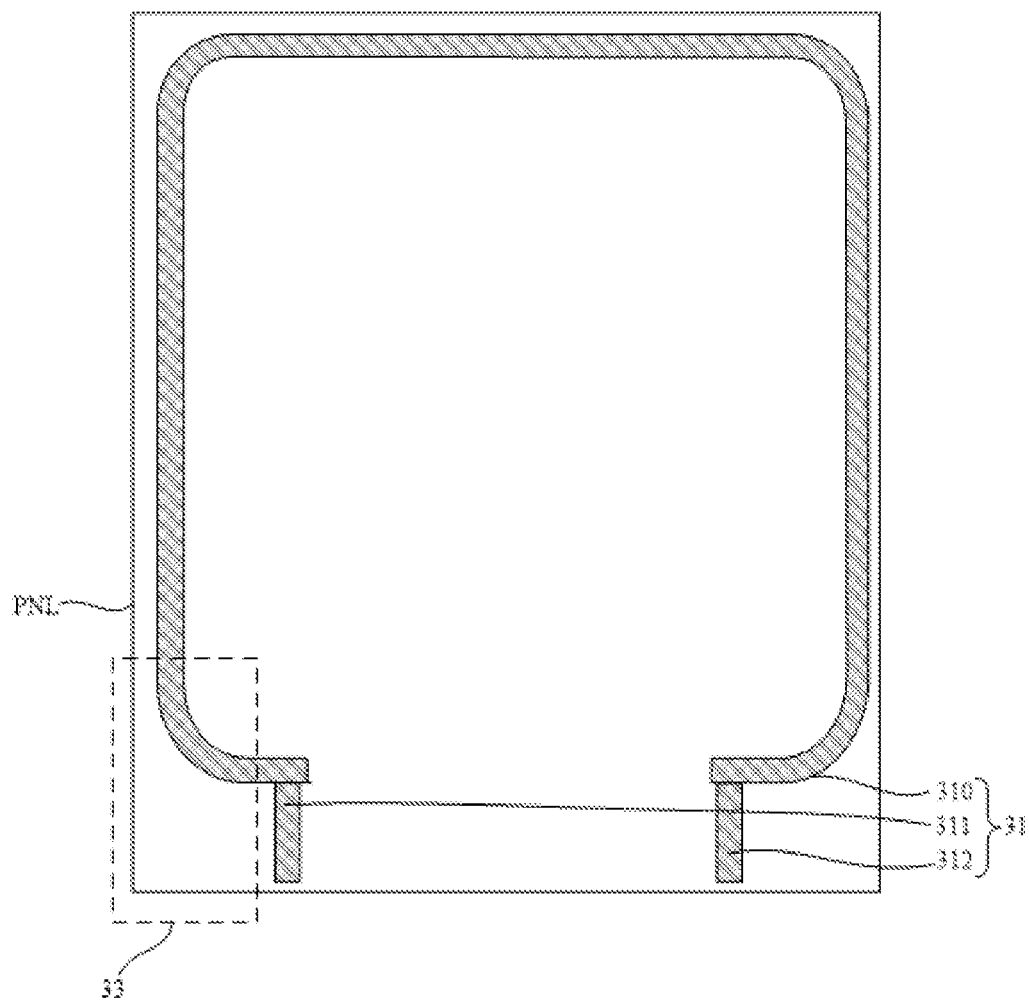
FIG. 1c is a schematic structural diagram of a first conductive pattern provided by an embodiment of the present disclosure.

As shown in FIGS. 1b and 1c, the first electrode 2 is electrically connected to the annular-shaped second conductive pattern 32 from a plurality of directions, so that the current on the second electrode 3 no longer solely flows from the fixed position of the display substrate PNL, such as the corner 33 of the display substrate, into the chip of the display substrate, but is dispersed into the mesh-shaped first electrode 2, the annular-shaped second conductive pattern 32 and the first conductive pattern 31. Therefore, the problem of local heating generated at the corner 33 of the display substrate is well improved. In addition, when the first electrode 2 and the second electrode 3 are applied to VSS signal transmission, the current on the VSS trace in the peripheral area is reduced, and the heating problem due to the excessive current on the VSS trace near the chip is improved.

As shown in FIG. 6, in some embodiments, the first electrode 2 further includes a portion (X4 in FIG. 6) located in the non-display area, which is electrically connected to the second electrode 3, that is, the first electrode 2 is electrically connected to the second electrode 3 through this portion.

Specifically, the first electrode 2 has a mesh structure, the display area portion of the mesh structure is located in the pixel spacing area of the display area, and the non-display area portion of the mesh structure is located in the non-display area. The non-display area portion may be extended from the display area portion located in the pixel spacing area, that is, the non-display area portion and the display area portion located in the pixel spacing area form an integral structure.

Specifically, the wiring pattern of the non-display area portion may be consistent with the wiring pattern of the display area portion, for example, the wiring pattern of the non-display area portion located in the middle area of each side of the display area has a roughly same size as the wiring pattern of the display area portion connected thereto. Optionally, the wiring pattern of the non-display area portion may be different from the wiring pattern of the display area portion, for example, it is located at each corner of the display area, and each wiring pattern may be reasonably distributed according to the distance between the wiring lines and the size of the space, for example, distributed as evenly as possible, the zigzag pattern and the direction of the wiring lines are roughly the same, and the space between the wiring lines is roughly the same.

Optionally, a part of the non-display area portion connected to the second electrode 3 and the non-display area portion extending from the same side of the display area have the same connection pattern and connection mode to the second electrode 3, for example, connecting to the parts of the second electrode 3 close to the display area. Specifically, a part of the non-display area portion connected to the second electrode 3 and the non-display area portion extending from the same side of the display area have perpendicular or parallel parts connected to the second electrode 3.

The above arrangement of the first electrode 2 also includes a part located in the non-display area, and is electrically connected to the second electrode 3 through the part, so that the first electrode 2 can be connected to the second electrode 3 through a plurality of branches, which is more conducive to the dispersion of current on the second electrode 3 and more effectively improves the heat dissipation problem of the second electrode 3.

As shown in FIGS. 6 and 7, in some embodiments, the display substrate further includes: a third electrode 5 electrically connected to the first electrode 2. The third electrode 5 includes a first part, a second part, and a third part. The orthographic projection of a plurality of pixel opening areas on the substrate is located within the orthographic projection of the first part on the substrate, the second part is located in the pixel spacing area, and the third part is located in the non-display area.

Specifically, the display substrate may further include a third electrode 5. For example, the third electrode 5 is a cathode in the display substrate, and the cathode is located on the side of the first electrode 2 away from the substrate.

It is worth noting that the first part, the second part, and the third part may be formed as an integral structure, that is, formed as an entire layer; or may be electrically connected to each other through a conductive connection part, the area of the third electrode 5 is larger than the area of the display area. X2 in FIG. 6 represents the boundary of the third electrode 5.

In some embodiments, the connection position between the non-display area portion of the mesh structure and the third electrode 5 is approximately evenly distributed along the boundary of the display area (except the side where the IC is bound) to ensure that the contact resistance of each position is approximately equal and to ensure the uniformity of the signal. Specifically, the connection positions of the non-display area portion and the third electrode 5 are approximately evenly distributed along two opposite sides of the display area that are adjacent to one side where the IC is bound.

It should be noted that when the display substrate includes dummy sub-pixels, the dummy sub-pixels may not be covered by the third electrode 5, but it is not limited to this.

As shown in FIG. 3, taking a top-emission display substrate including a 7T1C pixel driving circuit as an example, a light-emitting side electrode of the display substrate is a cathode, which is generally a Mg/Ag alloy. On the one hand, in order to ensure the transmittance of the cathode, the Mg/Ag alloy is made very thin; on the other hand, the negative power signal line (VSS) electrically connected to the cathode in the related art is only a trace located at the edge of the display substrate. Therefore, the resistance of the cathode is relatively large (when the cathode is made of Mg/Ag alloy, the square resistance of the cathode is between 10 Ω/sq~15 Ω/sq). The IR Drop problem caused by the cathode leads to uneven display of the display substrate and the power consumption of the display substrate becomes larger.

Figure 9:
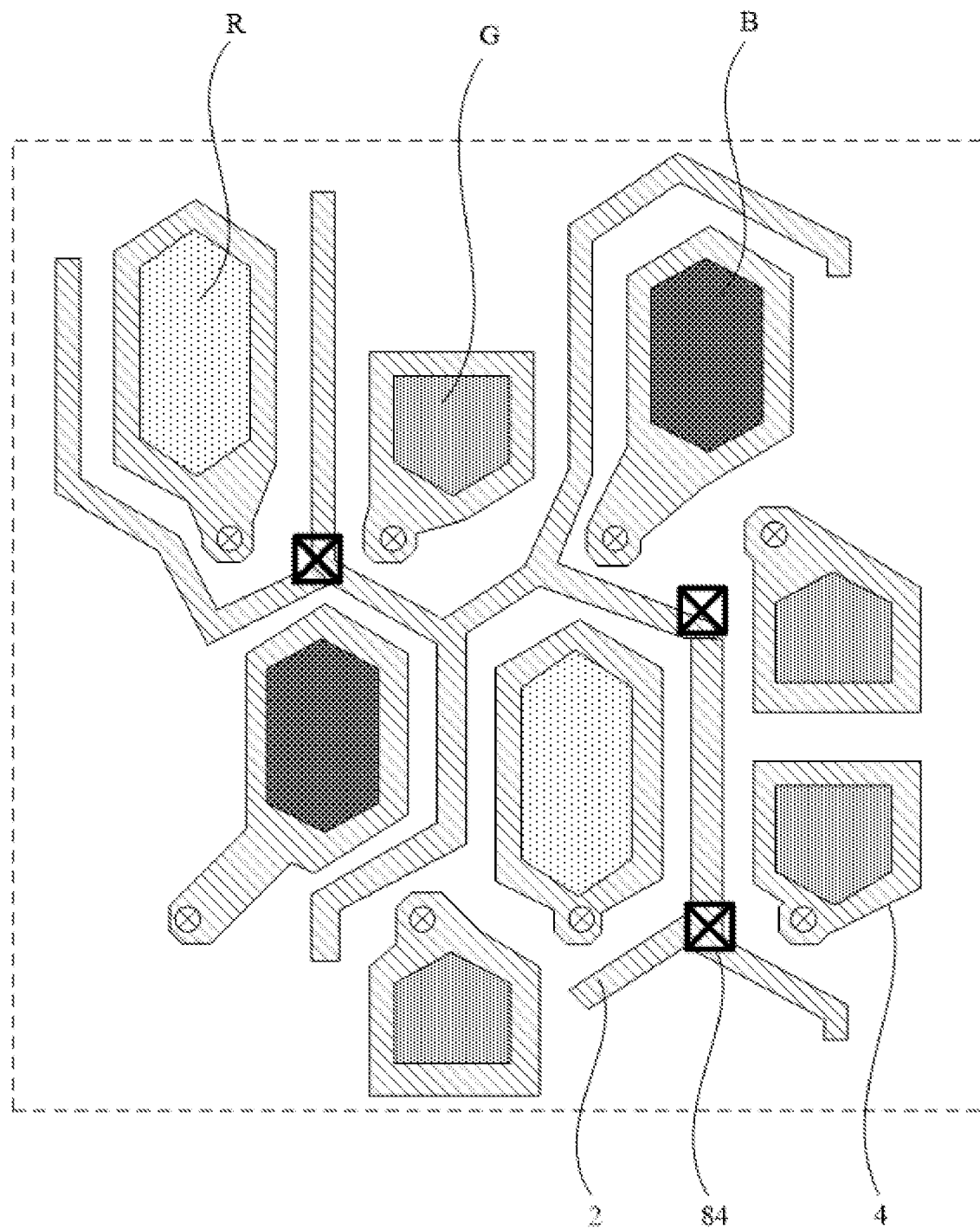
FIG. 9 is a schematic diagram showing a third structure in the display area in the display substrate provided by an embodiment of the present disclosure.

As shown in FIGS. 6, 7 and 9, based on the above-mentioned problems, in some embodiments, the orthographic projection of the second part of the third electrode 5 on the substrate and the orthographic projection of the first electrode 2 on the substrate have a second overlapping area, and the second part of the third electrode 5 is electrically connected to the first electrode 2 through a second via hole 84 provided in the second overlapping area.

The orthographic projection of the third part of the third electrode 5 on the substrate and the orthographic projection of the second conductive pattern 32 of the second electrode 3 on the substrate have a third overlapping area. The third part of the third electrode 5 is electrically connected to the second conductive pattern 32 through a third via hole (via X3 in FIG. 6) provided in the third overlapping area.

Specifically, the second via hole 84 penetrates the pixel defining layer 80 located in the pixel spacing area, or the pixel defining layer 80 and the organic light-emitting material layer 83, and the third via hole penetrates the pixel defining layer located in the non-display area. 80. The specific positions, number and size of the second via holes 84 and the third via holes can be set according to actual needs, for example, according to the structure of the pixel defining layer, the spatial layout of the first electrode, contact resistance, and aperture ratio and other factors.

Exemplarily, the orthographic projection of the third via hole on the substrate may be an annular shape; or the third via hole includes a plurality of independent sub-via holes, and these independent sub-via holes are distributed at intervals in the third overlapping area.

The lift-off process can be used to fabricate the second via hole 84, and the specific process steps are as follows.

As shown in FIGS. 11a to 11e, after the driving circuit layer 85 is formed on the substrate, the anode pattern 4 and the first electrode 2 are formed on the side of the driving circuit layer away from the substrate, and then the pixel defining layer 80 and the spacer 82 are formed.

It should be noted that the driving circuit layer 85 refers to a structure shown in FIG. 3, and it may include an active layer, a gate insulating layer, a gate metal layer, an interlayer insulating layer, a source-drain metal layer, and other structures.

The pixel defining layer 80 is generally a mesh structure, in which a plurality of first openings 86 and a pixel isolation structure (located in the pixel spacing area) surrounding the plurality of first openings 86 are formed, and a plurality of second via holes 84 and a plurality of third via holes (via X3 in FIG. 6) are formed in the pixel isolation structure. Inside the display area, the first opening 86 corresponds to the anode pattern 4 in the one-to-one manner, the pixel isolation structure covers the edge of the anode pattern 4, and the first opening 86 can expose at least a part of the corresponding anode pattern 4. The first electrode 2 can be arranged in the same layer and made of the same material as the anode pattern 4. The first electrode 2 is located on the side of the pixel isolation structure close to the substrate. For example, the pixel isolation structure covers the first electrode 2 and the second via hole 84 in the pixel isolation structure can expose a part of the first electrode 2. Similarly, the second conductive pattern 32 can be arranged in the same layer and the same material as the anode pattern 4. For example, the second conductive pattern 32 is located on the side of the pixel isolation structure close to the substrate, and the third via hole can expose a part of the second conductive pattern 32 in the second electrode 3.

It is also worth noting that the spacer 82 and the pixel defining layer 80 can be formed at the same time in a patterning process, for example, a half tone mask process.

A sacrificial material layer is deposited on the substrate on which the spacer 82 is formed, a photoresist is formed on the surface of the sacrificial material layer away from the substrate, and the sacrificial pattern 9 in the second via hole 84 is formed through processes such as exposure, development, and etching. In more detail, the process flow of forming the sacrificial layer 9 is as follows: an organic material is used to form a sacrificial material layer, a negative photoresist layer is formed on the side of the sacrificial material layer away from the substrate, and the negative photoresist layer is exposed by using a mask to form a negative photoresist reserve area and a negative photoresist remove area. The negative photoresist reserve area corresponds to the area where the sacrificial pattern 9 is located, and the negative photoresist remove area corresponds to areas other than the area where the sacrificial pattern 9 is located. The negative photoresist in the negative photoresist remove area is removed, and the reserved negative photoresist layer is used as a mask to wet-etch the sacrificial material layer to form the sacrificial pattern 9 with an inverted trapezoidal cross-section.

It should be noted that the film layer (the first electrode 2) immediately below the sacrificial pattern 9 should be as flat as possible, which is more conducive to the peeling off process.

Figure 11A:
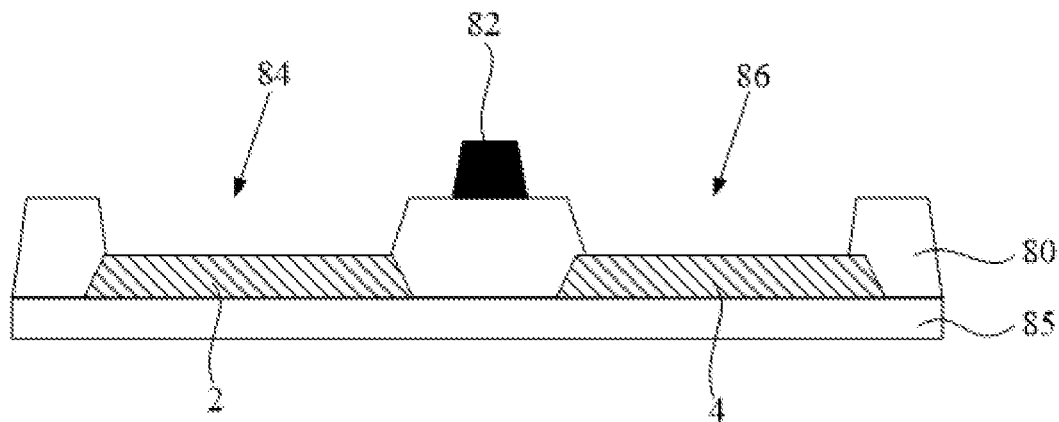
FIGS. 11a to 11e are first flow charts of the LIFT-OFF process at the M1M2 cross section in FIG. 2.
Figure 11B:
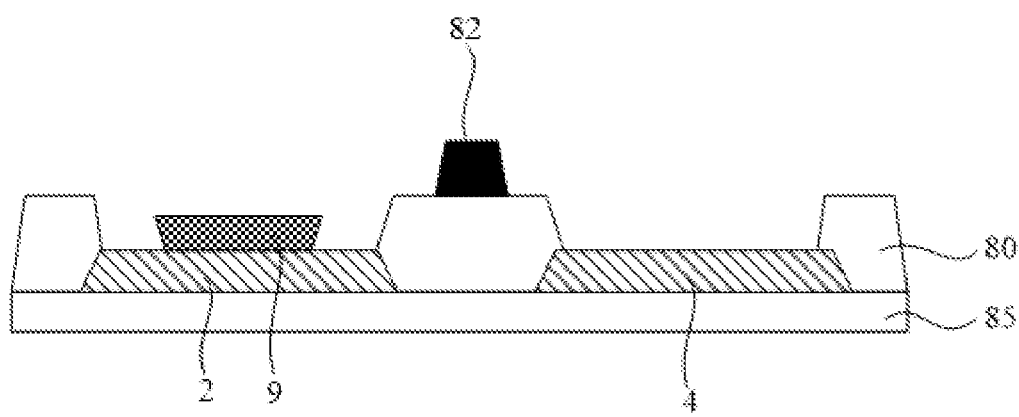

In addition, the specific formation position of the sacrificial pattern 9 is related to the contact position between the first electrode 1 and the third electrode 5, that is, the specific formation position of the sacrificial pattern 9 is related to the position where the second via hole 84 is formed. When the second via hole 84 is located in the pixel spacing area, the sacrificial pattern 9 is located in the pixel spacing area, and when the second via hole 84 is located in the non-display area, the sacrifice pattern 9 is located in the non-display area. In some embodiments, as shown in FIGS. 11a to 11c, the sacrificial pattern 9 is formed in the second via hole 84.

The evaporation continues to form an organic light-emitting material layer 83. The organic light-emitting material layer 83 may cover the part of the anode pattern 4 exposed by the first opening 86, or cover the second via hole 84 and the spacer 82. The organic light-emitting material layer 83 also includes a fourth part and a fifth part, the fourth part covers the pixel isolation structure and a part of the first electrode 2 exposed by the second via hole 84, and the fifth part covers the sacrificial pattern 9 in the second via hole 84, the fourth part and the fifth part are disconnected at the edge of the sacrificial pattern 9 in the second via hole 84, so that the fourth part and the fifth part are independent of each other.

Figure 5:
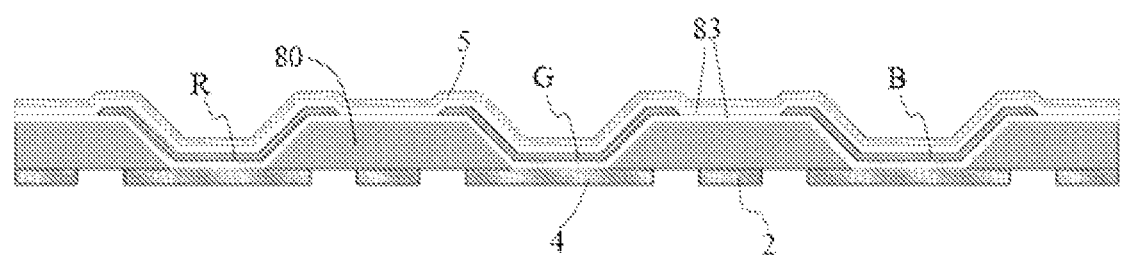
FIG. 5 is a schematic cross-sectional view along the direction of D1D2 in FIG. 4.
Figure 11C:
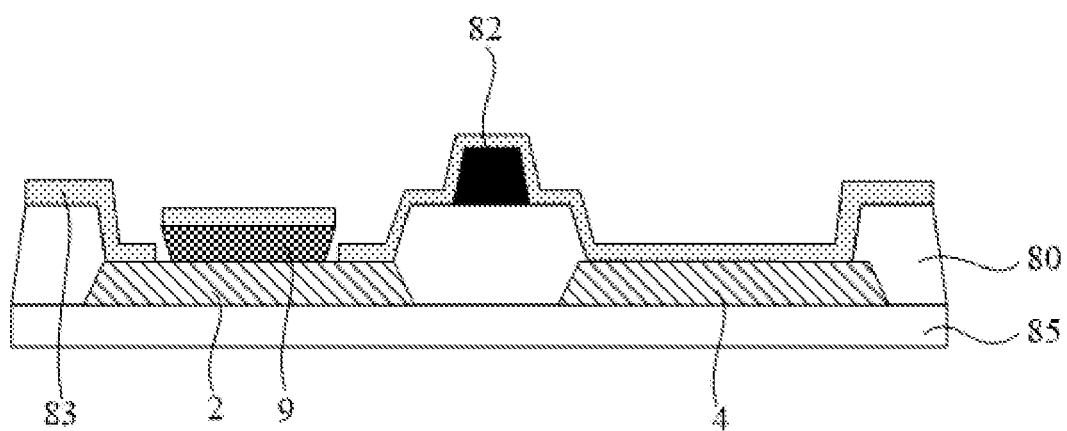

It is worth noting that the organic light-emitting material layer 83 of the above structure can emit white light, and in this case, as shown in FIG. 11c and FIG. 5, a color resistance pattern (such as a red color resistance pattern R, a green color resistance pattern G, a blue color resistance pattern B, etc.) is formed in the position corresponding the first opening. Moreover, when the white organic light emitting material layer 83 is formed, the white organic light emitting material layer 83 may be formed on both the upper and lower layers of the color resistance pattern. In addition, it is also possible to form a colored organic light-emitting material layer only in the first opening 86, for example, a red organic light-emitting material layer is formed in some of the first openings, a green organic light-emitting material layer is formed in some first openings, and a blue organic light-emitting material layer is formed in other first openings.

Then, the substrate on which the organic light-emitting material layer 83 is formed is immersed in a peeling solution, and then taken out after standing for 0.5 min-2 min, and then the substrate is appropriately tilted to facilitate the sacrificial pattern 9 to fall off. At the same time as the sacrificial pattern layer falls off, the photoresist on the sacrificial surface and the fifth part of the organic light-emitting material layer 83 are simultaneously taken away. It should be noted that the peeling solution can be a fluoroether solvent that can dissolve the material of the sacrificial layer and does not damage the organic light-emitting material layer 83.

Then, the third electrode 5 is continuously evaporated, and the first part of the third electrode 5 covers the plurality of pixel opening areas (i.e., the first opening 86). The second part of the third electrode 5 is located in the pixel spacing area and can be electrically connected to the first electrode 2 through the second via hole 84, and the third part of the third electrode 5 is coupled to the second conductive pattern 32 of the second electrode 3 through the third via hole.

In the display substrate provided by the above embodiment, based on the lift-off process, it is proposed to use the first electrode 2 as an auxiliary cathode. Since the first electrode 2 and the anode pattern 4 are formed in the same layer, the first electrode 2 is the metal film layer closest to the cathode. In the process, the interconnection between the first electrode 2 and the cathode is not difficult.

In the display substrate provided by the foregoing embodiment, the gap between the anode patterns 4 is used or the position of the anode pattern 4 is appropriately adjusted, so as to realize the rational layout of the first electrode 2 and the cathode in the upper layer is connected, which is equivalent to introduce an auxiliary electrode layer connected in parallel with the cathode, thereby effectively reducing the resistance of the cathode, and improving the IR Drop problem of the cathode.

Moreover, when the first electrode 2 and the second electrode 3 are both used as VSS and are both connected to the third electrode 5 (cathode), since the second electrode 3 has the first conductive pattern and the second conductive pattern arranged in different layers, the current path of VSS is changed from two-dimensional distribution to three-dimensional distribution, that is, the VSS current can not only converge from the cathode to the periphery to the second electrode 3, and then flow into the chip, but also can converge to the chip through the first electrode 2, that is, the cathode current in the display area has two layers of current paths.

In addition, it is worth noting that when the orthographic projection of the third part of the third electrode 5 on the substrate and the orthographic projection of the second electrode 3 on the substrate have a third overlapping area, the third part of the third electrode 5 is electrically connected to the second conductive pattern 32 of the second electrode 3 through the third via hole provided in the third overlapping area, the third electrode 5 is not lapped on the second conductive pattern 32 in the display area. This method is fully compatible with the manufacturing process in the related art, and no additional process is required.

In order to more clearly illustrate the technical solution of using the first electrode 2 as an auxiliary cathode to be connected in parallel with the cathode, two specific embodiments are given below.

In one embodiment, the resolution of the display substrate is Full High Definition (FHD) level, and the pixels are arranged in a GGRB manner. With the above technical solution, the VSS resistance is reduced by about 40%.

Figure 11D:
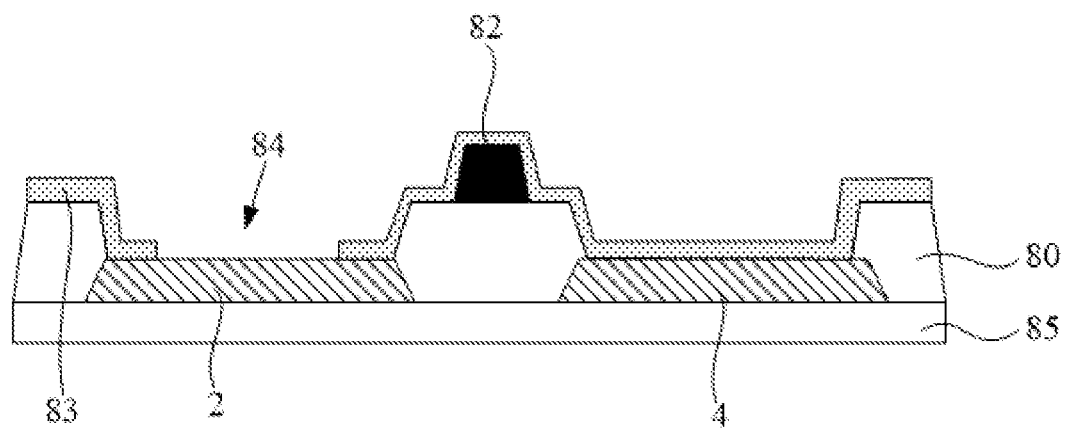
Figure 11E:
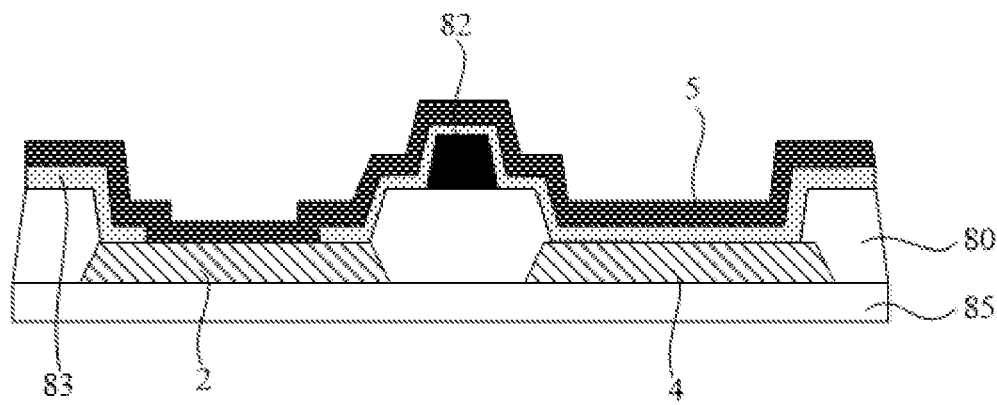

Layout of first anode is shown in FIGS. 9, 11*a* and 11*d*, the first electrode 2 avoids the anode pattern 4 and is interconnected to form a mesh structure in the whole display area. The trace width of the first electrode 2 can be selected to be about 4 μm, and the distance between the first electrode and the anode pattern 4 is at least 3 μm (depending on the process capability). The punched area (i.e., the second via hole 84) of the first electrode 2 connected to the cathode avoid the anode patterns 4 and the spacers 82, and the positions of the punched area is determined according to the size of the gaps between the adjacent anode patterns 4, so that the punched areas are uniformly distributed as much as possible. The size of the first electrode 2 exposed by the second via hole 84 may be selected to be 11 μm×11 μm. An orthographic projection of the second via hole 84 on the substrate may be located inside an orthographic projection of the first electrode 2 on the substrate. The orthographic projection of the first opening 86 of the pixel defining layer 80 on the substrate may be located inside the orthographic projection of the corresponding anode pattern 4 on the substrate, and the area of the orthographic projection of the first opening 86 on the substrate is smaller than the area of the orthographic projection of the corresponding anode pattern 4 on the substrate. The minimum distance between the boundary of the orthographic projection of the second via hole 84 on the substrate and the boundary of the orthographic projection of the first electrode 2 on the substrate is at least 1.5 μm. The sacrificial pattern 9 is located inside the second via hole 84 of the pixel defining layer 80, an orthographic projection of the sacrificial pattern 9 on the substrate is surrounded by an orthographic projection of the corresponding second via hole 84 on the substrate, and a minimum distance between a boundary of the orthographic projection of the first sacrificial pattern 9 on the substrate and a boundary of the orthographic projection of the second via hole 84 on the substrate is at least 1.5 μm.

In another embodiment, the resolution of the display substrate is at the FHD level, and the pixels are arranged in a strip manner. With the above technical solution, the VSS resistance is reduced by about 40%.

Figure 10:
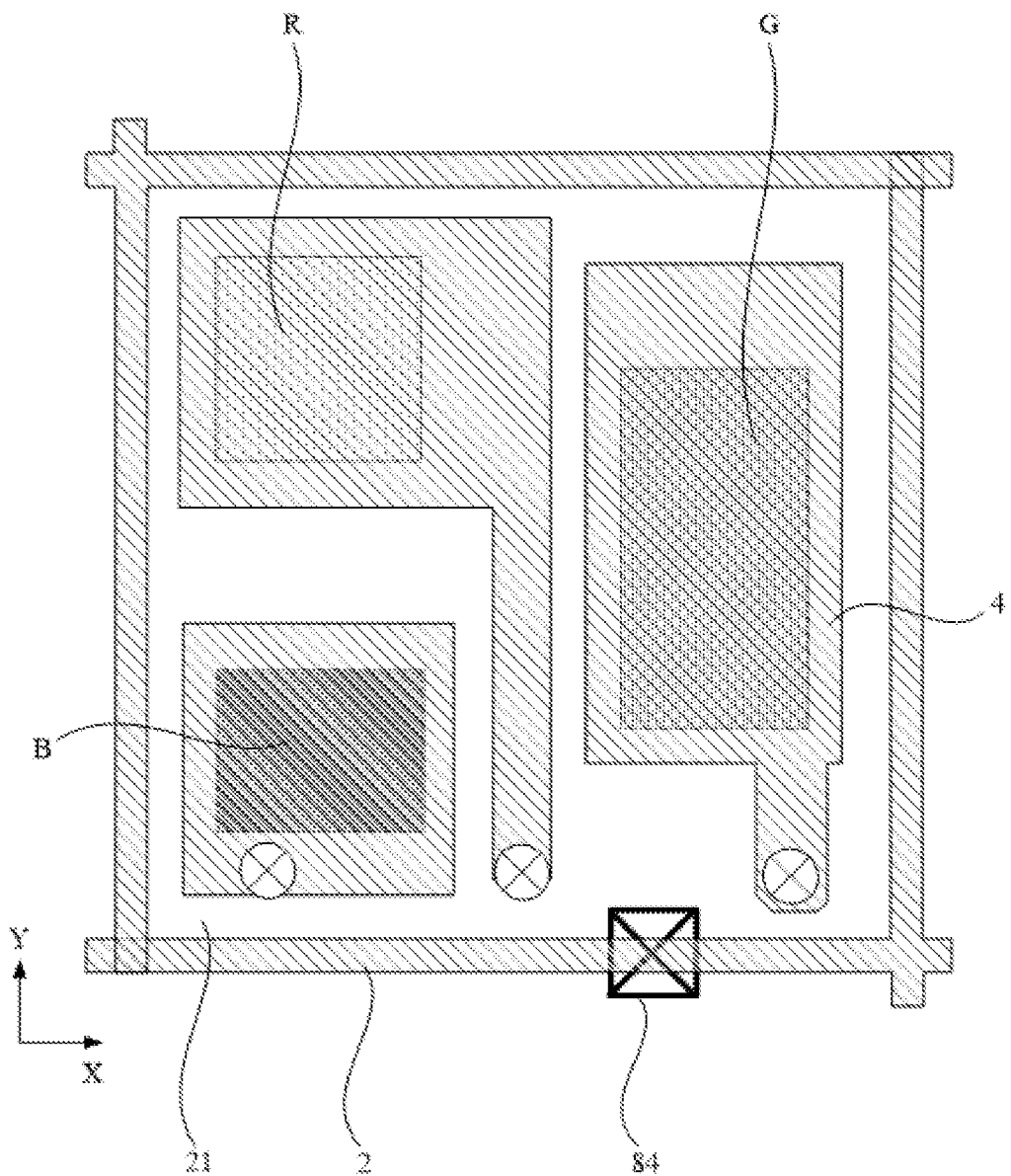
FIG. 10 is a schematic diagram showing a fourth structure in the display area in the display substrate provided by an embodiment of the present disclosure.

The layout of the first anode is shown in FIG. 10, the first electrode 2 avoids the anode pattern 4, and is interconnected to form a mesh structure in the entire display area. The trace width of the first electrode 2 can be selected to be about 3 μm, and the distance between the anode patterns 4 is at least 3 μm (depending on the process capability). The punched area of the first electrode 2 lapped on the cathode (that is, the second via hole 84) avoids the anode pattern 4 and the spacer 82. The position of the punched area is determined according to the gap between adjacent anode patterns 4, the first electrodes 2 are evenly distributed as much as possible. The size of the first electrode 2 exposed by the second via hole 84 in the punched area may be 11 μm×11 μm. The orthographic projection of the second via hole 84 on the substrate may be located inside the orthographic projection of the first electrode 2 on the substrate. The orthographic projection of the first opening 86 of the pixel defining layer 80 on the substrate may be located inside the orthographic projection of the corresponding anode pattern 4 on the substrate, and the area of the orthographic projection of the first opening 86 on the substrate is smaller than the area of the orthographic projection of the corresponding anode pattern 4 on the substrate, the minimum distance between the boundary of the orthographic projection of the second via hole 84 on the substrate and the boundary of the orthographic projection of the first electrode 2 on the substrate is at least 1.5 μm. The sacrificial pattern 9 is located inside the second via hole 84 of the pixel defining layer 80, and the orthographic projection of the first sacrificial pattern 9 on the substrate is surrounded by the orthographic projection of the corresponding second via hole 84 on the substrate, the minimum distance between the boundary of the orthographic projection of the first sacrificial pattern 9 on the substrate and the boundary of the orthographic projection of the second via hole 84 on the substrate is at least 1.5 μm.

In some embodiments, the second electrode 3 includes a negative power supply signal line (VSS) surrounding the display area, and the third electrode 5 includes a cathode. Alternatively, the second electrode 3 includes a reference signal line in the display substrate.

In some embodiments, the display substrate further includes a plurality of repeating units, each repeating unit includes at least three sub-pixels arranged at intervals, and each sub-pixel includes a pixel opening area, a pixel spacing area is formed between two adjacent pixel opening areas.

Specifically, the display substrate may include a plurality of repeating units, the plurality of repeating units are arranged in an array, each repeating unit may include at least three sub-pixels arranged at intervals, and each of the sub-pixels included in the repeating unit includes an organic light-emitting material layer 83. The organic light-emitting material layer 83 can emit white light or colored light. When white light is emitted, each sub-pixel needs to be provided with a corresponding color resist pattern.

It should be noted that R, G, and B in FIG. 2, FIG. 4, FIG. 5, FIG. 9 and FIG. 10 may correspond the color resist patterns or organic light-emitting material layers in corresponding colors.

The specific structures of the first electrode 2 are various. As shown in FIG. 10, in some embodiments, the first electrode 2 of the mesh structure may include a body portion that defines a plurality of first enclosed areas 21, the first enclosed areas 21 correspond to the repeating units in a one-to-one manner, and the orthographic projection of the first enclosed area 21 on the substrate of the display substrate covers the orthographic projection of an opening area of the repeating unit on the substrate, and the opening area includes a pixel opening area included in each sub-pixel in the repeating unit.

The orthographic projection of the first electrode 2 forming an enclosed area 21 on the substrate surrounds the orthographic projection of the opening area in the repeating unit located in the enclosed area 21 on the substrate.

Specifically, there are various specific layout modes of the body portion. For example, the body portion can define a plurality of first enclosed areas 21.

It should be noted that the first enclosed area 21 means that the body portion in the mesh structure comprises a plurality of line segments, the line segments are connected end to end to form with the enclosed area, and the enclosed has no fracture.

Figure 4:
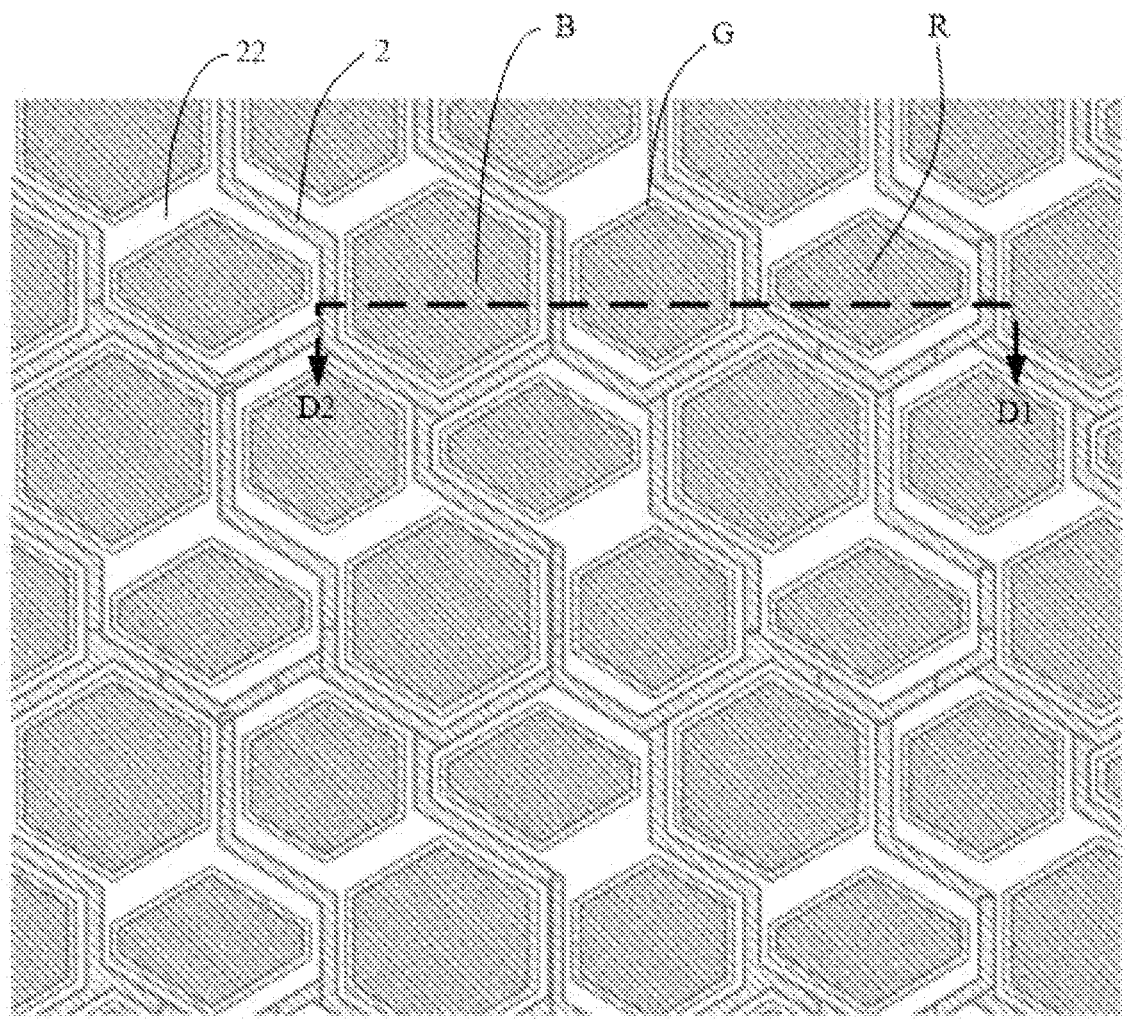
FIG. 4 is a schematic diagram showing a second structure in the display area provided by the display substrate provided in the present disclosure.

In other embodiments, as shown in FIGS. 2 and 4, the mesh structure includes a body portion that defines a plurality of second enclosed areas 22; all sub-pixels included in the plurality of repeating units can be divided into multiple sub-pixel groups, and each sub-pixel group includes at least one of the sub-pixel; the orthographic projection of the second enclosed area 22 on the substrate of the display substrate surrounds the orthographic projection of the corresponding sub-pixel group on the substrate.

Exemplarily, the body portion can define a plurality of second enclosed areas 22, and the orthographic projection of the second enclosed areas 22 on the substrate of the display substrate surrounds the orthographic projection of the corresponding sub-pixel group on the substrate.

It should be noted that each sub-pixel group may include at least one sub-pixel, and each sub-pixel can only belong to one sub-pixel group.

In addition, as shown in FIG. 5, the body portion may be specifically located directly under the pixel defining layer 80 and covered by the pixel defining layer 80.

In more detail, the sub-pixel group may include at least one sub-pixel of the same color; and/or the sub-pixel group may include at least two sub-pixels of different colors.

The specific structures of the repeating unit are various, as shown in FIG. 2 and FIG. 9. In some embodiments, each repeating unit includes one red sub-pixel, one blue sub-pixel, and two green sub-pixels; the orthographic projection of at least part of the body portion on the substrate is located between the orthographic projections of the first openings of the two green sub-pixels on the substrate.

Specifically, in one of the repeating units, the minimum distance between the anode patterns 4 corresponding to the adjacent green sub-pixels is generally about 15 μm. Therefore, the orthographic projection of at least part of the body portion on the substrate is located between the orthographic projections of the two green sub-pixels on the substrate, and the width of the body portion in the direction perpendicular to its extension direction is set to be about 5 μm, which can ensure that the good shunting effect of the first electrode 2, can also prevent a short circuit between the first electrode 2 and the anode pattern 4.

As shown in FIG. 9, in some embodiments, the plurality of repeating units are arranged in an array, in each repeating unit, the two green sub-pixels are arranged along a first direction, and the red sub-pixels are located on a first side of the two green sub-pixels, the blue sub-pixel is located on a second side of the two green sub-pixels, the first side and the second side are opposite in a second direction, the second direction is perpendicular to the first direction.

Exemplarily, the first direction includes the Y direction, and the second direction includes the X direction. When the repeating unit adopts the above structure, a GGRB pixel arrangement is formed.

Furthermore, as shown in FIG. 2, in this pixel arrangement, it can be set that there is no first anode 2 between the anode connection via hole 1 corresponding to the blue sub-pixel and the anode connection via hole 2 corresponding to the adjacent green sub-pixel, which is not limited to this.

It should be noted that the anode connection via holes corresponding to each anode pattern 4 included in the display substrate are all arranged in a row and column direction, and the via holes in the same row are approximately in a straight line, and the spacing thereof is approximately equal.

Figure 13A:
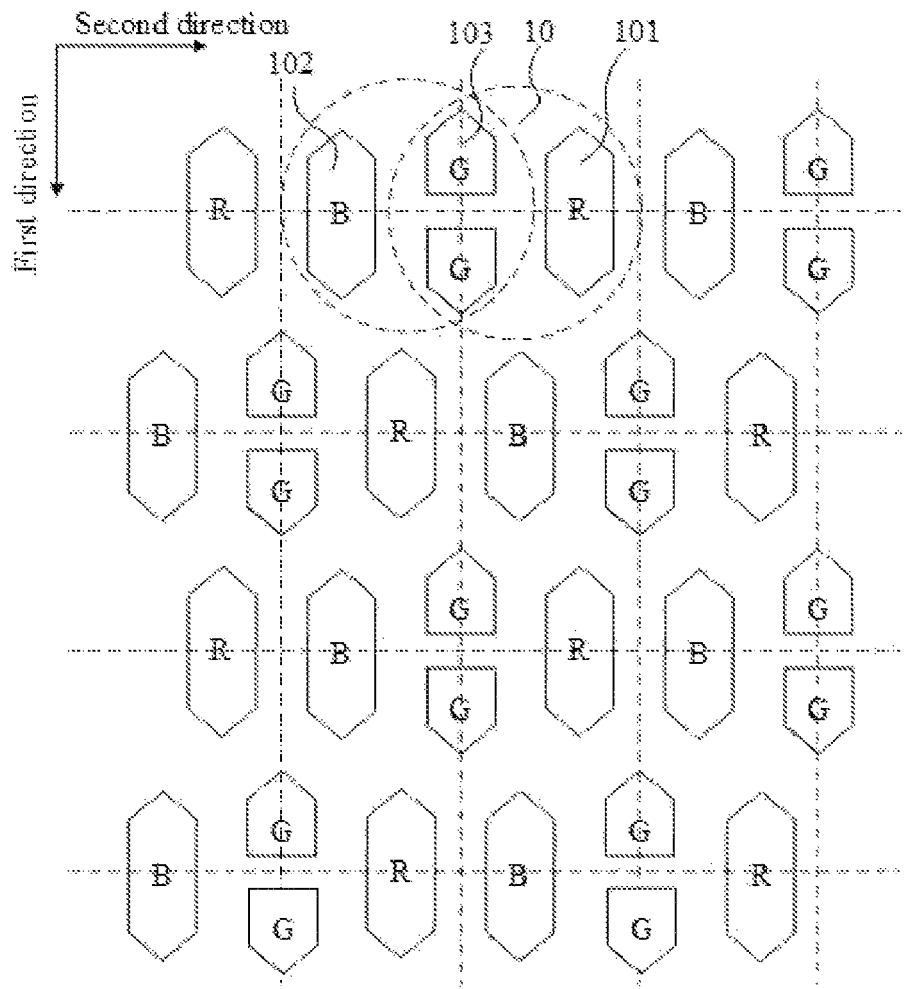
FIG. 13a is a schematic view showing a seventh structure in the display area in the display substrate provided by an embodiment of the present disclosure.
Figure 13B:
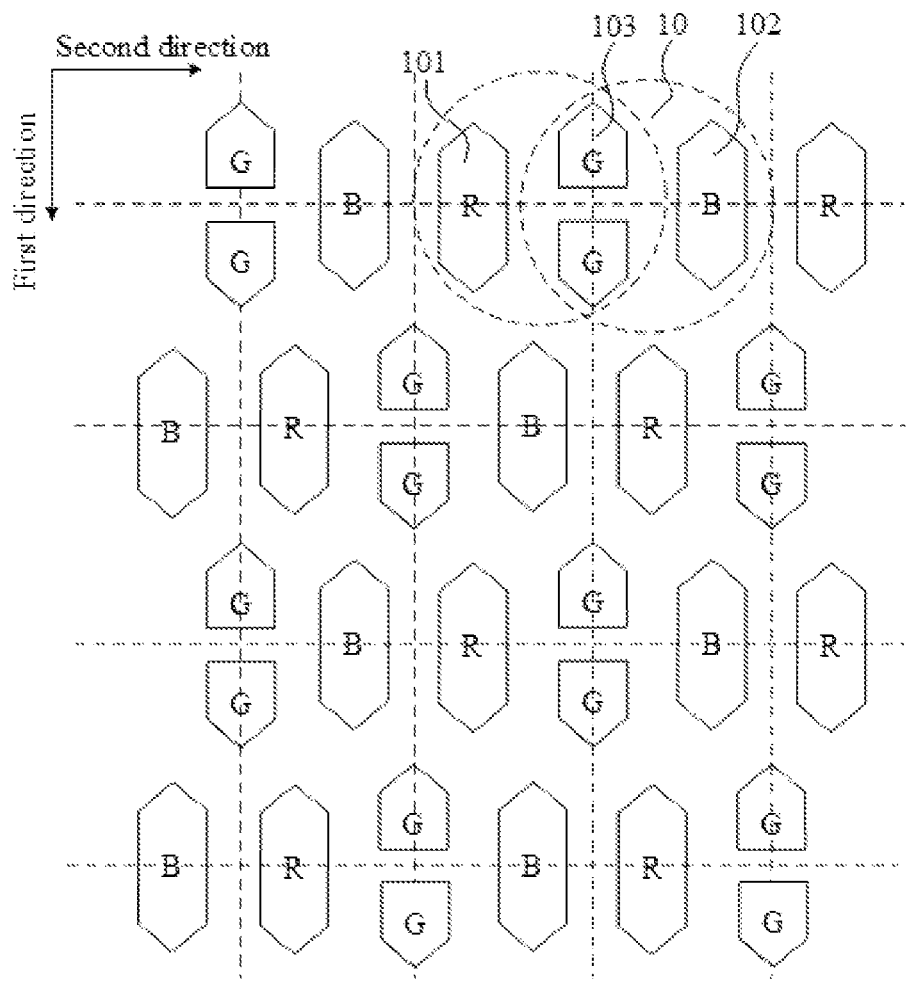
FIG. 13b is a schematic view showing an eighth structure in the display area provided in the display substrate provided by an embodiment of the present disclosure.

As shown in FIG. 13a and FIG. 13b, for example, in the first direction, the green sub-pixels 103 are arranged in pairs; a red sub-pixel 101 and a blue sub-pixel 102 are arranged between two pairs of green sub-pixels 103 that are arbitrarily close.

That is, all the green sub-pixels 103 in the first direction are paired, and the green sub-pixels 103 in each pair are arranged adjacent to each other.

On this basis, for example, a red sub-pixel 101 and a blue sub-pixel 102 between two pairs of green sub-pixels 103 that are arbitrarily close are arranged oppositely in the second direction.

Here, since in the second direction, the red sub-pixel 101 and the blue sub-pixel 102 are both arranged between two pairs of green sub-pixels 103 close to each other, the requirement that the sub-pixel density is 1.5 times the pixel density can be satisfied. The number ratio of the red sub-pixels 101, the green sub-pixels 103, and the blue sub-pixels 102 is 1:2:1.

It should be noted that in the first direction, the green sub-pixels 103 are arranged in pairs adjacent to each other; a red sub-pixel 101 and a blue sub-pixel 102 are arranged between two pairs of green sub-pixels 103 that are arbitrarily close. In the first direction and the second direction, the sub-pixel density is 1.5 times the pixel density and the virtual pixel array is evenly distributed. For example, green sub-pixels arranged in pairs adjacent to each other form a plurality of green sub-pixel pairs arranged in the second direction. Wherein, two green sub-pixels in each pair of green sub-pixels are arranged along the first direction.

In the embodiment of the present disclosure, all the green sub-pixels 103 located in the second direction are arranged in pairs adjacent to each other. When the OLED is prepared by a fine metal mask (FMM) evaporation process, the color layers of the two green sub-pixels 103 in each pair are connected together, and the green light-emitting layers of the two green sub-pixels 103 in each pair are formed through an evaporation hole of the FMM, thereby reducing process difficulty for manufacturing the color layer of the green sub-pixel 103 to a certain extent.

Further, in the embodiment of the present disclosure, the adjacent green sub-pixels 103 can be arranged side by side in the first direction, and the position of the green sub-pixels 103 can be fine-tuned to realize the uniform distribution of the virtual pixel array, and a certain distance is set between two closest green sub-pixels 103, which reduces the difficulty of the process and ensures the smoothness and continuity of the horizontal and vertical lines in the center of the bright spot to the greatest extent in the case of high resolution (as shown by the dashed lines in FIG. 13a and FIG. 13b).

In some examples, as shown in FIGS. 13a and 13b, the shapes of the red sub-pixel 101 and the blue sub-pixel 102 are both hexagons, and the three sets of opposite sides of the hexagon are all parallel.

The shape of each green sub-pixel 103 is a pentagon. The pentagon includes a set of parallel opposite sides and one vertical side, and the vertical side is perpendicular to the set of parallel opposite sides; wherein, the vertical sides in each pair of green sub-pixels 103 are adjacent to each other.

A set of longer parallel opposite sides in the red sub-pixel 101 and a set of longer parallel opposite sides in the blue sub-pixel 102 are parallel to a set of parallel opposite sides in the green sub-pixel 103.

Here, it should be noted that the positions of the red sub-pixel 101, the blue sub-pixel 102, and the green sub-pixel 103 in each repeating unit can be adjusted arbitrarily, as long as the sub-pixel density is 1.5 times the pixel density in the first direction and the second direction of the pixel array. For example, it can be as shown in FIG. 13a or as shown in FIG. 13b.

In the embodiment of the present disclosure, since a set of longer parallel opposite sides in the red sub-pixel 101 and a set of longer parallel opposite sides in the blue sub-pixel 102 are parallel to a set of parallel opposite sides in the green sub-pixel 103. On the one hand, the opening of each FMM can be designed to be close to a regular hexagon, which is conducive to FMM design; on the other hand, when the FMM evaporation process is used to evaporate sub-pixels, the FMM netting force can be mainly applied to the long side. Therefore, damage to the FMM can be avoided, which is beneficial to guarantee the yield rate of the netting.

For example, as shown in FIGS. 13a and 13b, the red and blue sub-pixels in each repeating unit group are arranged along the second direction, and a pair of green sub-pixels are arranged along the first direction. In addition, red and blue sub-pixels and the pair of the green sub-pixels may be arranged along the second direction, or the pair of green sub-pixels may be arranged between one red sub-pixel and one blue sub-pixel.

As shown in FIGS. 13a and 13b, a plurality of repeating units are arranged along the second direction to form a repeating unit group (row). The dotted line along the second direction in the figure represents, for example, the center line of the repeating unit group. The plurality of repeating unit groups are arranged along the first direction, thereby forming the entire pixel arrangement structure.

For example, in the above-mentioned pixel arrangement structure, adjacent repeating unit groups are staggered from each other in the second direction, that is, adjacent repeating unit groups have a certain offset along the second direction. Therefore, sub-pixels of the same color in the adjacent repeating unit groups are not aligned in the first direction. In some examples, the offset of the adjacent repeating unit group in the second direction is half of the size of the repeating unit in the second direction. For example, the size of the repeating unit in the second direction is the pitch of the repeating unit in the second direction.

As shown in FIG. 13a and FIG. 13b, the arrangement of pixels in repeating unit group in the odd-numbered row is the same, and the arrangement of pixels in repeating unit group in the even-numbered row is the same. For example, except for the edge portion of the pixel arrangement structure, the line connecting the centers of two green sub-pixels in each repeating unit is located between the centers of two adjacent red and blue sub-pixels in adjacent repeating units. In addition, the edges of the two green sub-pixels are inside the outer edges of the two adjacent red and blue sub-pixels, and the outer edge here refers to the edges opposite to each other of the two sub-pixels in the second direction. That is, the extension range of one green sub-pixel pair in the second direction is not greater than the extension range of the two adjacent red and blue sub-pixels in the second direction.

For example, for the above-mentioned pixel array structure, the ratio of the number of pixels of red, blue, and green is 1:1:2. One red sub-pixel and one green sub-pixel constitute one pixel, and one blue sub-pixel and one green sub-pixel constitute one pixel. The embodiments of the present disclosure have no specific limitations on specific combinations. For example, one red-green sub-pixel and one green sub-pixel in a repeating unit form one pixel, and one blue sub-pixel and another green sub-pixel form another pixel. Or, for a pair of green sub-pixels in the same repeating unit, one of the green sub-pixels and one red sub-pixel in the repeating unit form a pixel, and the other green sub-pixel and one blue sub-pixel in the adjacent repeating unit form a pixel.

For example, as shown in FIGS. 13a and 13b, the green sub-pixels are arranged in a first direction, and the sizes of the red and blue sub-pixels in the first direction are larger than sizes thereof in the second direction.

As shown in FIGS. 13a and 13b, the size of the red and blue sub-pixels in the first direction is larger than the size of the blue sub-pixel in the second direction.

As shown in FIG. 10, in some embodiments, each repeating unit includes one red sub-pixel, one blue sub-pixel, and one green sub-pixel; the plurality of repeating units are arranged in an array, and the plurality of repeating units can be divided into a plurality of columns of repeating units, each column of repeating units includes a plurality of repeating units arranged in a first direction (such as Y direction), and each column of repeating units can be divided into two columns of sub-pixels, and one column of sub-pixels includes a plurality of red sub-pixels and a plurality of blue sub-pixels, the red sub-pixels and the blue sub-pixels are alternately arranged along the first direction, and the other column of sub-pixels includes a plurality of green sub-pixels arranged along the first direction.

Specifically, when the repeating unit adopts the above structure, a stripe-shaped pixel arrangement is formed.

For example, the area of the body electrode of a green sub-pixel anode pattern is larger than the area of the body electrode of a blue sub-pixel anode pattern, and is larger than the area of the body electrode of a red sub-pixel anode pattern. For example, the area of the body electrode of a red sub-pixel anode pattern is larger than the area of the body electrode of a blue sub-pixel anode pattern. For example, the size of the body electrode of a green sub-pixel anode pattern in the Y direction is larger than the size of the body electrode of a blue sub-pixel anode pattern in the Y direction, and larger than the size of the body electrode of a red sub-pixel anode pattern in the Y direction. For example, the size of the body electrode of a green sub-pixel anode pattern in the Y direction does not exceed the span of the body electrode of a blue sub-pixel anode pattern and the body electrode of a red sub-pixel anode pattern in the Y direction, that is, when the body electrode of the green sub-pixel anode pattern, the body electrode of the blue sub-pixel anode pattern, and the body electrode of the red sub-pixel anode pattern are respectively projected on a straight line along the Y direction, the projection of the body electrode of the green sub-pixel anode pattern is located between two farthest points of the projection of the body electrode of the blue sub-pixel anode pattern and the projection of the body electrode of the red sub-pixel anode pattern.

For example, the size of the body electrode of a green sub-pixel anode pattern in the X direction, the size of the body electrode of the blue sub-pixel anode pattern in the X direction, and the size of the body electrode of the red sub-pixel anode pattern in the X direction are approximately the same. For example, the size of the body electrode of the blue sub-pixel anode pattern in the X direction and the size of the body electrode of the red sub-pixel anode pattern in the X direction are approximately the same, and the ratio of the size of the body electrode of the blue sub-pixel anode pattern in the X direction or the size of the body electrode of the red sub-pixel anode pattern in the X direction to the size of the body electrode of a green sub-pixel anode pattern in the X direction is 0.8 to 1.2.

For example, a connection electrode of the blue sub-pixel anode pattern, a connection electrode of the red sub-pixel anode pattern, and a connection electrode of the green sub-pixel anode pattern are located on a straight line parallel to the X direction. For example, the connection electrode of the red sub-pixel anode pattern is located between the sub-pixels formed by the blue sub-pixel and the green sub-pixel, and is closer to the blue sub-pixel anode pattern, and away from the side of the green sub-pixel anode pattern.

It should be noted that in the above example, the drawings schematically show the shape, size and position of the anode pattern of each sub-pixel. For each sub-pixel, the actual light-emitting area is defined by the first opening of the pixel defining layer. For example, the pixel defining layer has a mesh structure covering the edge of the anode pattern (for example, an anode) of each sub-pixel, and the pixel defining layer includes a plurality of first openings, and each first opening exposes a part of the anode pattern of a sub-pixel. The light-emitting layer is at least formed in the plurality of first openings, and a cathode is formed on the side of the light-emitting layer away from the substrate, and the cathode and anode patterns in the first openings of each sub-pixel drive the light-emitting layer to emit light. For example, the projection of the first opening of the pixel defining layer of each sub-pixel on the substrate is located in the projection of the anode pattern of the sub-pixel on the substrate, so the arrangement of each sub-pixel is in a one-to-one corresponding with the arrangement of openings of the pixel defining layer and the arrangement of anode patterns. For example, the pixel driving circuits of each sub-pixel are arrayed in multiple rows and multiple columns in the X and Y directions, and the pixel driving circuit structure of each sub-pixel can be roughly the same except for the size of the drive transistor and the structure of the connection electrode, such as a data line, a power line, and a capacitor electrode, etc.

For example, along the Y direction, the pixel driving circuit of each sub-pixel is arranged in the order of the pixel driving circuit of the green sub-pixel, the pixel driving circuit of the blue sub-pixel, and the pixel driving circuit of the red sub-pixel. Along the X direction, the pixel driving circuits of each row of sub-pixels are repeatedly arranged.

Figure 12A:
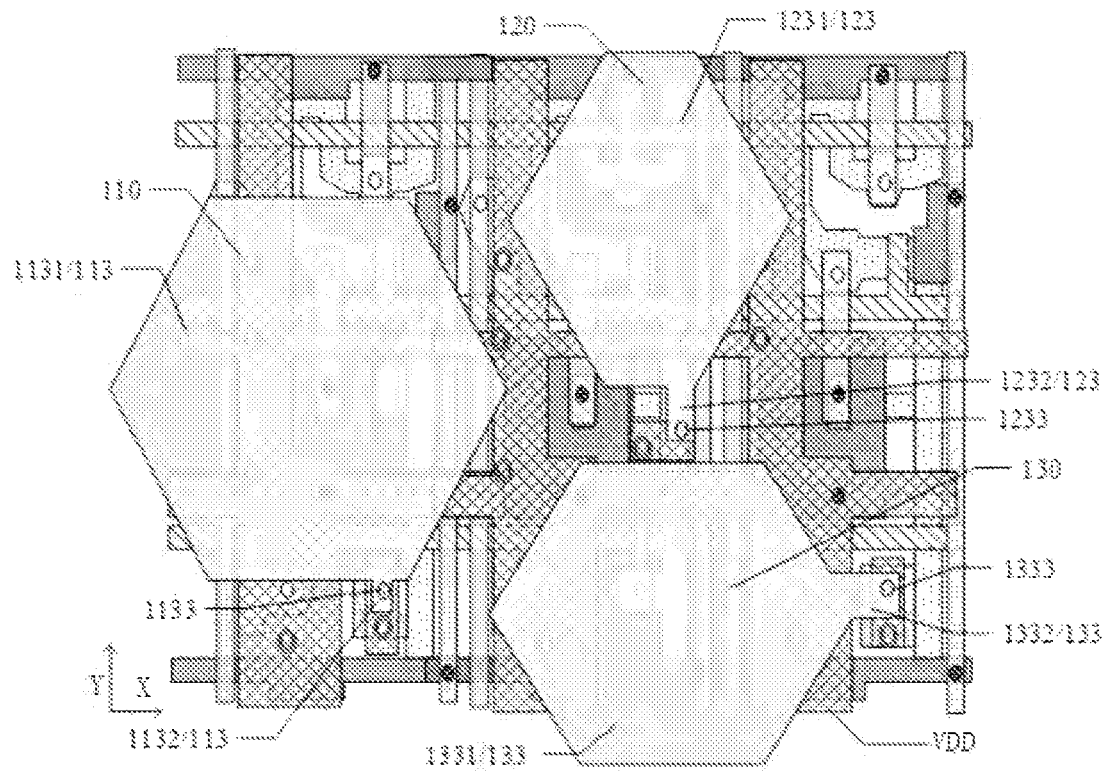
FIG. 12a is a schematic view showing a fifth structure in the display area in the display substrate provided by an embodiment of the present disclosure.

As shown in FIG. 12a, in some embodiments, in each repeating unit, the pixel driving circuits of the first color sub-pixel 110, the second color sub-pixel 120, and the third color sub-pixel 130 are sequentially along the first direction (X direction pointed by the arrow). For example, a column of sub-pixels arranged along the Y direction are sub-pixels of the same color.

For example, as shown in FIG. 12a, the anode pattern of each color sub-pixel includes a body electrode and a connection electrode, and the shape of the body electrode of each color sub-pixel is a hexagon.

For example, as shown in FIG. 12a, the anode pattern 113 of the first color sub-pixel 110 includes a first body electrode 1131 and a first connection electrode 1132. The first body electrode 1131 and the first connection electrode 1132 may be an integrated structure, and the first connection electrode 1132 is connected to the driving signal output terminal of the corresponding pixel driving circuit through a connection hole 1133. The anode pattern 123 of the second color sub-pixel 120 includes a second body electrode 1231 and a second connection electrode 1232. The second body electrode 1231 and the second connection electrode 1232 may be an integral structure, and the second connection electrode 1232 is connected to the drive signal output terminal of the corresponding pixel driving circuit through the connection hole 1233. The anode pattern 133 of the third color sub-pixel 130 includes a third body electrode 1331 and a third connection electrode 1332. The third body electrode 1331 and the third connection electrode 1332 may be an integral structure, and the third connection electrode 1332 is connected to the driving signal output terminal of the corresponding pixel driving circuit through the connection hole 1333.

For example, the first connection electrode 1132 of the first color sub-pixel 110 is located on the side of the center of the first body electrode 1131 away from the data line of the pixel driving circuit of the sub-pixel in the X direction, and is located on the side of the center of the first body electrode 1131 away from the light-emitting control signal line of the pixel driving circuit of the sub-pixel in the Y direction. For example, the first connection electrode 1132 and the first body electrode 1131 of the first color sub-pixel 110 are arranged in the Y direction, and the first connection electrode 1132 is located at the lower right corner of the first body electrode 1131. For example, the second connection electrode 1232 of the second color sub-pixel 120 is located on the side of center of the second body electrode 1231 away from the data line of the pixel driving circuit of the sub-pixel in the X direction, and located on the side of center of the second body electrode 1231 away from the light-emitting control signal line of the pixel driving circuit of the sub-pixel in the X direction. For example, the second connection electrode 1232 and the second body electrode 1231 of the second color sub-pixel 120 are arranged in the Y direction, and the second connection electrode 1232 is located at the lower right corner of the first body electrode 1231. For example, the third connection electrode 1332 and the third body portion electrode 1331 of the third color sub-pixel 130 are arranged in the X direction, and the third connection electrode 1332 is located on the right side of the third body electrode 1331, that is, close to the VDD in the sub-pixel driving circuit.

For example, a pixel defining layer is further provided between adjacent sub-pixels, and the pixel defining layer includes a first opening for defining the light-emitting area of each color sub-pixel. The orthographic projection of the first opening of the pixel defining layer on the substrate is within the orthographic projection of the body electrode of the corresponding anode pattern on the substrate.

For example, each color sub-pixel further includes an organic light-emitting layer, and the organic light-emitting layer is located on the side of the anode pattern away from the substrate. The anode pattern of each color sub-pixel is in contact with the organic light-emitting layer at the first opening of the pixel defining layer, and the first opening of the pixel defining layer defines the shape of the light-emitting area of the sub-pixel. For example, the anode pattern of the organic light-emitting element may be arranged under the pixel defining layer, and the pixel defining layer includes an opening for defining sub-pixels, the opening exposes a part of the anode pattern. When the organic light-emitting layer is formed in the opening of the pixel defining layer, the organic light-emitting layer is in contact with the anode pattern, so that this part can drive the organic light-emitting layer to emit light.

For example, the orthographic projection of the first opening of the pixel defining layer on the substrate is located within the orthographic projection of the corresponding organic light emitting layer on the substrate, that is, the organic light emitting layer covers the first opening of the pixel defining layer. For example, the area of the organic light-emitting layer is larger than the area of the first opening of the corresponding pixel defining layer, that is, the organic light-emitting layer includes a part located inside the first opening of the pixel defining layer, and further include at least a part covering the physical structure of the pixel defining layer. The organic light-emitting layer covers the physical structure of the pixel defining layer at each boundary of the first opening of the pixel defining layer. It should be noted that the above description of the organic light-emitting layer pattern is based on, for example, the patterned organic light-emitting layer of each sub-pixel formed by the FMM process. In addition to the FMM manufacturing process, there are also some organic light-emitting layers that are an entire film layer formed on the whole display area using the open mask process. The orthographic projection of the shape of the organic light-emitting layer on the substrate is continuous, so there must be a part located in the first opening of the pixel defining layer and a part located on the physical structure of the pixel defining layer.

Figure 12B:
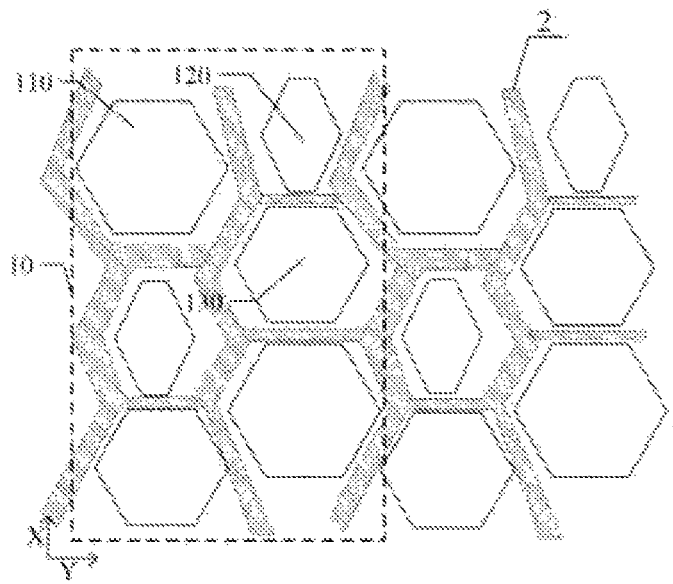
FIG. 12b is a schematic diagram showing a sixth structure in the display area in the display substrate provided by an embodiment of the present disclosure.

FIG. 12b is a schematic diagram of the arrangement structure of the pixels shown in FIG. 12a. As shown in FIG. 12a, the shape of the body electrode of the anode pattern of the organic light-emitting element of each color sub-pixel is a hexagon. The plurality of sub-pixels may be divided into a plurality of pixel unit groups 10 arranged in an array along the X direction and the Y direction. Each pixel unit group 10 includes two columns of sub-pixels arranged along the X direction, and each column of sub-pixels includes a first color sub-pixel 110, a second color sub-pixel 120, and a third color sub-pixel 130. Along the Y direction, the two columns of sub-pixels in each pixel unit group 10 are offset by a pitch that is less than one sub-pixel. For example, the two columns of sub-pixels in each pixel unit group 10 are offset from each other by a pitch about half a sub-pixel. For example, the sides of two adjacent sub-pixels opposite to each other are approximately parallel. For example, the first color sub-pixels, the second color sub-pixels, and the third color sub-pixels in adjacent columns are arranged in the same order. For example, in the Y (column) direction, the first color sub-pixel is located between the second color sub-pixel and the third color sub-pixel in an adjacent column, and the second color sub-pixel is located in between the first color sub-pixel and the third color sub-pixel in an adjacent column, the third color sub-pixel is located between the first color sub-pixels and the second color sub-pixels in adjacent column 11.

For example, in one pixel unit group 10, one first color sub-pixel in the first column and one second color sub-pixel and one third color sub-pixel adjacent to the one first color sub-pixel in the second column constitute a pixel unit, which can realize a pixel point display. In a pixel unit group 10, in two adjacent pixel units, the first column of sub-pixels and the second column of sub-pixels in the first pixel unit can be swapped with the first column and second column of the second pixel unit. For example, the first color sub-pixels in the first pixel unit are located in the first column, the second color sub-pixels and the third color sub-pixels are located in the second column, and the first color sub-pixels in the second pixel unit are located in the second column, second color sub-pixels and the third color sub-pixels are located in the first column. For example, the first color sub-pixel is a blue sub-pixel, the second color sub-pixel is a red sub-pixel, and the third color sub-pixel is a green sub-pixel. Each pixel unit includes one blue sub-pixel located in a column and one red sub-pixel and one green sub-pixel adjacent to the blue sub-pixel in the adjacent column.

For example, the area of the light-emitting area of a blue sub-pixel is larger than the area of the light-emitting area of a red sub-pixel or a green sub-pixel. For example, the area of the anode pattern of a blue sub-pixel is larger than the area of the anode pattern of a red sub-pixel or a green sub-pixel. For example, the shape of the body electrode of the anode of the first color sub-pixel and the third color sub-pixel is approximately a regular hexagon, and the shape of the body electrode of the anode of the second color sub-pixel is a non-regular hexagon and includes two symmetry axes, The size of the symmetry axis in the X direction is greater than the size of the symmetry axis in the Y direction.

For example, as shown in FIG. 12a, the first body electrode 1131 of the anode pattern 113 of the first color sub-pixel 110 covers the driving transistor of the first color sub-pixel 110, and the second body electrode of the anode pattern 123 of the second color sub-pixel 120 does not overlap or partially overlaps the driving transistor of the second color sub-pixel 120, and the third body electrode 1331 of the anode pattern 133 of the third color sub-pixel 130 does not overlap the driving transistor of the third color sub-pixel 130.

For example, as shown in FIG. 12a, the first body electrode 1131 of the first color sub-pixel 110 (such as the blue sub-pixel) overlaps the scan line and the light-emitting control signal line, and the second body electrode 1231 of the second color sub-pixel 120 (such as the red sub-pixel) overlaps the scan line and the reset control signal line. The third body electrode 1331 of the third color sub-pixel 130 (for example, the green sub-pixel) overlaps the light-emitting control signal line, the reset control signal line of the next row of pixel driving circuit and the reset power signal line of the next row of the pixel driving circuit. For example, the third body electrode 1331 of the third color sub-pixel 130 (for example, the green sub-pixel) overlaps the pixel driving circuit area of the adjacent first color sub-pixel (for example, the blue sub-pixel) in the next row.

For example, the first body electrode 1131 of the first color sub-pixel 110 partially overlaps the driving transistor of the adjacent third color sub-pixel 130, and the first body electrode 1131 of the first color sub-pixel 110 overlaps the data lines and the shielding lines in the pixel driving circuit and the data lines in the pixel driving circuit of the adjacent second color sub-pixel 120. The second body electrode 1231 of the second color sub-pixel 120 does not overlap the data line in the pixel driving circuit, and overlaps the first power signal line in the pixel driving circuit and the first power signal line and the data line in pixel driving circuit of the adjacent third color sub-pixel 130. The third body electrode 1331 of the third color sub-pixel 130 overlaps the data line and the first power signal line in the pixel driving circuit, and overlaps the first power signal line in the pixel driving circuit of the adjacent second color sub-pixel 120.

For example, as shown in FIG. 12*a*, a first connection electrode 1132 connected to the first body electrode 1131 is arranged on the side of the first body electrode 1131 of the first color sub-pixel 110 close to the reset control signal line of the next row. A second connection electrode 1232 connected to the second body electrode 1231 is arranged on the side of the second body electrode 1231 of the second color sub-pixel 120 close to the reset control signal line of the next row. A third connection electrode 1332 connected to the third body electrode 1331 is arranged on the side of the third body electrode 1331 of the third color sub-pixel 130 close to the reset control signal line of the next row.

As shown in FIG. 12*b*, for the above-mentioned pixel layout structure, when the first electrode 2 is provided, there are multiple layout modes for the first electrode 2. For example, the first electrode 2 can be arranged between the corresponding anode patterns of the adjacent sub-pixels, but not limited to this.

The embodiments of the present disclosure also provide a display device, which includes the display substrate provided in the above-mentioned embodiments.

In the display substrate provided by the above embodiment, the second electrode 3 is provided in the non-display area, the first electrode 2 with a mesh structure is provided in the pixel spacing area in the display area, and the first electrode 2 and the second electrode 3 are electrically connected, so that when the first electrode 2 and the second electrode 3 are used together as the VSS in the display substrate, the resistance of the VSS can be greatly reduced, and the voltage drop of the VSS can be reduced, thereby reducing the voltage difference between the VSS and the power signal line VDD in the display substrate, and reducing the power consumption of the display substrate. It is worth noting that according to the IR-Drop simulation results, the VSS voltage drop can be reduced by about 0.5V. Moreover, since the current on the VSS can be dispersed on the first electrode 2 and the second electrode 3, the local heating phenomenon caused by the large current on the VSS is well improved. At the same time, in the display substrate provided by the embodiment of the present disclosure, when the first electrode 2 and the second electrode 3 are used together as VSS, the width of the second electrode 3 located in the non-display area can be appropriately reduced, the width of the positive power signal line VDD included in the display substrate can be appropriately increased, so that the local heating phenomenon caused by the large current on VDD can be effectively improved. In addition, since the first electrode 2 is disposed in the pixel spacing area, and the orthographic projection of the first electrode 2 on the substrate of the display substrate does not overlap the orthographic projection of the pixel opening area on the substrate, the first electrode 2 will not affect the pixel aperture ratio of the display substrate.

Therefore, when the display device provided by the embodiment of the present disclosure includes the above-mentioned display substrate, it also has the above-mentioned beneficial effects, which will not be repeated here.

It should be noted that the display device may be any product or component with a display function, such as a TV, a monitor, a digital photo frame, a mobile phone, a tablet computer, and so on.

The embodiments of the present disclosure also provide a method for manufacturing a display substrate. The display substrate includes a display area and a non-display area located at the periphery of the display area. The display area includes a plurality of pixel opening areas and a pixel spacing area located at the periphery of the pixel opening area; the method includes: forming a first electrode 2 with a mesh structure, at least a part of the first electrode 2 is located in the pixel spacing area, an orthographic projection of the first electrode on a substrate of the display substrate does not overlap the orthographic projection of the pixel opening area on the substrate; forming a second electrode 3 electrically connected to the first electrode 2, and the second electrode 3 is located in the non-display area.

In the display substrate manufactured by the method provided by the above embodiment, the second electrode 3 is provided in the non-display area, the first electrode 2 with a mesh structure is provided in the pixel spacing area in the display area, and the first electrode 2 and the second electrode 3 are electrically connected, so that when the first electrode 2 and the second electrode 3 are used together as the VSS in the display substrate, the resistance of the VSS can be greatly reduced, and the voltage drop of the VSS can be reduced, thereby reducing the voltage difference between the VSS and the power signal line VDD in the display substrate, and reducing the power consumption of the display substrate. It is worth noting that according to the IR-Drop simulation results, the VSS voltage drop can be reduced by about 0.5V. Moreover, since the current on the VSS can be dispersed on the first electrode 2 and the second electrode 3, the local heating phenomenon caused by the large current on the VSS is well improved. At the same time, in the display substrate manufactured by the method provided by the embodiment of the present disclosure, when the first electrode 2 and the second electrode 3 are used together as VSS, the width of the second electrode 3 located in the non-display area can be appropriately reduced, the width of the positive power signal line VDD included in the display substrate can be appropriately increased, so that the local heating phenomenon caused by the large current on VDD can be effectively improved. In addition, since the first electrode 2 is disposed in the pixel spacing area, and the orthographic projection of the first electrode 2 on the substrate of the display substrate does not overlap the orthographic projection of the pixel opening area on the substrate, the first electrode 2 will not affect the pixel aperture ratio of the display substrate.

In some embodiments, the step of forming the first electrode 2 specifically includes: forming the first electrode 2 and the anode pattern 4 in the display substrate at the same time through a same patterning process, the first electrode 2 is insulated from the anode pattern, and the anode patterns correspond to the plurality of pixel opening areas in a one-to-one manner, the orthographic projection of the pixel opening area on the substrate is located inside the orthographic projection of a corresponding anode pattern on the substrate.

Specifically, a conductive material film may be formed first by using a conductive material, and then a photoresist may be formed on the conductive material film, and then through a series of processes such as exposure, development, and etching, the first electrode 2 and the anode pattern 4 in the display substrate may be simultaneously formed.

As mentioned above, the first electrode 2 and the anode pattern 4 can be formed simultaneously in the same patterning process, which greatly simplifies the manufacturing process of the display substrate and saves the manufacturing cost.

As shown in FIG. 7, in some embodiments, the steps of forming the first electrode 2 and the second electrode 3 specifically include: forming a first conductive pattern 31 of the second electrode 3 in the non-display area; the first conductive pattern 31 includes: an annular portion 310 surrounding the display area and having an opening, and the opening of the annular portion 310 has a first end and a second end; a first wire inlet portion 311 electrically connected to the first end; and a second wire inlet portion 312 electrically connected to the second end; forming a planarization layer 81 on a side of the first conductive pattern 31 away from the substrate of the display substrate, and patterning the planarization layer 81 to expose at least part of the annular portion 310; and forming a second conductive pattern 32 of the second electrode 3, the first electrode 2 and the anode pattern 4 in the display substrate simultaneously by a patterning process on the side of the planarization layer 81 away from the substrate. Wherein the second conductive pattern 32 is electrically connected to the annular portion 310 exposed by the planarization layer 81, and is directly electrically connected to the first electrode 2; the first electrode 2 is insulated from the anode pattern 4.

Specifically, the first conductive pattern 31 can be made of the source-drain metal layer, that is, arranged in the same layer and made of the same material as the first electrode and the second electrode of each transistor in the pixel driving circuit; the second conductive pattern 32 can be arranged in the same layer and made of the same material as the first electrode 2. Further, the second conductive pattern 32 can be arranged in the same layer and made of the same material as the first electrode 2 and the anode pattern 4.

With further reference to FIGS. 1b, 6 and 7, the specific shapes of the first conductive pattern 31 are various. Exemplarily, the first conductive pattern 31 includes the annular portion 310 (as shown in FIG. 6, having width of H2), the first wire inlet portion 311 and the second wire inlet portion 312, the annular portion 310 surrounds the display area, and the opening of the annular portion 310 faces the binding position of the driving chip in the display substrate. In some embodiments, the display area is approximately a rectangular area, and the opening of the annular portion 310 and the binding position of the driving chip in the display substrate are located on the same side of the display area, for example, a short side of the rectangular area. The first wire inlet portion 311 and the second wire inlet portion 312 may be electrically connected to the flexible circuit board for receiving signals provided by the flexible circuit board.

It is worth noting that the annular portion 310, the first wire inlet portion 311 and the second wire inlet portion 312 may be formed as an integral structure, but are not limited to this.

Continuing to refer to FIG. 1b, FIG. 6 and FIG. 7, the specific shapes of the second conductive pattern 32 are various. Illustratively, the second conductive pattern 32 has an annular shape (as shown in FIG. 6 with a width of H1). The second conductive pattern 32 may include two sub-patterns arranged oppositely, one of the sub-patterns is located on the left side of the display area, and the other sub-pattern is located on the right side of the display area. Alternatively, the second conductive pattern 32 may be U-shaped, that is, the second conductive pattern 32 includes parts located on the left, right, and lower sides of the display area.

It should be noted that the width H1 and the width H2 in FIG. 6 only exemplarily show the width of the annular portion 310 and the width of the second conductive pattern 32 on the display panel. In other embodiments, the annular portion 310 and the second conductive pattern 32 can be set to have the same width or different widths at different positions of the display panel, and the width refers to a width perpendicular to its extending direction. Exemplarily, a part of the annular portion 310 on the left side of the display panel and another part of the annular portion 310 on the right side of the display panel can be set to have the same width, and a part of the annular portion 310 on the upper side of the display panel and another part of the annular portion 310 on the lower side of the display panel can also be set to have the same width; the two conductive patterns 32 can also be arranged in the same way, which will not be repeated here.

Taking the shape of the second conductive pattern 32 being an annular shape as an example, the orthographic projection of the second conductive pattern 32 on the substrate and the orthographic projection of the annular portion 310 on the substrate have the first overlapping area. Exemplarily, the orthographic projection of the first overlapping area on the substrate is an annular shape with an opening, and the first overlapping area can be surrounded by an orthographic projection of a part of the annular portion 310 that does not overlap the second conductive pattern 32 on the substrate. When the first overlapping area is set to the above structure, the second conductive pattern 32 also includes a part that does not overlap the annular portion 310. A part of the orthographic projection of the part that does not overlap the annular portion 310 on the substrate is surrounded by the orthographic projection of the first overlapping area on the substrate, and another part of the orthographic projection of the part that does not overlap the annular portion 310 on the substrate is located at the opening of the orthographic projection of the first overlapping area on the substrate.

In the first overlapping area, the specific electrical connections between the second conductive pattern 32 and the annular portion 310 are various. Exemplarily, by forming a first via hole on the first overlapping area, the second conductive pattern 32 is electrically connected to the annular portion 310 through the first via hole. There are various specific structures of the first via hole. For example, the orthographic projection of the first via hole on the substrate may be in an annular shape with an opening, and the opening of the annular shape overlaps the opening of the annular portion 310. The extension direction of the other parts of the annular shape is substantially the same as the extension direction of the annular portion 310. FIG. 6 shows a part of the first via hole in an annular shape located at the upper left corner of the display panel, and X1 represents the width of the part perpendicular to its own extension direction. It should be noted that the width of the first via hole in the annular shape in the direction perpendicular to its own extension can be set according to actual needs, and the width can be the same or different in different parts of the first via hole in an annular shape.

Alternatively, the first via hole may also be configured to include a plurality of sub-via holes independent of each other, and the specific distribution modes of the plurality of sub-via holes are various. Exemplarily, the plurality of sub-via holes are evenly distributed in the first overlapping area; or the plurality of sub-via holes are sequentially spaced apart along the extension direction of the first overlapping area; or the plurality of sub-via holes is divided into a plurality of groups of sub-via holes, and the plurality of groups of sub-via holes are correspondingly distributed at different positions of the first overlapping area.

It is worth noting that the size of the plurality of sub-via holes can be set according to actual needs, as long as the orthographic projections of the plurality of sub-via holes on the substrate are located in the first overlapping area.

It should be noted that, as shown in FIGS. 6 and 7, the annular portion 310 and the second conductive pattern 32 are arranged in different layers, and an insulating layer is arranged between the annular portion 310 and the second conductive pattern 32. Exemplarily, the insulating layer includes a planarization layer 81, and the first via hole X1 is formed on the planarization layer 81 and penetrates the planarization layer 81.

The connection modes of the first electrode 2 and the second conductive pattern 32 are various. Exemplarily, the first electrode 2 and the annular-shaped second conductive pattern 32 are connected in multiple directions, as shown in FIG. 1b, FIG. 6 and FIG. 7, and the first electrode 2 includes X4 part in the non-display area shown in FIGS. 6 and 7, the X4 part can be connected to the annular-shaped second conductive pattern 32 in four directions: up, down, left, and right.

It should be noted that the direct electrical connection between the first electrode 2 and the second conductive pattern 32 includes: the first electrode 2 and the second conductive pattern 32 are an integral structure; or the first electrode 2 is extended from the display area to the non-display area, and continue to extend away from the display area to form a annular-shaped second conductive pattern 32; or a annular-shaped second conductive pattern 32 is formed by end points of the mesh structure connecting the first electrode 2 away from inside the display area.

In the display device provided by the above embodiment, the second electrode 3 includes the first conductive pattern 31 and the second conductive pattern 32, and the second conductive pattern 32 and the first electrode 2 are arranged in the same layer and made of the same material, the following technical effects can be achieved.

The second conductive pattern 32 can be formed in the same patterning process as the first electrode 2, and the first electrode 2 is directly electrically connected to the second conductive pattern 32 at the junction of the first electrode 2 and the second conductive pattern 32, and no additional via hole design is required, that is, no crossover-to-transfer layer is required.

It is compatible with the conventional 4-layer metal process (that is, the single-layer source-drain metal layer process) without adding additional conductive film layers and patterning processes. It should be noted that, as shown in FIG. 8, the manufacturing process of the display substrate may include: in a direction away from the substrate, on the substrate (which may include a first polyimide layer, a first barrier layer, and a second polyimide layer, and a second barrier layer that are stacked in sequencer) a buffer layer Buffer, a barrier layer Barrier, an active layer Active, a first insulating layer GI1, a first gate metal layer Gate1, a second insulating layer GI2, a second gate metal layer Gate2, a third insulating layer ILD, a source-drain metal layer SD, a planarization layer 81 (PLN), an anode layer Anode, a pixel defining layer 80 (PDL) and a spacer 82 (PS) layer are sequentially formed, among which the first gate metal layer Gate1, the second gate metal layer Gate2, the source-drain metal layer SD and the anode layer Anode are all conductive layers made of at least one of metal, alloy or metal oxide, namely 4-step patterning process.

As shown in FIGS. 1b and 1c, the first electrode 2 is electrically connected to the annular-shaped second conductive pattern 32 from a plurality of directions, so that the current on the second electrode 3 no longer solely flows from the fixed position of the display substrate PNL, such as the corner 33 of the display substrate, into the chip of the display substrate, but is dispersed into the mesh-shaped first electrode 2, the annular-shaped second conductive pattern 32 and the first conductive pattern 31. Therefore, the problem of local heating generated at the corner 33 of the display substrate is well improved. In addition, when the first electrode 2 and the second electrode 3 are applied to VSS signal transmission, the current on the VSS trace in the peripheral area is reduced, and the heating problem due to the excessive current on the VSS trace near the chip is improved.

In some embodiments, the manufacturing method further includes: forming a pixel defining layer 80 on the side of the anode pattern 4 away from the substrate of the display substrate. The pixel defining layer 80 includes a third via hole, a plurality of first openings 86 and a plurality of second via holes 84, The first opening 86 corresponds to the anode pattern 4 in a one-to-one manner, the first opening 86 can expose at least part of the corresponding anode pattern 4, and the second via hole 84 can expose a part of the first electrode 2, the third via hole can expose a part of the second conductive pattern 32 in the second electrode 3; forming a sacrificial pattern 9 on a surface of the exposed first electrode 2 away from the substrate; forming an organic light-emitting material layer 83. The organic light-emitting material layer 83 includes a fourth part and a fifth part. The fourth part at least covers the anode pattern 4 and the pixel isolation structure in the pixel defining layer 80. The fifth part covers the sacrificial pattern 9, and the fourth part and the fifth part are independent of each other; removing the sacrificial pattern 9 and the fifth part of the organic light-emitting material layer 83 to expose a part of the first electrode 2; and forming a third electrode 5 on the side of the organic light-emitting material layer 83 away from the substrate, and the third electrode 5 is respectively coupled to the exposed second conductive pattern 32 and the part of the first electrode 2.

Specifically, the second via hole 84 penetrates the pixel defining layer 80 located in the pixel spacing area, or the pixel defining layer 80 and the organic light-emitting material layer 83. The third via hole penetrates the pixel defining layer 80 located in the non-display area. The specific positions, number and size of the second via hole 84 and the third via hole can be set according to actual needs, for example, according to the structure of the pixel defining layer, the spatial layout of the first electrode, contact resistance, aperture ratio and other factors.

The lift-off process can be used to fabricate the second via hole 84, and the specific process steps are as follows.

As shown in FIGS. 11a to 11e, after the driving circuit layer 85 is formed on the substrate, the anode pattern 4 and the first electrode 2 are formed on the side of the driving circuit layer away from the substrate, and then the pixel defining layer 80 and the spacer 82 are formed.

It should be noted that the driving circuit layer 85 refers to a structure shown in FIG. 3, and it may include an active layer, a gate insulating layer, a gate metal layer, an interlayer insulating layer, a source-drain metal layer, and other structures.

The pixel defining layer 80 is generally a mesh structure, in which a plurality of first openings 86 and a pixel isolation structure (located in the pixel spacing area) surrounding the plurality of first openings 86 are formed, and a plurality of second via holes 84 and a plurality of third via holes (via X3 in FIG. 6) are formed in the pixel isolation structure. Inside the display area, the first opening 86 corresponds to the anode pattern 4 in the one-to-one manner, the pixel isolation structure covers the edge of the anode pattern 4, and the first opening 86 can expose at least a part of the corresponding anode pattern 4. The first electrode 2 can be arranged in the same layer and made of the same material as the anode pattern 4. The first electrode 2 is located on the side of the pixel isolation structure close to the substrate. For example, the pixel isolation structure covers the first electrode 2 and the second via hole 84 in the pixel isolation structure can expose a part of the first electrode 2. Similarly, the second conductive pattern 32 can be arranged in the same layer and the same material as the anode pattern 4. For example, the second conductive pattern 32 is located on the side of the pixel isolation structure close to the substrate, and the third via hole can expose a part of the second conductive pattern 32 in the second electrode 3.

It is also worth noting that the spacer 82 and the pixel defining layer 80 can be formed at the same time in a patterning process, for example, a half tone mask process.

A sacrificial material layer is deposited on the substrate on which the spacer 82 is formed, a photoresist is formed on the surface of the sacrificial material layer away from the substrate, and the sacrificial pattern 9 in the second via hole 84 is formed through processes such as exposure, development, and etching. In more detail, the process flow of forming the sacrificial layer 9 is as follows: an organic material is used to form a sacrificial material layer, a negative photoresist layer is formed on the side of the sacrificial material layer away from the substrate, and the negative photoresist layer is exposed by using a mask to form a negative photoresist reserve area and a negative photoresist remove area. The negative photoresist reserve area corresponds to the area where the sacrificial pattern 9 is located, and the negative photoresist remove area corresponds to areas other than the area where the sacrificial pattern 9 is located. The negative photoresist in the negative photoresist remove area is removed, and the reserved negative photoresist layer is used as a mask to wet-etch the sacrificial material layer to form the sacrificial pattern 9 with an inverted trapezoidal cross-section.

It should be noted that the film layer (the first electrode 2) immediately below the sacrificial pattern 9 should be as flat as possible, which is more conducive to the peeling off process.

In addition, the specific formation position of the sacrificial pattern 9 is related to the contact position between the first electrode 1 and the third electrode 5, that is, the specific formation position of the sacrificial pattern 9 is related to the position where the second via hole 84 is formed. When the second via hole 84 is located in the pixel spacing area, the sacrificial pattern 9 is located in the pixel spacing area, and when the second via hole 84 is located in the non-display area, the sacrifice pattern 9 is located in the non-display area.

The evaporation continues to form an organic light-emitting material layer 83. The organic light-emitting material layer 83 may cover the part of the anode pattern 4 exposed by the first opening 86, or cover the second via hole 84 and the spacer 82. The organic light-emitting material layer 83 also includes a fourth part and a fifth part, the fourth part covers the pixel isolation structure and a part of the first electrode 2 exposed by the second via hole 84, and the fifth part covers the sacrificial pattern 9 in the second via hole 84, the fourth part and the fifth part are disconnected at the edge of the sacrificial pattern 9 in the second via hole 84, so that the fourth part and the fifth part are independent of each other.

It is worth noting that the organic light-emitting material layer 83 of the above structure can emit white light, and in this case, as shown in FIG. 11c and FIG. 5, a color resistance pattern (such as a red color resistance pattern R, a green color resistance pattern G, a blue color resistance pattern B, etc.) is formed in the position corresponding the first opening. Moreover, when the white organic light emitting material layer 83 is formed, the white organic light emitting material layer 83 may be formed on both the upper and lower layers of the color resistance pattern. In addition, it is also possible to form a colored organic light-emitting material layer only in the first opening 86, for example, a red organic light-emitting material layer is formed in some of the first openings, a green organic light-emitting material layer is formed in some first openings, and a blue organic light-emitting material layer is formed in other first openings.

Then, the substrate on which the organic light-emitting material layer 83 is formed is immersed in a peeling solution, and then taken out after standing for 0.5 min-2 min, and then the substrate is appropriately tilted to facilitate the sacrificial pattern 9 to fall off. At the same time as the sacrificial pattern layer falls off, the photoresist on the sacrificial surface and the fifth part of the organic light-emitting material layer 83 are simultaneously taken away. It should be noted that the peeling solution can be a fluoroether solvent that can dissolve the material of the sacrificial layer and does not damage the organic light-emitting material layer 83.

Then, the third electrode 5 is continuously evaporated, and the first part of the third electrode 5 covers the plurality of pixel opening areas (i.e., the first opening 86). The second part of the third electrode 5 is located in the pixel spacing area and can be electrically connected to the first electrode 2 through the second via hole 84, and the third part of the third electrode 5 is coupled to the second conductive pattern 32 of the second electrode 3 through the third via hole.

In the display substrate provided by the above embodiment, based on the lift-off process, it is proposed to use the first electrode 2 as an auxiliary cathode. Since the first electrode 2 and the anode pattern 4 are formed in the same layer, the first electrode 2 is the metal film layer closest to the cathode. In the process, the interconnection between the first electrode 2 and the cathode is not difficult.

In the display substrate provided by the foregoing embodiment, the gap between the anode patterns 4 is used or the position of the anode pattern 4 is appropriately adjusted, so as to realize the rational layout of the first electrode 2 and the cathode in the upper layer is connected, which is equivalent to introduce an auxiliary electrode layer connected in parallel with the cathode, thereby effectively reducing the resistance of the cathode, and improving the IR Drop problem of the cathode.

Moreover, when the first electrode 2 and the second electrode 3 are both used as VSS and are both connected to the third electrode 5 (cathode), since the second electrode 3 has the first conductive pattern and the second conductive pattern arranged in different layers, the current path of VSS is changed from two-dimensional distribution to three-dimensional distribution, that is, the VSS current can not only converge from the cathode to the periphery to the second electrode 3, and then flow into the chip, but also can converge to the chip through the first electrode 2, that is, the cathode current in the display area has two layers of current paths.

In addition, it is worth noting that when the orthographic projection of the third part of the third electrode 5 on the substrate and the orthographic projection of the second electrode 3 on the substrate have a third overlapping area, the third part of the third electrode 5 is electrically connected to the second conductive pattern 32 of the second electrode 3 through the third via hole provided in the third overlapping area, the third electrode 5 is not lapped on the second conductive pattern 32 in the display area. This method is fully compatible with the manufacturing process in the related art, and no additional process is required.

Figure 14A:
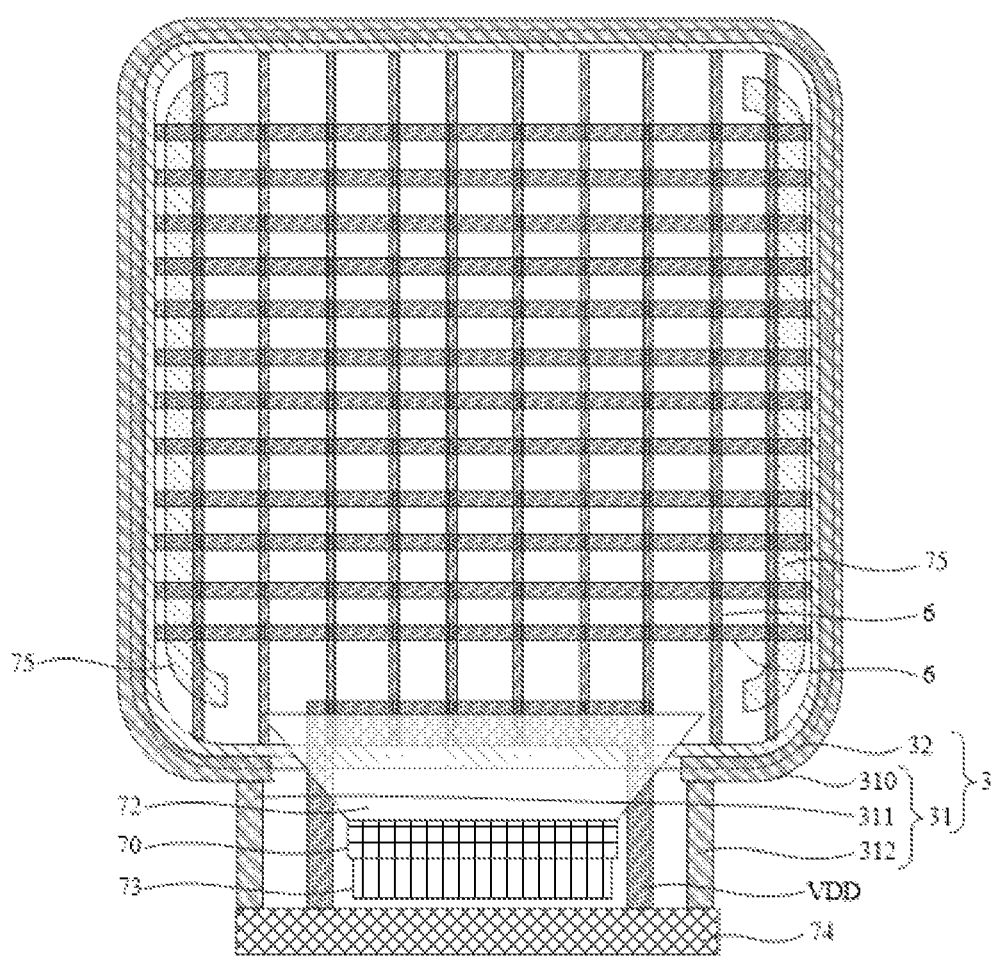
FIG. 14a is a schematic diagram of a second basic structure of a display substrate provided by an embodiment of the present disclosure.
Figure 14B:
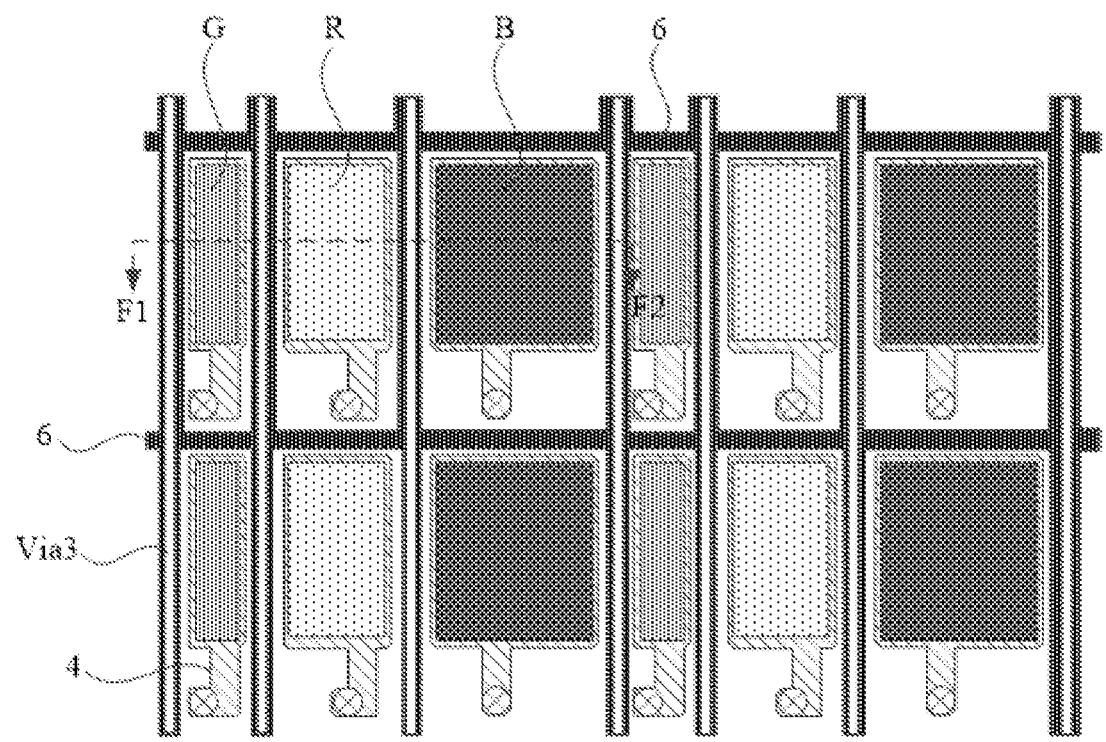
FIG. 14b is a schematic view showing the fifth structure in the display area in the display substrate provided by an embodiment of the present disclosure.
Figure 14C:
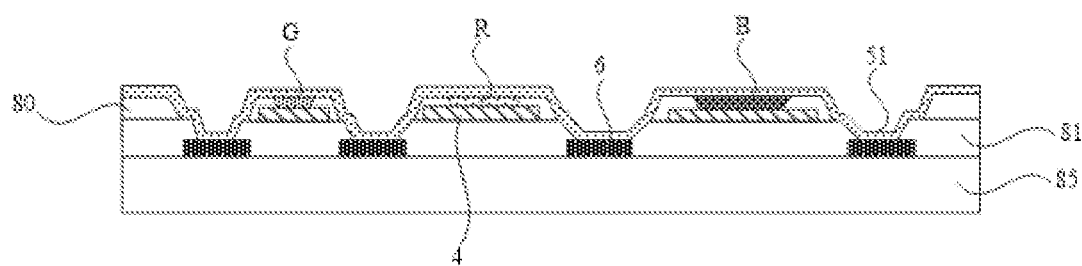
FIG. 14c is a cross-sectional view along the direction of F1F2 in FIG. 14b.

Referring to FIGS. 14a, 14b, and 14c, an embodiment of the present disclosure provides a display substrate, including: a substrate, an auxiliary cathode layer 6, a first insulating layer, an anode layer, a second insulating layer, and a cathode layer 51 that are sequentially stacked on the substrate in a direction away from the substrate; wherein the anode layer includes a plurality of anode patterns 4 spaced apart from each other, and an anode spacing area is formed between adjacent anode patterns 4. The orthographic projection of the auxiliary cathode layer 6 on the substrate and the orthographic projection of the cathode layer 51 on the substrate have an auxiliary overlapping area, and the auxiliary cathode layer 6 is electrically connected to the cathode layer 51 through the connection via hole Via3 in the auxiliary overlapping area. The orthographic projection of the connection via hole Via3 on the substrate is located inside the orthographic projection of the anode spacing area on the substrate.

Specifically, the anode layer and the cathode layer 51 in the display substrate are at least partially laminated, and an organic light-emitting material layer is arranged between the anode layer and the cathode layer 51. At this time, the second insulating layer is an organic light-emitting material layer. When the display substrate is working, a voltage is applied to the anode layer and the cathode layer 51 to drive the organic light-emitting material layer to emit light. The non-display area of the display substrate is also provided with a VSS wire, which is electrically connected to the cathode layer 51 and used to provide the cathode layer 51 with a first voltage signal, such as a negative voltage signal.

The first insulating layer, such as an insulating layer, is provided between the auxiliary cathode layer 6 and the anode layer. For example, the insulating layer may include a planarization layer 81.

The orthographic projection of the auxiliary cathode layer 6 on the substrate and the orthographic projection of the cathode layer 51 on the substrate have an auxiliary overlapping area, and the auxiliary cathode layer 6 and the cathode layer 51 are electrically connected through a connection via hole Via3, and the connection via hole Via3 penetrates the film layer between the auxiliary cathode layer 6 and the cathode layer 51, and the orthographic projection of the connection via hole Via3 on the substrate is located in the auxiliary overlapping area. Further, the orthographic projection of the connection via hole Via3 on the substrate can be set to be located inside the orthographic projection of the anode spacing area on the substrate, so that the orthographic projection of the connection via hole Via3 on the substrate does not overlap the orthographic projection of the anode pattern 4 on the substrate, which prevents the cathode layer 51 from being short-circuited with the anode pattern 4 when the cathode layer 51 is electrically connected to the auxiliary cathode layer 6 through the connection via hole Via3.

According to the specific structure of the above display substrate, in the display substrate provided by the embodiment of the present disclosure, by arranging the auxiliary cathode layer 6 in parallel with the cathode layer 51, the resistance of the cathode layer 51 is well reduced, and at the same time, since the cathode layer 51 is electrically connected to the VSS in the display substrate, the resistance of the VSS is greatly reduced, and the voltage drop of the VSS is reduced, thereby reducing the voltage difference between the VSS and the power signal line VDD in the display substrate, which better reduces the power consumption of the display screen when the display substrate is applied to the display screen. It is worth noting that according to the IR-Drop simulation results, the VSS voltage drop can be reduced by 30% to 50% of the original voltage drop.

It should be noted that although VDD and the auxiliary cathode layer 6 are overlapped in FIG. 14a, since VDD can be made of a first source-drain metal layer, the auxiliary cathode layer 6 can be made of a second source-drain metal layer, so that VDD and the auxiliary cathode layer 6 is arranged in different layers to avoid short circuit therebetween.

In some embodiments, the display substrate further includes a driving circuit layer located between the substrate and the anode layer, the driving circuit layer includes a second source-drain metal layer, and the auxiliary cathode layer and the second source-drain metal layer are arranged in the same layer and made of the same material.

By arranging the auxiliary cathode layer 6 and the second source-drain metal layer in the same layer and made of the same material, the auxiliary cathode layer 6 and the second source-drain metal layer can be formed simultaneously in the same patterning process, thereby greatly simplifying the production process of the display substrate and saving the production cost. In addition, the auxiliary cathode layer 6 and the second source-drain metal layer are arranged in the same layer, so that the positive power supply signal line (VDD) in the display substrate has a larger layout space, the positive power signal line with larger area may be laid out to reduce the voltage drop generated on the positive power signal line.

As shown in FIGS. 14b and 14c, in some embodiments, the auxiliary cathode layer 6 is formed in a mesh structure, and the orthographic projection of the auxiliary cathode layer 6 on the substrate is located inside the orthographic projection of the anode spacing area on the substrate.

Specifically, the specific structure of the auxiliary cathode layer 6 is various. For example, the auxiliary cathode layer 6 is arranged to form a plurality of lateral wiring structures, a plurality of longitudinal wiring structures or a mesh structure. When the auxiliary cathode layer 6 is arranged as a mesh structure, the specific layout position and extension direction of the body portion included in the mesh structure are more flexible. Therefore, the auxiliary cathode layer 6 of this structure is more conducive to avoiding the short circuit between the auxiliary cathode and other conductive patterns arranged on the same layer. Moreover, when the auxiliary cathode layer 6 is arranged in a mesh structure, the auxiliary cathode layer 6 has a larger layout space, which is more conducive to reduce the layout difficulty of the auxiliary cathode.

The orthographic projection of the auxiliary cathode layer 6 on the substrate is located inside the orthographic projection of the anode spacing area on the substrate, so that the orthographic projection of the auxiliary cathode layer 6 on the substrate does not overlap the orthographic projection of the anode pattern 4 on the substrate, so that the step formed by the auxiliary cathode layer 6 will not affect the anode pattern 4, which ensures the flatness of the anode pattern 4 and improves color separation phenomenon of the display substrate during display.

It is worth noting that when the auxiliary cathode layer 6 is actually laid out, in addition to the above-mentioned layout, the orthographic projection of the auxiliary cathode layer 6 on the substrate and the orthographic projection of the anode pattern 4 on the substrate have a small overlapping area. Exemplarily, the area of the small overlapping area is less than 10% of the area of the anode pattern 4; or an overlapping area formed between an anode pattern 4 and the auxiliary cathode layer 6 can be located on two opposite sides of the anode pattern 4, and can be formed into a symmetrical structure.

Continuing to refer to FIG. 14b, in some embodiments, the auxiliary overlapping area includes a strip area extending in a first direction, and the orthographic projection of the connection via hole Via3 on the substrate is a strip pattern extending in the first direction.

Specifically, the larger the area of the auxiliary cathode layer 6 that can be exposed by the connection via holes Via3 is, the larger the contact area between the cathode layer 51 and the auxiliary cathode layer 6 is, and the smaller the contact resistance is, and the smaller the resistance of the cathode layer 51 is.

The specific structures of the connection via holes Via3 are various. For example, the orthographic projection of the connection via holes Via3 on the substrate is a stripe pattern extending in the first direction; the connection via holes Via3 of this structure can expose more of the auxiliary cathode layer 6, so that there is a larger contact area between the cathode layer 51 and the auxiliary cathode layer 6, thereby minimizing the resistance of the cathode layer 51.

It should be noted that, the first direction may optionally be the same as the extension direction of the data line in the display substrate, but it is not limited to this.

Figure 15:
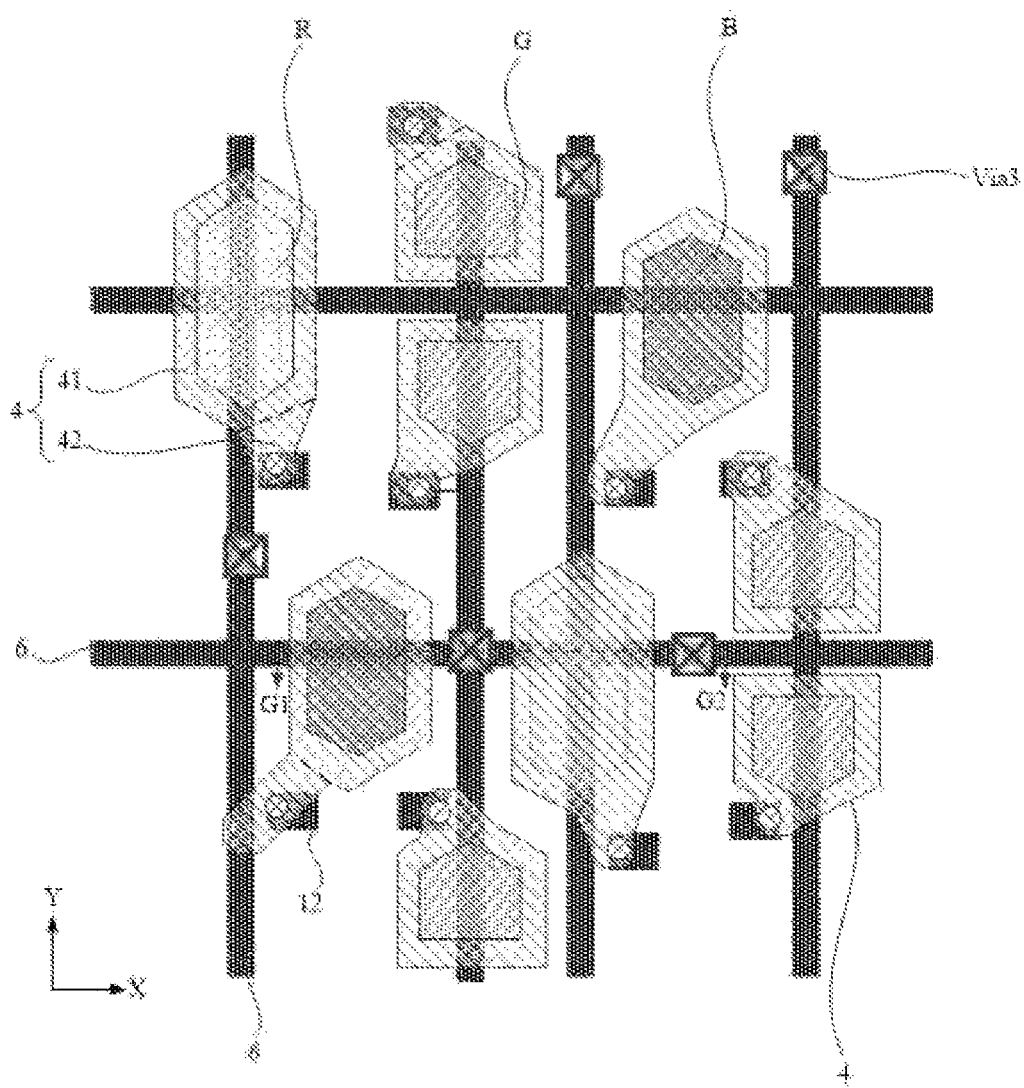
FIG. 15 is a schematic diagram showing a sixth structure in the display area in the display substrate provided by an embodiment of the present disclosure.
Figure 16:
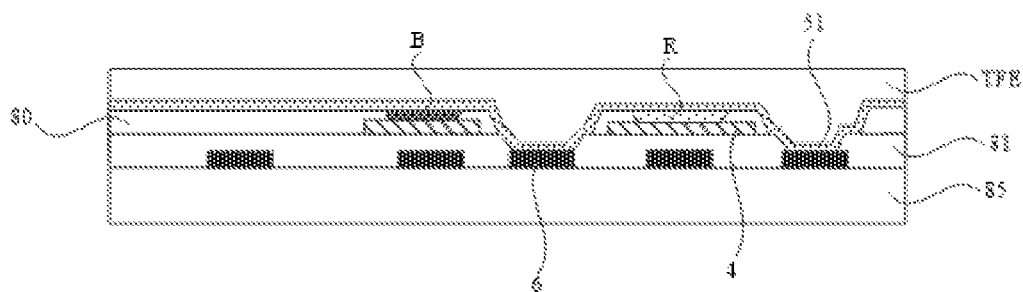
FIG. 16 is a cross-sectional view along the direction of G1G2 in FIG. 15.

As shown in FIGS. 15 and 16, in some embodiments, the auxiliary cathode layer 6 is formed in a mesh structure, and the orthographic projection of the first part of the auxiliary cathode layer 6 on the substrate is located inside of the orthographic projection of the anode spacing area on the substrate, the orthographic projection of the second part of the auxiliary cathode layer 6 on the substrate is located inside the orthographic projection of the anode pattern 4 on the substrate.

Specifically, in some cases, the auxiliary cathode layer 6 includes a first part located in the anode spacing area, the auxiliary cathode layer 6 further includes a second part, and the second part of the auxiliary cathode layer 6 is located inside the orthographic projection of the anode pattern 4 on the substrate, so that the auxiliary cathode layer 6 has a larger layout space and can achieve a larger area, thereby better reducing the resistance of the cathode layer 51.

Further, the anode pattern 4 includes a body portion 41 and a connection portion 42 of an integral structure, the body portion 41 has at least one symmetry axis, and the orthographic projection of the target portion in the second part of the auxiliary cathode layer 6 on the substrate is axially symmetrical along at least one symmetry axis and the orthographic projection of the target portion on the substrate is located inside the orthographic projection of the body portion 41 on the substrate.

Specifically, the anode pattern 4 may include a body portion 41 and a connection portion 42 of an integral structure, wherein the body portion 41 corresponds to the pixel opening area in the display substrate in a one-to-one manner, and the orthographic projection of the pixel opening area on the substrate is located inside the orthographic projection of the corresponding body portion 41 on the substrate; the connection portion 42 is electrically connected to the pixel driving circuit in the display substrate for providing driving signals for the anode pattern 4, so as to transmit the received driving signal to the body portion 41.

When the orthographic projection of the second part of the auxiliary cathode layer 6 on the substrate is located inside the orthographic projection of the anode pattern 4 on the substrate, the specific positions of the second part are various. Exemplarily, the orthographic projection of the target portion in the second part of the auxiliary cathode layer 6 on the substrate is axially symmetrical along at least one symmetry axis of the corresponding body portion, and the orthographic projection of the target portion on the substrate is located inside the orthographic projection of the body portion on the substrate. This arrangement makes the ratio of the area of the target portion located on both sides of at least one symmetry axis to be approximately 1. Due to the limitation of process conditions, the above ratio cannot be absolutely 1, so the above conditions may be approximately satisfied.

Exemplarily, as shown in FIG. 15, taking the body portion 41 in one sub-pixel as an example, the body portion 41 may have a first symmetry axis extending in a first direction (such as the Y direction), and the target portion overlapping the orthographic projection of the body portion 41 on the substrate may be arranged substantially axis-symmetrically along the first symmetry axis. And/or, the body portion 41 may have a second symmetry axis extending in a second direction (such as the X direction), and the target portion that overlaps the orthographic projection of the body portion 41 on the substrate may be substantially axis-symmetrically along the second symmetry axis. In this way, at least the central area of the body portion 41 (the opening area pointed to by RGB in FIG. 15) can be convex, and the areas of the body portion 41 on both sides of the first symmetry axis are symmetrically arranged and/or the areas of the body portion 41 on both sides of the second symmetry axis are symmetrically arranged, so that the asymmetry of the body portion 41 can be reduced. Therefore, the asymmetry of light emission in the effective light-emitting area can be improved or even eliminated, so that the color shift phenomenon of the display panel can be improved or even eliminated.

Figure 17:
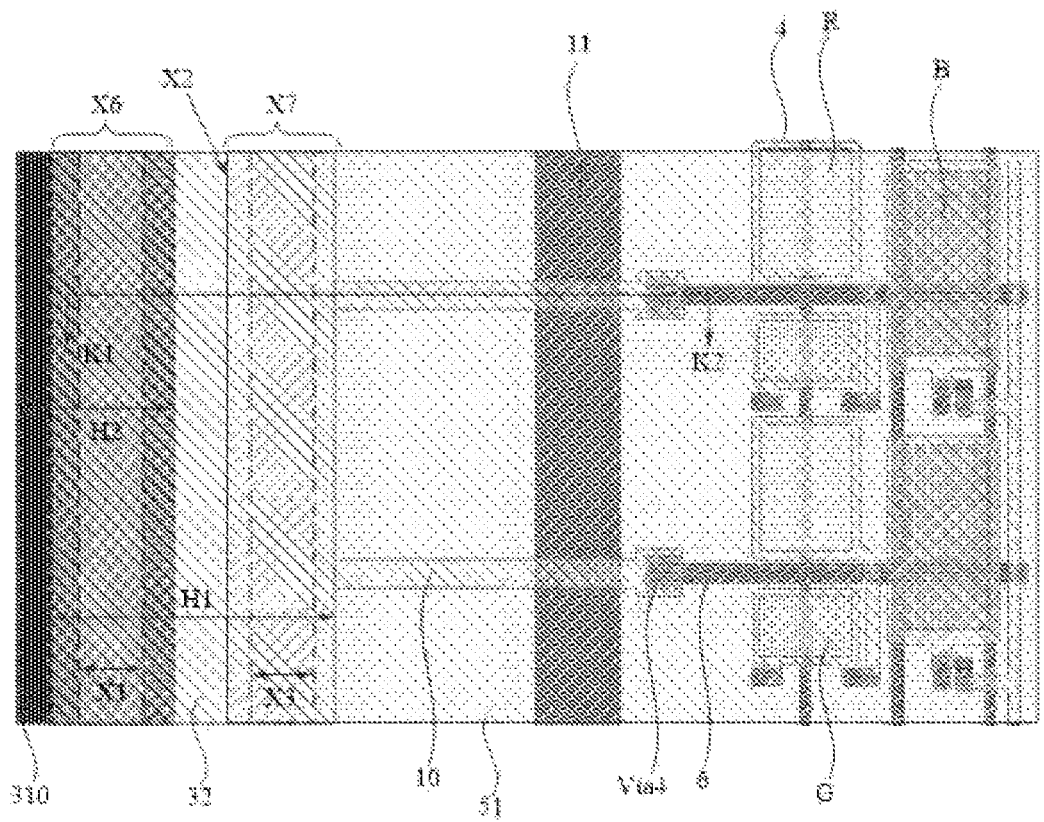
FIG. 17 is a schematic structural diagram showing a display area extending to a non-display area in the display substrate provided by an embodiment of the present disclosure.
Figure 18:
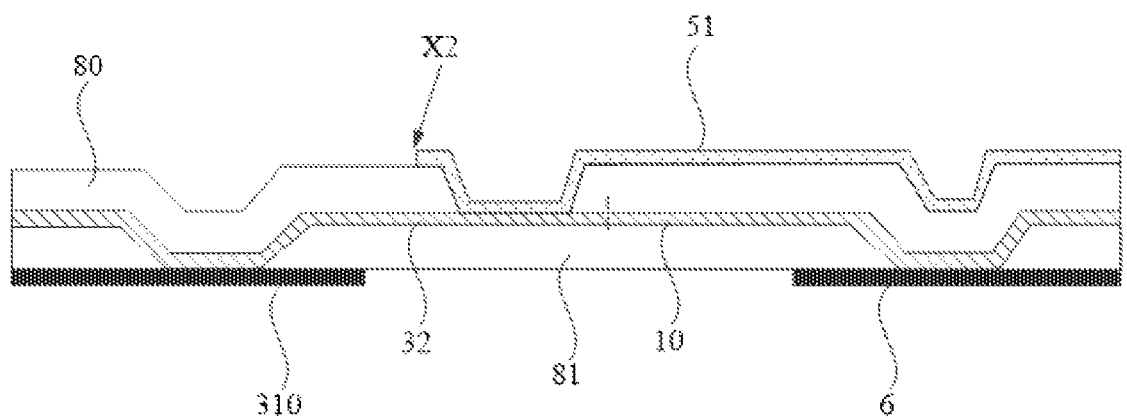
FIG. 18 is a schematic cross-sectional view along the direction of K1K2 in FIG. 17.

As shown in FIG. 14a, FIG. 17 and FIG. 18, in some embodiments, the display substrate further includes a second electrode 3 located in a non-display area of the display substrate, and the second electrode 3 is connected to the auxiliary cathode layer 6 and the cathode layer 51.

Specifically, the display substrate may further include a second electrode 3 located in a non-display area of the display substrate, and the second electrode 3 may extend along the frame of the display substrate. The second electrode 3 can be arranged to surround the display area of the display substrate, and can be electrically connected to the flexible circuit board in the display substrate.

The specific structure of the auxiliary cathode layer 6 is various. Illustratively, the auxiliary cathode layer 6 includes a portion distributed in the display area of the display substrate, and a portion distributed in the upper, lower, left, and right directions of the non-display area of display substrate. Alternatively, the auxiliary cathode layer 6 includes a portion distributed in the display area of the display substrate, and a portion distributed in the upper and lower directions in the non-display area of the display substrate. Alternatively, the auxiliary cathode layer 6 includes a portion distributed in the display area of the display substrate, and a portion distributed in the left and right directions in the non-display area of the display substrate.

When the auxiliary cathode layer 6 includes portions distributed in the upper, lower, left, and right directions in the non-display area of the display substrate, the second electrode 3 can be electrically connected to the portions of the auxiliary cathode layer 6 distributed in the upper, lower, left, and right directions in the non-display area of the display substrate Similarly, the second electrode 3 can also be electrically connected to the portions of the cathode layer 51 on the display substrate in the upper, lower, left, and right directions, but it is not limited to this. It should be noted that the mark X2 in FIG. 17 represents the boundary of the cathode layer 51 away from the display area. In addition, from left to right in FIG. 18 is the direction from the non-display area to the display area.

In the display substrate provided by the above embodiment, when the second electrode 3 is VSS, the resistance of the VSS can be greatly reduced, and the voltage drop of the VSS can be reduced, thereby reducing the voltage difference between the VSS and the power signal line VDD in the display substrate, and reducing the power consumption of the display substrate.

Since the current on the VSS can be dispersed on the auxiliary cathode layer 6 and the cathode layer 51, the local heating phenomenon caused by the large current on the VSS is well improved. At the same time, the width of the VSS can be appropriately reduced, and the width of the positive power supply signal line VDD included in the display substrate can be appropriately increased, thereby effectively improving the local heating phenomenon caused by the large current on the VDD.

It should be noted that the width of VSS and VDD in the direction perpendicular to their extension directions can be set between 100 μm and 900 μm. Optionally, the width of VSS and VDD in the direction perpendicular to their extension directions can be set between 200 μm and 300 μm; the width of parts of VSS and VDD in the corners and straight sides of the display substrate can be adjusted.

Please continue to refer to FIG. 14*a*. In some embodiments, the second electrode 3 includes a first conductive pattern 31 and a second conductive pattern 32 that are stacked, and the first conductive pattern 31 is located between the substrate of the display substrate and the second conductive patterns 32.

The first conductive pattern 31 includes: an annular portion 310 surrounding the display area and having an opening, and the opening of the annular portion 310 having a first end and a second end; a first wire inlet portion 311 electrically connected to the first end; and a second wire inlet portion 312 electrically connected to the second end; wherein the second conductive pattern 32 has an annular shape, and the orthographic projection of the second conductive pattern 32 on the substrate of the display substrate and the orthographic projection of the annular portion 310 on the substrate have a first overlapping area, the second conductive pattern 32 is electrically connected to the annular portion in the first overlapping area.

As shown in FIGS. 17 and 18, the display substrate further includes: a first conductive connection portion 10 arranged on the same layer and made of the material as the second conductive pattern 32, and the second conductive pattern 32 is coupled to the auxiliary cathode layer 6 through the first conductive connection portion 10.

The orthographic projection of the second conductive pattern 32 on the substrate and the orthographic projection of the cathode layer 51 on the substrate have a third overlapping area. The second conductive pattern 32 is electrically connected to the cathode layer 51 in the third overlapping area.

Specifically, the first conductive pattern 31 may be made of a first source-drain metal layer, that is, arranged in the same layer and made of the same material as the first electrode and the second electrode of each transistor in the pixel driving circuit. The second conductive pattern 32 can be arranged in the same layer and made of the same material as the anode pattern 4. In some embodiments, the first conductive pattern 31 can also be arranged in the same layer and made of the same material as the second source-drain metal layer.

It should be noted that the second conductive pattern 32 and the anode pattern 4 may both adopt a three-layer laminated structure of ITO, Ag, and ITO. When manufacturing the second conductive pattern 32 and the anode pattern 4 of this structure, three film layers of ITO, Ag, and ITO are formed by depositing, and then the three film layers are patterned to form the second conductive pattern 32 and the anode pattern 4.

With further reference to FIGS. 14*a*, 17 and 18, the specific shapes of the first conductive pattern 31 are various. Exemplarily, the first conductive pattern 31 includes the annular portion 310 (as shown in FIG. 17, having width of H2), the first wire inlet portion 311 and the second wire inlet portion 312, the annular portion 310 surrounds the display area, and the opening of the annular portion 310 faces the binding position of the driving chip in the display substrate. In some embodiments, the display area is approximately a rectangular area, and the opening of the annular portion 310 and the binding position of the driving chip in the display substrate are located on the same side of the display area, for example, a short side of the rectangular area. The first wire inlet portion 311 and the second wire inlet portion 312 may be electrically connected to the flexible circuit board for receiving signals provided by the flexible circuit board.

It is worth noting that the annular portion 310, the first wire inlet portion 311 and the second wire inlet portion 312 may be formed as an integral structure, but are not limited to this.

Continuing to refer to FIG. 14*a*, FIG. 17 and FIG. 18, the specific shapes of the second conductive pattern 32 are various. Illustratively, the second conductive pattern 32 has an annular shape (as shown in FIG. 17 with a width of H1). The second conductive pattern 32 may include two sub-patterns arranged oppositely, one of the sub-patterns is located on the left side of the display area, and the other sub-pattern is located on the right side of the display area. Alternatively, the second conductive pattern 32 may be U-shaped, that is, the second conductive pattern 32 includes parts located on the left, right, and lower sides of the display area.

It should be noted that the width H1 and the width H2 in FIG. 17 only exemplarily show the width of the annular portion 310 and the width of the second conductive pattern 32 on the display panel. In other embodiments, the annular portion 310 and the second conductive pattern 32 can be set to have the same width or different widths at different positions of the display panel, and the width refers to a width perpendicular to its extending direction. Exemplarily, a part of the annular portion 310 on the left side of the display panel and another part of the annular portion 310 on the right side of the display panel can be set to have the same width, and a part of the annular portion 310 on the upper side of the display panel and another part of the annular portion 310 on the lower side of the display panel can also be set to have the same width; the two conductive patterns 32 can also be arranged in the same way, which will not be repeated here.

Taking the shape of the second conductive pattern 32 being an annular shape as an example, the orthographic projection of the second conductive pattern 32 on the substrate and the orthographic projection of the annular portion 310 on the substrate have the first overlapping area (X6 in FIG. 17). Exemplarily, the orthographic projection of the first overlapping area on the substrate is an annular shape with an opening, and the first overlapping area can be surrounded by an orthographic projection of a part of the annular portion 310 that does not overlap the second conductive pattern 32 on the substrate. When the first overlapping area is set to the above structure, the second conductive pattern 32 also includes a part that does not overlap the annular portion 310. A part of the orthographic projection of the part that does not overlap the annular portion 310 on the substrate is surrounded by the orthographic projection of the first overlapping area on the substrate, and another part of the orthographic projection of the part that does not overlap the annular portion 310 on the substrate is located at the opening of the orthographic projection of the first overlapping area on the substrate.

In the first overlapping area, the specific electrical connections between the second conductive pattern 32 and the annular portion 310 are various. Exemplarily, by forming a first via hole on the first overlapping area, the second conductive pattern 32 is electrically connected to the annular portion 310 through the first via hole. There are various specific structures of the first via hole. For example, the orthographic projection of the first via hole on the substrate may be in an annular shape with an opening, and the opening of the annular shape overlaps the opening of the annular portion 310. The extension direction of the other parts of the annular shape is substantially the same as the extension direction of the annular portion 310. FIG. 17 shows a part of the first via hole in an annular shape located at the upper left corner of the display panel, and X1 represents the width of the part perpendicular to its own extension direction. It should be noted that the width of the first via hole in the annular shape in the direction perpendicular to its own extension can be set according to actual needs, and the width can be the same or different in different parts of the first via hole in an annular shape.

Alternatively, the first via hole may also be configured to include a plurality of sub-via holes independent of each other, and the specific distribution modes of the plurality of sub-via holes are various. Exemplarily, the plurality of sub-via holes are evenly distributed in the first overlapping area; or the plurality of sub-via holes are sequentially spaced apart along the extension direction of the first overlapping area; or the plurality of sub-via holes is divided into a plurality of groups of sub-via holes, and the plurality of groups of sub-via holes are correspondingly distributed at different positions of the first overlapping area.

It is worth noting that the size of the plurality of sub-via holes can be set according to actual needs, as long as the orthographic projections of the plurality of sub-via holes on the substrate are located in the first overlapping area.

It should be noted that, as shown in FIG. 18, the annular portion 310 and the second conductive pattern 32 are arranged in different layers, and an insulating layer is arranged between the annular portion 310 and the second conductive pattern 32. Exemplarily, the insulating layer includes a planarization layer 81, and the first via hole X1 is formed on the planarization layer 81 and penetrates the planarization layer 81. As shown in FIG. 18, the annular portion 310 can be arranged on the same layer and made of the same material as the auxiliary cathode layer 6, and can be arranged on the same layer and made of the same material as the second source-drain metal layer.

As shown in FIG. 17, since a signal line 11 is generally provided between the auxiliary cathode layer 6 and the second conductive pattern 32, for example, the signal line 11 includes an initialization signal line, and the signal line 11 may be arranged on the same layer and made of the same material as the auxiliary cathode layer 6, so the auxiliary cathode layer 6 cannot be directly electrically connected to the second conductive pattern 32 across the signal line 11 in the layer.

In this case, a first conductive connection portion 10 arranged on the same layer and made of the same material as the second conductive pattern 32 may be provided in the display substrate. For example, the first conductive connection portion 10 and the second conductive pattern 32 are integrally formed. Since the first conductive connection portion 10 is generally made of the same material as the anode pattern 4 and arranged in a different layer from the signal line 11, the first conductive connection portion 10 can cross the signal line 11 and then is electrically connected to the auxiliary cathode layer 6 through the via hole Via4.

In more detail, as shown in FIG. 17, the second conductive pattern 32 is located in the peripheral area of the display area, and is farther from the display area than the boundary of the auxiliary cathode layer 6. The first conductive connection portion 10 extends from the second conductive pattern 32 in a direction close to the display area, and overlaps with the auxiliary cathode layer 6. A via hole Via4 is provided at the overlapping position, and the first conductive connection portion 10 and the auxiliary cathode layer 6 can be electrically connected through the via hole Via4.

In some embodiments, the auxiliary cathode layer 6 includes a portion inside the display area and a plurality of auxiliary cathode connection portions extending from the display area to the peripheral area. There are a plurality of first conductive connection portions 10 extending from the second conductive pattern 32. The plurality of auxiliary cathode connection portions and the plurality of first conductive connection portions 10 are connected in a one-to-one correspondence.

In some embodiments, the auxiliary cathode connection portion and the first conductive connection portion 10 corresponding to each other are located on a straight line extending along the second direction. The auxiliary cathode connection portion is a part of the auxiliary cathode layer 6 located in the display area extending from the traces in the second direction in a one-to-one correspondence. The auxiliary cathode connection portions on the same side of the display area are parallel to each other, and the distances therebetween are equal.

As shown in FIGS. 17 and 18, the cathode layer 51 in the display substrate is located on the side of the anode layer away from the substrate. When the second conductive pattern 32 and the cathode layer 51 are arranged in different layers, The orthographic projection of the second conductive pattern 32 on the substrate and the orthographic projection of the cathode layer 51 on the substrate have a third overlapping area X7, so that the second conductive pattern 32 and the cathode layer 51 may be electrically connected through a via hole X3 provided in the third overlapping area.

It should be noted that the extension direction of the via hole X3 may be substantially the same as the extension direction of the third overlapping area.

Figure 19:
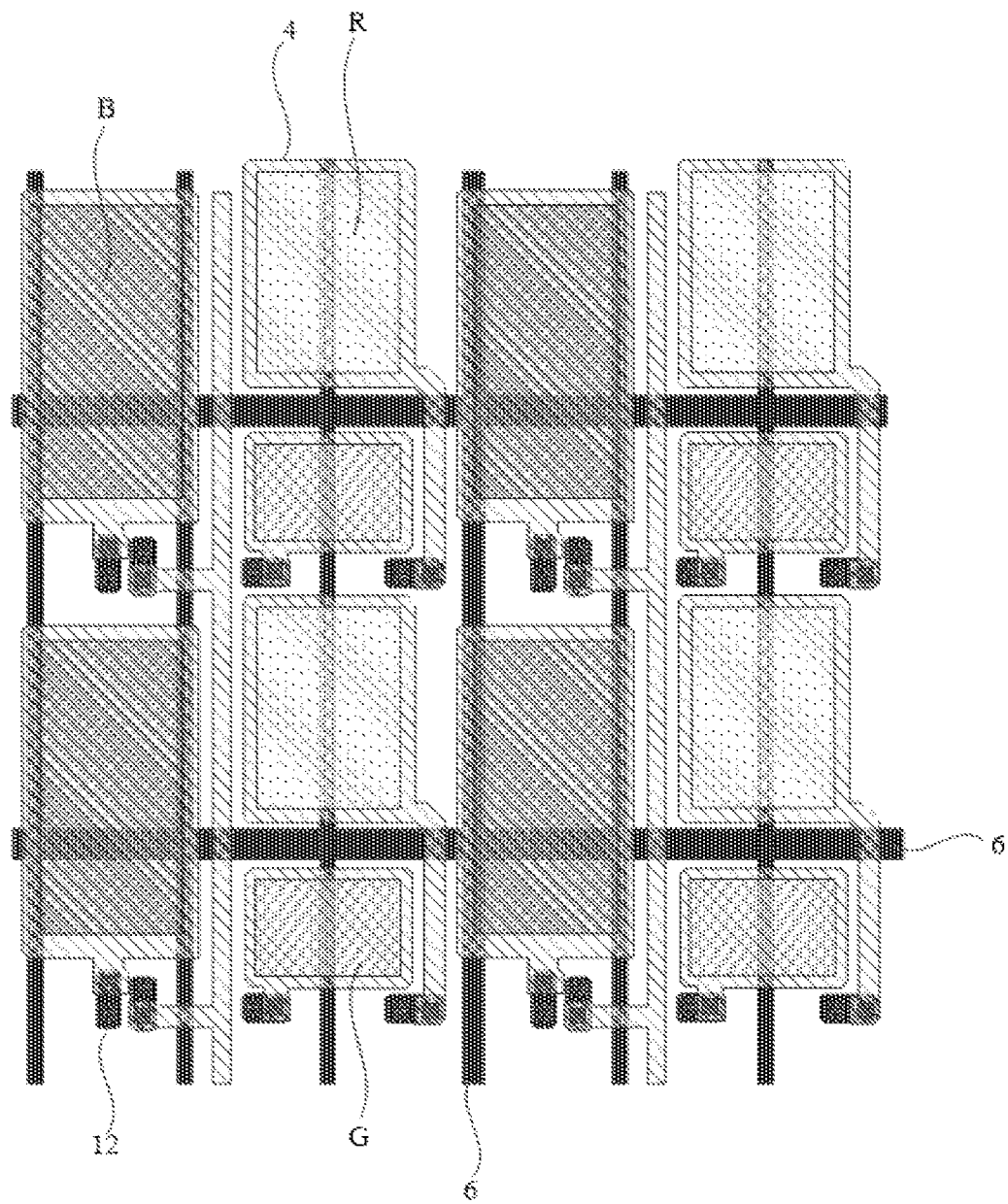
FIG. 19 is a schematic diagram showing layout of an auxiliary cathode layer and a second conductive connection pattern in the display area provided by the embodiment of the present disclosure.

As shown in FIG. 19, in some embodiments, the display substrate further includes a second conductive connection layer located between the substrate and the anode layer, and the auxiliary cathode layer 6 and the second conductive connection layer are arranged on the same layer and made of the same material, and the auxiliary cathode layer 6 and the second conductive connection layer are insulated from each other.

Specifically, the second conductive connection layer can be used to connect the first functional pattern between the second conductive connection layer and the substrate, and is located on the side of the second conductive connection layer away from the substrate, so that the electrical connection between the first functional pattern and the second functional pattern is realized.

Exemplarily, the first functional pattern includes a driving signal output terminal in a pixel driving circuit, and the second functional pattern includes an anode pattern 4.

The auxiliary cathode layer 6 and the second conductive connection layer are arranged in the same layer and made of the same material, and the auxiliary cathode layer 6 and the second conductive connection layer are insulated from each other, so that the auxiliary cathode layer 6 and the second conductive connection layer are formed in the same patterning process, which avoids adding an additional patterning process for manufacturing the auxiliary cathode layer 6, thereby effectively simplifying the manufacturing process of the display substrate. Moreover, by providing the auxiliary cathode layer 6 and the second conductive connection layer to be insulated from each other, a short circuit between the auxiliary cathode layer 6 and the second conductive connection layer is avoided, and the yield of display substrate is guaranteed.

As shown in FIG. 19, in some embodiments, the display substrate further includes: a driving circuit layer located between the substrate and the anode layer, and the driving circuit layer includes pixel driving circuits corresponding to the anode patterns 4 in a one-to-one manner.

The second conductive connection layer includes a plurality of second conductive connection patterns 12, and the second conductive connection patterns 12 correspond to the anode patterns 4 in a one-to-one manner, and the pixel driving circuit is electrically connected to the corresponding anode pattern through the corresponding second conductive connection pattern.

Specifically, the second conductive connection pattern 12 and the corresponding anode pattern 4 have an overlapping area, and a via hole is provided in the overlapping area, so that the second conductive connection pattern 12 and the corresponding anode pattern 4 can be electrically connected, and the pixel driving circuit is electrically connected to the corresponding anode pattern 4 through the corresponding second conductive connection pattern 12. The minimum distance between the orthographic projection of the second conductive connection pattern 12 on the substrate and the orthographic projection of the auxiliary cathode layer 6 on the substrate is greater than a threshold. It should be noted that the threshold can be selected between 2.5 μm and 3 μm, but it is not limited to this.

Specifically, the driving circuit layer refers to a structure that realizes the driving circuit shown in FIG. 3, which may include an active layer, a gate insulating layer, a gate metal layer, an interlayer insulating layer, a first source-drain metal layer, and a second source-drain metal layer and other structures.

Since the distance between the driving circuit layer and the anode layer is relatively far in the direction perpendicular to the substrate, a second conductive connection pattern 12 can be provided between the correspondingly connected pixel driving circuit and the anode pattern 4, so that the driving signal output end of the pixel driving circuit (which can be specifically made of the first source-drain metal layer) to be electrically connected to the corresponding anode pattern 4 through the corresponding second conductive connection pattern 12, this connection method not only reduces the difficulty of connecting the pixel driving circuit and the anode pattern 4, but also improves the reliability of the connection between the pixel driving circuit and the anode pattern 4.

When the auxiliary cathode layer 6 and the second conductive connection layer are arranged in the same layer and made of the same material, the minimum distance between the orthographic projection of the second conductive connection pattern 12 on the substrate and the orthographic projection of the auxiliary cathode layer 6 on the substrate is greater than a threshold, so as to better avoid a short circuit between the second conductive connection pattern 12 and the auxiliary cathode layer 6.

It should be noted that the auxiliary cathode layer 6 and the second conductive connection layer can both be made of the second source-drain metal layer included in the display substrate, but it is not limited thereto.

In some embodiments, the driving circuit layer includes a first source-drain metal layer and a second source-drain metal layer, and the positive power signal line in the display substrate and the first source-drain metal layer are arranged in the same layer and made of the same material, the auxiliary cathode layer, the second conductive connection layer and the second source-drain metal layer are arranged in the same layer and made of the same material.

By arranging the auxiliary cathode layer 6, the second conductive connection layer and the second source-drain metal layer in the same layer and the same material, the auxiliary cathode layer 6, the second conductive connection layer and the second source-drain metal layers can be formed at the same time in the same patterning process, which greatly simplifies the manufacturing process of the display substrate and saves the manufacturing cost. In addition, the auxiliary cathode layer 6 and the second source-drain metal layer are arranged in the same layer, so that the positive power supply signal line (VDD) in the display substrate has a larger layout space, so that the voltage drop generated on the positive power signal line is reduced by laying out the lager area positive power signal line.

In some embodiments, the display substrate further includes a plurality of repeating units, each repeating unit includes at least three sub-pixels arranged at intervals, and each sub-pixel includes one anode pattern, an anode spacing area is formed between two adjacent anode patterns.

Specifically, the display substrate may include a plurality of repeating units, the plurality of repeating units are arranged in an array, each repeating unit may include at least three sub-pixels arranged at intervals, and each of the sub-pixels included in the repeating unit includes an organic light-emitting material layer 83. The organic light-emitting material layer 83 can emit white light or colored light. When white light is emitted, each sub-pixel needs to be provided with a corresponding color resist pattern.

It should be noted that R, G, and B in FIG. 14*b*, FIG. 15, FIG. 17, FIG. 19, FIG. 20 and FIG. 21 may correspond the color resist patterns or organic light-emitting material layers in corresponding colors.

The anode patterns 4 correspond to the sub-pixels in a one-to-one manner, and each sub-pixel includes the corresponding anode pattern 4, and the area between the anode patterns 4 in the adjacent sub-pixels forms the anode spacing area.

Figure 20:
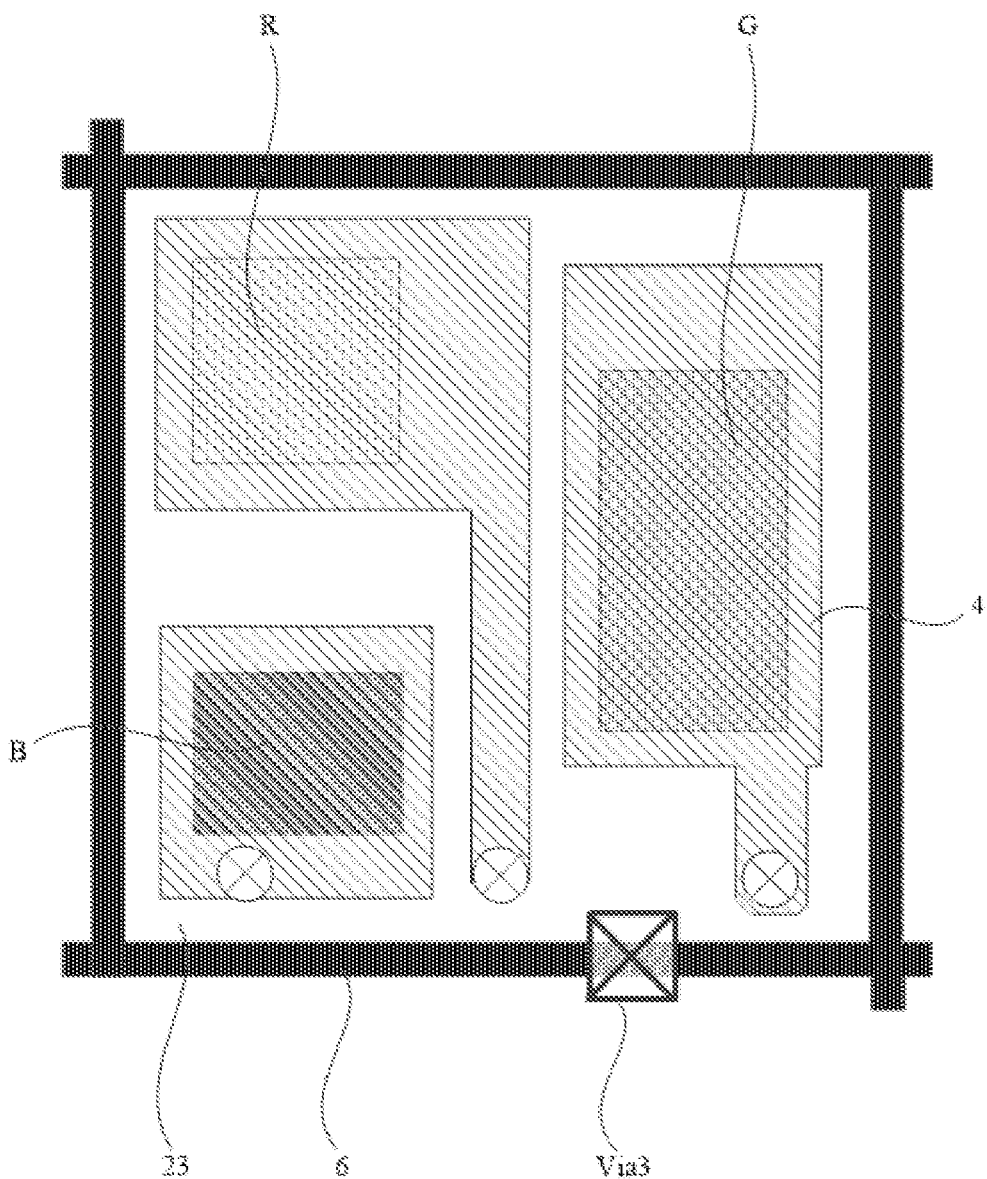
FIG. 20 is a schematic view showing a seventh structure in the display area in the display substrate provided by an embodiment of the present disclosure embodiment.

The specific structure of the auxiliary cathode layer 6 is various. As shown in FIG. 20, in some embodiments, the auxiliary cathode layer 6 is formed as a mesh structure. The mesh structure includes a body portion. The body portion defines a plurality of third enclosed areas 23, the third enclosed areas 23 correspond to the repeating units in one-to-one manner, and the orthographic projections of the third enclosed areas 23 on the substrate of the display substrate surround the orthographic projections of the anode areas in the repeating units on the substrate in a one-to-one manner, and the anode area includes the anode pattern 4 included in each sub-pixel in the repeating unit.

Specifically, there are various specific layout modes of the body portion. For example, the body portions can define a plurality of third enclosed areas 23, and the orthographic projections of the third enclosed areas 23 on the display substrate surround the orthographic projections the anode areas in the repeating units in a one-to-one manner.

As shown in FIG. 20, each repeating unit includes a red sub-pixel, a blue sub-pixel, and a green sub-pixel; the plurality of repeating units are arranged in an array, and the plurality of repeating units are divided into multiple columns of repeating units. Each column of repeating units includes a plurality of repeating units arranged along a first direction, and each column of repeating units is divided into two columns of sub-pixels, wherein one column of sub-pixels includes a plurality of the red sub-pixels and a plurality of the blue sub-pixels. The red sub-pixels and the blue sub-pixels are alternately arranged along the first direction, and the other column of sub-pixels includes a plurality of green sub-pixels arranged along the first direction.

It should be noted that the third enclosed area 23 means that the body portion of the mesh structure includes a plurality of line segments, and these line segments are connected end to end to form the enclosed area, and there is no break in the area.

Figure 21:
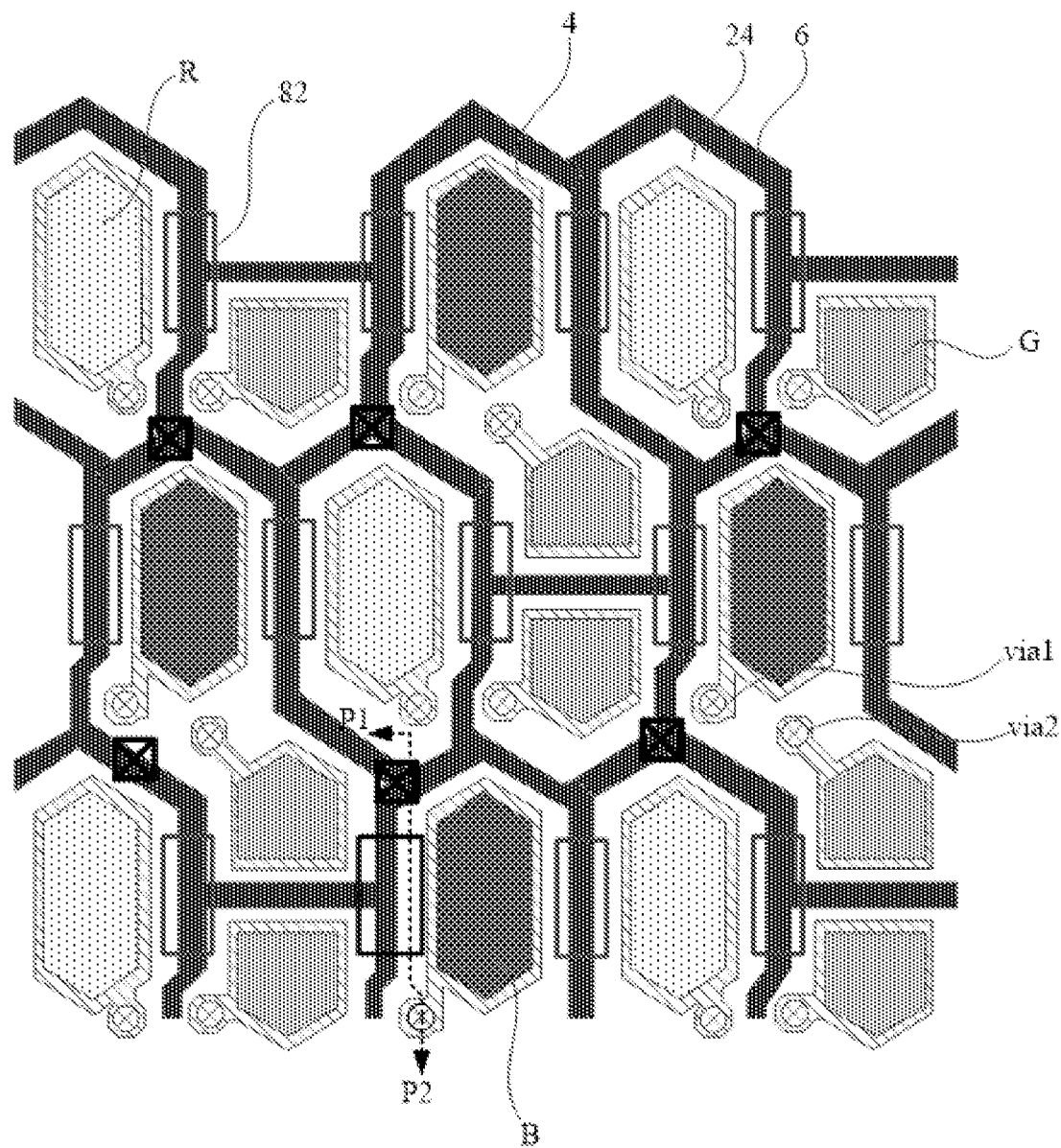
FIG. 21 is a schematic view showing an eighth structure in the display area in the display substrate provided by an embodiment of the present disclosure.

As shown in FIG. 21, in some other embodiments, the auxiliary cathode layer 6 is formed as a mesh structure, and the mesh structure includes a body portion that defines a plurality of fourth enclosed areas 24.

All the sub-pixels included in the plurality of repeating units may be divided into multiple groups of sub-pixel groups, and each group of sub-pixel includes at least one of the sub-pixels;

The orthographic projections of the fourth enclosed areas 24 on the substrate of the display substrate surround the orthographic projections of the anode areas in the sub-pixel group on the substrate in a one-to-one manner, and the anode area includes the anode pattern 4 included in each sub-pixel in the sub-pixel group.

Exemplarily, it can be set that the body portion can define a plurality of fourth enclosed areas 24, and the orthographic projection of the fourth enclosed areas 24 on the substrate of the display substrate surround the orthographic projection of the anode area in the sub-pixel groups on the substrate in a one-to-one correspondence.

It should be noted that each sub-pixel group may include at least one sub-pixel, and each sub-pixel can only belong to one sub-pixel group.

In more detail, the sub-pixel group may include at least one sub-pixel of the same color; and/or, the sub-pixel group may include at least two sub-pixels of different colors.

There are various specific structures of the repeating unit. As shown in FIG. 21, in some embodiments, each repeating unit includes one red sub-pixel, one blue sub-pixel, and two green sub-pixels; the orthographic projection of at least part of the body portion on the substrate of the display substrate is located between the orthographic projections of the anode pattern 4 in the two green sub-pixels on the substrate.

Specifically, in one of the repeating units, the minimum distance between the anode patterns 4 corresponding to the adjacent green sub-pixels is generally about 15 μm. Therefore, the orthographic projection of at least part of the body portion on the substrate is located between the orthographic projections of anode patterns 4 the two green sub-pixels on the substrate, and the width of the body portion in the direction perpendicular to its extension direction is set to be about 5 which can ensure that the good shunting effect of the auxiliary cathode layer 6, can also prevent a short circuit between the auxiliary cathode layer 6 and the anode pattern 4.

As shown in FIG. 15, in some embodiments, the plurality of repeating units are arranged in an array, each repeating unit includes a plurality of sub-pixels, and the plurality of sub-pixels includes one red sub-pixel, one blue sub-pixel, and two green sub-pixels; in each repeating unit, the two green sub-pixels are arranged along a first direction, the red sub-pixel is located on the first side of the two green sub-pixels, and the blue sub-pixel is located on the second side of the two green sub-pixels, the first side and the second side are opposite along a second direction, and the second direction is perpendicular to the first direction.

Specifically, each of the plurality of repeating units may include: one red sub-pixel, one pair of green sub-pixels, and one blue sub-pixel arranged along the X direction. The pair of green sub-pixels may include two green sub-pixels arranged along the Y direction.

The adjacent repeating units in the adjacent repeating unit groups have a certain offset along the X direction. Therefore, the sub-pixels of the same color in adjacent repeating unit groups are not aligned in the X direction. In some examples, the offset of the same color sub-pixels in the adjacent repeating unit groups in the X direction may be half of the size of the repeating unit in the X direction. For example, the size of the repeating unit in the X direction may be the pitch of the repeating unit in the X direction.

Since the pair of green sub-pixels can include two green sub-pixels arranged along the Y direction, when the light-emitting layer is prepared by the FMM evaporation process, the light-emitting layers of the two green sub-pixels in each pair of green sub-pixels be connected. The light-emitting layers of the two green sub-pixels in each pair of green sub-pixels are formed through one evaporation hole of the FMM.

In addition, although the shape of the body portion of each sub-pixel in the drawings includes strictly a corner formed by two line segments, in some embodiments, the shape of the effective light-emitting area of each sub-pixel may be rounded. In other words, on the basis of the above-mentioned various graphic shapes, the corners of the effective light-emitting area of each sub-pixel are rounded. For example, when the light-emitting layer is vapor-deposited through a mask, the corner portion of the light-emitting layer may naturally form a rounded shape.

In some examples, as shown in FIG. 15, the shapes of the body portions of the red sub-pixel and the blue sub-pixel may both be hexagons, and the three sets of opposite sides of the hexagon are all parallel. The shape of the body portion of each green sub-pixel may be a pentagon, the pentagon includes two non-right-angled crossing sides, a set of parallel opposite sides and a vertical side, and the vertical side is perpendicular to the set of parallel opposite sides, the two non-right-angled crossing sides are connected between a set of parallel opposite sides; wherein, the vertical sides in the green sub-pixels in each pair of green sub-pixels are arranged adjacently.

In some examples, as shown in FIG. 15, a set of longer parallel sides in the body portion of the red sub-pixel and a set of longer parallel sides in the body portion of the blue sub-pixel are parallel to a set of parallel opposite sides of the body portion in the green sub-pixel.

In some examples, as shown in FIG. 15, the area of the red sub-pixel is larger than the area of one green sub-pixel, and the area of the blue sub-pixel is larger than the area of one green sub-pixel. It should be noted that the area of the sub-pixel may include the area of the orthographic projection of the pixel opening corresponding to the sub-pixel on the substrate.

In some examples, as shown in FIG. 15, the distance in the X direction of two adjacent staggered repeating units in the Y direction is greater than one of the maximum span of the red sub-pixel, the maximum span of the green sub-pixel, and the maximum span of the blue sub-pixel, or the combination thereof.

In some examples, as shown in FIG. 15, in a repeating unit, the farthest distance in the Y direction of the two green sub-pixels in the pair of green sub-pixels is greater than the farthest distance of any two points of the red sub-pixel in the Y direction.

In some examples, as shown in FIG. 15, in a repeating unit, the farthest distance in the Y direction of the two green sub-pixels in the pair of green sub-pixels is greater than the distance between any two points of the blue sub-pixel in the Y direction.

In some examples, as shown in FIG. 15, the adjacent sub-pixels of the red sub-pixel do not include the red sub-pixel, the adjacent sub-pixels of the green sub-pixel pair do not include the green sub-pixel, and the adjacent sub-pixels of the blue sub-pixel do not include blue sub-pixel.

In some examples, as shown in FIG. 15, in the X direction and the Y direction, the two red sub-pixels are divided by other sub-pixels except the red sub-pixel, and the two blue sub-pixels are divided by the other sub-pixels except the blue sub-pixel. The pair of green sub-pixel are divided by other sub-pixels except the green sub-pixel.

In some examples, two adjacent repeating units in the X direction are arranged as a repeating group. Exemplarily, in the same repeating group, a pair of green sub-pixels in one repeating unit is between the maximum span of a red sub-pixel and a blue sub-pixel in the other repeating unit in the X direction.

In some examples, two adjacent repeating units in the Y direction are arranged as a repeating group. Exemplarily, in the same repeating group, a red sub-pixel in one repeating unit is between the maximum span of a pair of green sub-pixels and a blue sub-pixel in another repeating unit in the X direction.

In some examples, two adjacent repeating units in the X direction are arranged as a repeating group. Exemplarily, in the same repeating group, a blue sub-pixel in one repeating unit is between the maximum span of a pair of green sub-pixels and a red sub-pixel in another repeating unit in the X direction.

In some examples, in the same repeating unit, the minimum distance in the Y direction between two green sub-pixels in the same pair of green sub-pixel is smaller than the maximum span of one red sub-pixel in the Y direction.

In some examples, in the same repeating unit, the minimum distance in the Y direction between two green sub-pixels in the same pair of green sub-pixel is smaller than the maximum span of one blue sub-pixel in the Y direction.

In some examples, the arrangement of the sub-pixels in the repeating unit in the repeating unit group of odd-numbered columns is the same, and the arrangement of the sub-pixels in the repeating unit in the repeating unit group of even-numbered columns is the same. For example, except for the edge portion of the display area of the substrate, the line connecting the centers of two green sub-pixels in each repeating unit is located between the centers of two adjacent red and blue sub-pixels in an adjacent repeating unit group. In addition, the edges of the two green sub-pixels are inside the outer edges of the two adjacent red and blue sub-pixels, and the outer edge here refers to the edges of the two sub-pixels opposite to each other in the Y direction. That is, in the Y direction, the extension range of a pair of green sub-pixels in the Y direction is not greater than the extension range of the two adjacent red and blue sub-pixels in the Y direction. In addition, in the embodiments of the present disclosure, unless otherwise specified, the "center" of the sub-pixel refers to the geometric center of the shape of the sub-pixel.

It should be noted that, when designing the sub-pixel arrangement structure, the sub-pixels are generally designed in regular shapes, such as hexagons, pentagons, trapezoids, or other shapes. When designing, the center of the sub-pixel may be the geometric center of the aforementioned regular shape. However, in the actual manufacturing process, the formed shape of the sub-pixels generally has a certain deviation from the regular shape designed above. For example, the corners of the aforementioned regular shape may become rounded corners, and therefore, the shape of the sub-pixels may be rounded corners. In addition, the shape of the actually manufactured sub-pixel may have other changes from the designed shape. For example, the shape of a sub-pixel designed as a hexagon may become approximately elliptical in actual manufacturing. Therefore, the center of the sub-pixel may not be a strict geometric center of the irregular shape of the sub-pixel formed by manufacturing. In the embodiment of the present disclosure, the center of the sub-pixel may have a certain offset from the geometric center of the shape of the sub-pixel. The center of a sub-pixel refers to any point in the area enclosed by specific points on a radial line segment starting from the geometric center of the sub-pixel to each point on the edge of the sub-pixel, and the specific points on the radial line segment is located at the ⅓ length of the radial line segment. The definition of the center of the sub-pixel is applicable to the center of a regular-shaped sub-pixel, and it is also applicable to the center of an irregular-shaped sub-pixel.

In some embodiments, in each adjacent three repeating unit groups, the three adjacent columns include the first row, the second row, and the third row in sequence along the column direction (i.e., the Y direction), and the shortest distance in the row direction between the centers of the two green sub-pixels in the pair of green sub-pixels is smaller than the smallest distance in the row direction between the center of the red sub-pixel in the first row and the center of the red sub-pixel in the third row.

In some embodiments, the sides of the red sub-pixels in the X direction and the sides of the blue sub-pixels in the X direction are arranged in parallel.

In some embodiments, in each repeating unit, the red sub-pixel, the pair of green sub-pixels, and the blue sub-pixel are arranged in the same order.

In some embodiments, a plurality of repeating units are arranged along the X direction to form a repeating unit group, the repeating unit group is arranged along the Y direction, and the repeating units in two adjacent repeating unit groups are arranged in a staggered manner. Exemplarily, the repeating units in two adjacent repeating unit groups differ by ½ the size of the repeating unit. It should be noted that the size of the aforementioned one repeating unit may be: the distance between the centers of the same color sub-pixels in two adjacent repeating units in the X direction. For example, the size of one repeating unit mentioned above may be: the distance between the centers of the red sub-pixels in two adjacent repeating units in the X direction.

When the display substrate adopts the above-mentioned pixel arrangement, when the auxiliary cathode layer 6 is provided, the auxiliary cathode layer 6 can be arranged in mesh structure crossing in horizontal and vertical directions. When the auxiliary cathode layer 6 is laid out, the following layout methods can be included.

For example, the mesh structure includes a horizontal and vertical intersection, and the orthographic projection of the intersection on the substrate coincides with the orthographic projection of the center point of the body portion 41 of the anode pattern 4 on the substrate.

For example, the mesh structure includes horizontal and vertical intersections, and the orthographic projection of the intersections on the substrate is in the orthographic projection of an area between two green sub-pixels in a pair of green sub-pixels on the substrate.

For example, the mesh structure includes horizontal and vertical intersections, and the orthographic projection of the intersections on the substrate does not overlap the orthographic projection of the anode pattern 4 on the substrate.

As shown in FIG. 15, when the display substrate adopts the above-mentioned pixel arrangement, when the second conductive connection pattern 12 is provided, the second conductive connection pattern 12 corresponds to the anode pattern 4 included in each sub-pixel in a one-to-one manner. The second conductive connection pattern 12 and the corresponding anode pattern 4 have an overlapping area, and a via hole is provided in the overlapping area, so that the second conductive connection pattern 12 and the corresponding anode pattern 4 can be electrically connected. The minimum distance between the orthographic projection of the second conductive connection pattern 12 on the substrate and the orthographic projection of the auxiliary cathode layer 6 on the substrate is greater than a threshold.

It should be noted that the above-mentioned specific positions of the via holes for connecting the second conductive connection pattern 12 and the anode pattern 4 are various. In order to avoid the influence of the via hole on the body portion 41, in the same sub-pixel, the orthographic projection of the body portion 41 on the substrate does not overlap the orthographic projection of the via hole on the substrate.

For example, the orthographic projection of the effective portion of the body portion 41 (that is, the portion forming the light-emitting layer) on the substrate does not overlap the orthographic projection of the via hole on the substrate, and the orthographic projection of the peripheral area of the body portion on the substrate overlaps the orthographic projection of the via hole on the substrate, and the area of the overlapping area may be 30% of the area of the body portion.

For example, the via holes corresponding to all anode patterns included in the repeating units in the same row may be located on a straight line extending along the X direction to reduce the design difficulty of the mask used for manufacturing.

Exemplarily, the first direction includes the Y direction, and the second direction includes the X direction. When the repeating unit adopts the above structure, a GGRB pixel arrangement in a sub-pixel rendering (SPR) pixel arrangement is formed. In this GGRB pixel arrangement, for a display substrate with FHD resolution, in the pixel opening formed by the pixel defining layer 80, the minimum width of the gap formed between adjacent pixel opening areas is between 6 µm and 13 µm, when the orthographic projection of the auxiliary cathode layer 6 on the substrate is located below the pixel opening area of each sub-pixel, the width of the body portion in the auxiliary cathode layer 6 with a mesh structure can be set to 3 µm-10 µm. At the same time, the body portion can be arranged directly below the middle part of the anode pattern 4 in each sub-pixel to avoid the color separation phenomenon of the display device when the display substrate is applied to the display device.

In the above GGRB pixel arrangement, the location of the connection via hole Via3 for connecting the cathode layer 51 and the auxiliary cathode layer 6 should avoid the anode pattern 4, and the number of the connection via holes Via3 can correspond to the number of the sub-pixels, and the connection via holes Via3 can be punched in the area where the corresponding sub-pixels are located; or the connection via holes Via3 may correspond to part of the sub-pixels. Correspondingly, the connection via holes Via3 are punched in the area where the corresponding sub-pixels are located; in the GGRB pixel arrangement, the auxiliary cathode layer 6 can be rationally arranged so that the voltage drop of VSS can be reduced 30% of the original voltage drop.

As shown in FIG. 14*b*, in some embodiments, the plurality of repeating units are arranged in an array, each repeating unit includes a plurality of sub-pixels, and the plurality of sub-pixels includes one red sub-pixel, one blue sub-pixel, and one green sub-pixel. The green sub-pixel, the red sub-pixel, and the blue sub-pixel are sequentially arranged along the second direction.

Specifically, when the repeating unit adopts the above structure, it is formed as a strip arrangement in the real RGB pixel arrangement. In this strip arrangement, for a display substrate with FHD resolution, among the pixel openings formed by the pixel defining layer 80, the minimum width of the gap formed between adjacent pixel opening areas is between 6 µm and 13 µm, when the orthographic projection of the auxiliary cathode layer 6 on the substrate is within the orthographic projection of the gap on the substrate, the width of the body portion in the auxiliary cathode layer 6 of the mesh structure is related to the minimum width of the gap. Illustratively, the width of the body portion can be set between 5 μm and 12 μm.

In this strip arrangement, when the orthographic projection of the auxiliary cathode layer 6 on the substrate is within the orthographic projection of the gap on the substrate, and the auxiliary overlapping area includes a strip area extending along the first direction, the orthographic projection of the connection via hole Via3 on the substrate is a stripe pattern extending along the first direction, the VSS voltage drop can be reduced by 40% of the original voltage drop.

The embodiments of the present disclosure also provide a display device, which includes the display substrate provided in the above-mentioned embodiments.

In the display substrate provided by the foregoing embodiment, by arranging the auxiliary cathode layer 6 in parallel with the cathode layer 51, the resistance of the cathode layer 51 is well reduced. At the same time, since the cathode layer 51 is electrically connected to the VSS in the display substrate, so that the resistance of the VSS is greatly reduced, and the voltage drop of the VSS is reduced, thereby reducing the voltage difference between the VSS and the power signal line VDD in the display substrate, and better reducing the power consumption of the display substrate applied for the display screen. Therefore, when the display device provided by the embodiment of the present disclosure includes the above-mentioned display substrate, it also has the above-mentioned beneficial effects, which will not be repeated here.

It should be noted that the display device may be any product or component with a display function, such as a TV, a monitor, a digital photo frame, a mobile phone, a tablet computer, and so on.

The embodiment of the present disclosure also provides a method of manufacturing the display substrate, including: forming an auxiliary cathode layer 6 on the substrate; forming a first insulating layer on the side of the auxiliary cathode layer 6 away from the substrate; forming an anode layer on the side of the first insulating layer away from the substrate, the anode layer includes a plurality of anode patterns 4 spaced apart from each other, and an anode spacing area is formed between adjacent anode patterns 4; forming a second insulating layer on the side of the anode layer away from the substrate; forming a cathode layer 51 on the side of the second insulating layer away from the substrate. The orthographic projection of the auxiliary cathode layer 6 on the substrate and the orthographic projection of the cathode layer 51 on the substrate form an auxiliary overlapping area, the auxiliary cathode layer 6 and the cathode layer 51 are electrically connected through a connection via hole Via3 provided in the auxiliary overlapping area; the orthographic projection of the connection via hole Via3 on the substrate is located within the orthographic projection of the anode spacing area the on the substrate.

In the display substrate manufactured by the manufacturing method provided by the embodiment of the present disclosure, the auxiliary cathode layer 6 is arranged in parallel with the cathode layer 51, which greatly reduces the resistance of the cathode layer 51. At the same time, since the cathode layer 51 is electrically connected to the VSS in the display substrate, so that the resistance of the VSS is greatly reduced, and the voltage drop of the VSS is reduced, thereby reducing the voltage difference between the VSS and the power signal line VDD in the display substrate, and better reducing the power consumption of the display screen applied to the display screen. It is worth noting that according to the IR-Drop simulation results, the VSS voltage drop can be reduced by 30% to 50% of the original voltage drop.

In some embodiments, the step of forming the auxiliary cathode layer 6 specifically includes: forming the auxiliary cathode layer 6 and the second conductive connection layer between the substrate and the anode layer in the display substrate through one patterning process at the same time. The auxiliary cathode layer 6 is insulated from the second conductive connection layer.

Specifically, the second conductive connection layer can be used to connect the first functional pattern between the second conductive connection layer and the substrate, and the second functional pattern on the side of the second conductive connection layer facing away from the substrate, so that the electrical connection between the first functional pattern and the second functional pattern is realized.

The auxiliary cathode layer 6 and the second conductive connection layer are arranged in the same layer and made of the same material, and the auxiliary cathode layer 6 and the second conductive connection layer are arranged to be insulated from each other, so that the auxiliary cathode layer 6 and the second conductive connection layer are formed in the same patterning process, which avoids adding an additional patterning process for manufacturing the auxiliary cathode layer 6, thereby effectively simplifying the manufacturing process flow of the display substrate. Moreover, by setting the auxiliary cathode layer 6 and the second conductive connection layer insulated from each other, a short circuit between the auxiliary cathode layer 6 and the second conductive connection layer is avoided, and the yield of the display substrate is ensured.

As shown in FIGS. 22a to 22e, in some embodiments, the first insulating layer is a planarization layer, and forming the first insulating layer on the side of the auxiliary cathode layer 6 away from the substrate includes: forming a planarization layer 81 on the side of the auxiliary cathode layer 6 away from the substrate, and the planarization layer 81 is provided with auxiliary openings of the planarization layer 81 capable of exposing at least part of the auxiliary cathode layer 6.

The forming an anode layer on the side of the first insulating layer away from the substrate includes: forming the anode layer on the side of the planarization layer 81 away from the substrate, and the orthographic projection of each anode pattern 4 included in the anode layer on the substrate does not overlap the auxiliary opening of the planarization layer 81.

The second insulating layer includes a pixel defining layer and an organic light-emitting material layer, and the forming the second insulating layer on the side of the anode layer away from the substrate includes: forming a pixel defining layer 80 on the side of the anode layer away from the substrate. The pixel defining layer 80 is provided with a defining layer auxiliary opening 15 and a pixel opening 14; wherein, the orthographic projection of the defining layer auxiliary opening 15 on the substrate is surrounded by the orthographic projection of the auxiliary opening of the planarization layer 81 on the substrate. The defining layer auxiliary opening 15 can expose at least part of the auxiliary cathode layer 6; the pixel opening 14 and the anode patterns 4 have a one-to-one correspondence, and the pixel openings 14 can expose at least part of the corresponding anode patterns 4; forming a sacrificial pattern 9 on the exposed surface of the auxiliary cathode layer 6 away from the substrate; forming an organic light-emitting material layer, the organic light-emitting material layer includes a portion at least covering the anode pattern 4 and a portion covering the sacrificial pattern, the portion at least covering the anode pattern 4 and the portion covering the sacrificial pattern are independent of each other; and removing the sacrificial pattern and the portion of the organic light-emitting material layer covering the sacrificial pattern to form the connection via hole Via3 capable of exposing a part of the auxiliary cathode layer 6.

The forming the cathode layer 51 on the side of the second insulating layer away from the substrate includes: forming a cathode layer 51 on the side of the organic light-emitting material layer away from the substrate, and the cathode layer 51 is electrically connected to the auxiliary cathode layer 6 through the connection via hole Via3.

Specifically, after forming the auxiliary cathode layer 6, a planarization layer 81 is formed on the side of the auxiliary cathode layer 6 away from the substrate, and the auxiliary opening of planarization layer 81 capable of exposing at least part of the auxiliary cathode layer 6 is formed on the planarization layer 81, the orthographic projection of the auxiliary opening of planarization layer 81 on the substrate is located inside the orthographic projection of the auxiliary cathode layer 6 on the substrate, and the minimum distance between the boundary of the orthographic projection of auxiliary openings of planarization layer 81 on the substrate and the boundary of the orthographic projection of the auxiliary cathode layer 6 on the substrate is greater than or equal to 1 µm.

The conductive material, such as indium tin oxide, is used to form the anode layer on the side of the planarization layer 81 away from the substrate through a patterning process, and the orthographic projection of each anode pattern 4 included in the anode layer on the substrate does not overlap the auxiliary opening of planarization layer 81 to avoid short circuit between the anode pattern 4 and the auxiliary cathode layer 6 exposed by the auxiliary opening of planarization layer 81.

A pixel defining layer 80 and spacers are formed on the side of the anode layer away from the substrate, and the pixel defining layer 80 is patterned to form a defining layer auxiliary opening 15 and a pixel opening 14. The defining layer auxiliary openings correspond to the auxiliary openings of planarization layer 81 in a one-to-one manner, and the defining layer auxiliary opening and the corresponding auxiliary openings of planarization layer 81 are nested. Specifically, the orthographic projection of the defining layer auxiliary openings on the substrate is surrounded by the orthographic projection of the corresponding auxiliary opening of planarization layer 81 on the substrate, and the defining layer auxiliary opening continue to expose at least part of the auxiliary cathode layer 6; further, the minimum distance between the boundary of the orthographic projection of the auxiliary opening of planarization layer 81 on the substrate and the boundary of the orthographic projection of the corresponding defined layer auxiliary opening on the substrate is greater than or equal to 2 µm.

A sacrificial material layer is deposited on the substrate on which the spacers 82 are formed, a photoresist is formed on the surface of the sacrificial material layer away from the substrate, and the sacrificial pattern 9 located in the defined layer auxiliary opening is formed through processes such as exposure, development, and etching. The sacrificial pattern is located on the surface of the auxiliary cathode layer 6 exposed by the defining layer the auxiliary opening; it is worth noting that the sacrificial pattern 9 can be formed by etching with a wet etching process, so that the cross-section of the sacrificial pattern 9 can be formed as an inverted trapezoid; it should be noted that the lower layer of the sacrificial pattern 9 should be as flat as possible, which is more conducive to the peeling off process.

An organic light-emitting material layer 83 is formed by continuing to implement vaporizing. The organic light-emitting material layer 83 includes: a sixth part covering the anode pattern 44, the defining layer auxiliary opening, the spacer 82 and at least part of the pixel defining layer 80, and a seventh part covering the sacrificial pattern, the sixth part and the seventh part are disconnected at the edge of the sacrificial pattern 9 in the defining layer auxiliary opening, that is, the sixth part and the seventh part are independent of each other; it is worth noting that the organic light-emitting material layer 83 of the above structure can emit white light, and in this case, a color resist pattern (such as a red color resist pattern, a green color resist pattern, a blue color resist pattern) can be formed at the position corresponding to the pixel opening. Moreover, when the white organic light emitting material layer 83 is formed, the white organic light emitting material layer 83 may be formed on both the upper and lower layers of the color resist pattern. In addition, it is also possible to form a colored organic light-emitting material layer only in the pixel openings, for example, a red organic light-emitting material layer is formed in some pixel openings, a green organic light-emitting material layer is formed in other pixel openings, and a blue organic light-emitting material layer is formed in the other pixel openings.

Then, the substrate on which the organic light-emitting material layer 83 is formed is immersed in a peeling solution, and then taken out after standing for 0.5 min-2 min, and then the substrate is appropriately tilted to facilitate the sacrificial pattern 9 to fall off. At the same time as the sacrificial pattern layer falls off, the photoresist on the sacrificial surface and the fifth part of the organic light-emitting material layer 83 are simultaneously taken away to form the connection via hole Via3 that can expose a part of the auxiliary cathode layer 6. It should be noted that the peeling solution may be a fluoroether solvent that does not damage the organic light-emitting material layer 83.

Figure 22A:
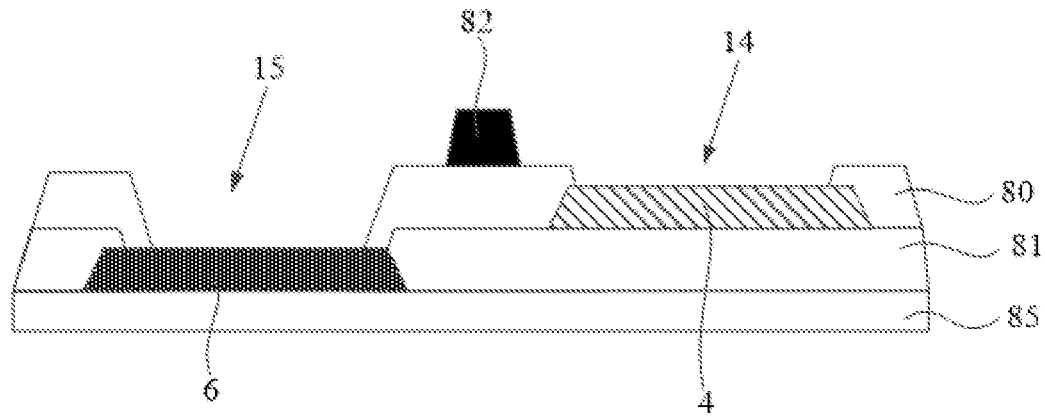
FIGS. 22a to 22e are second flow charts of the LIFT-OFF process at the P1P2 cross section in FIG. 21.
Figure 22B:
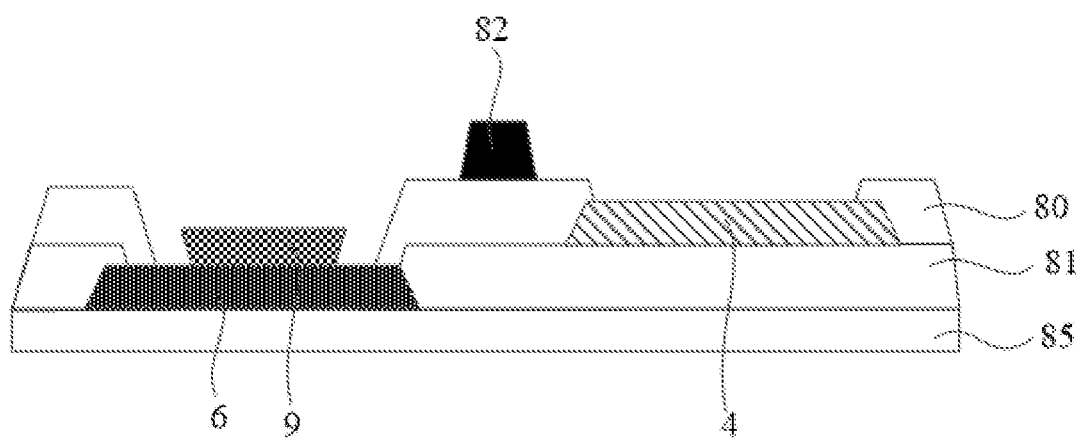
Figure 22C:
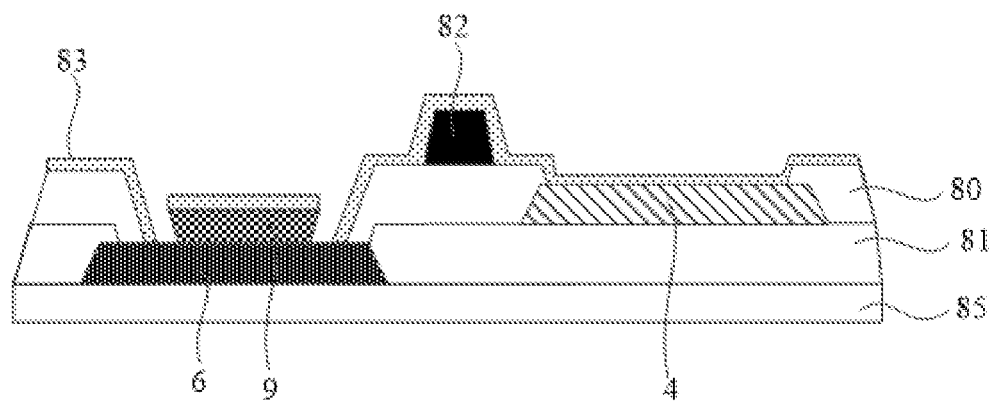
Figure 22D:
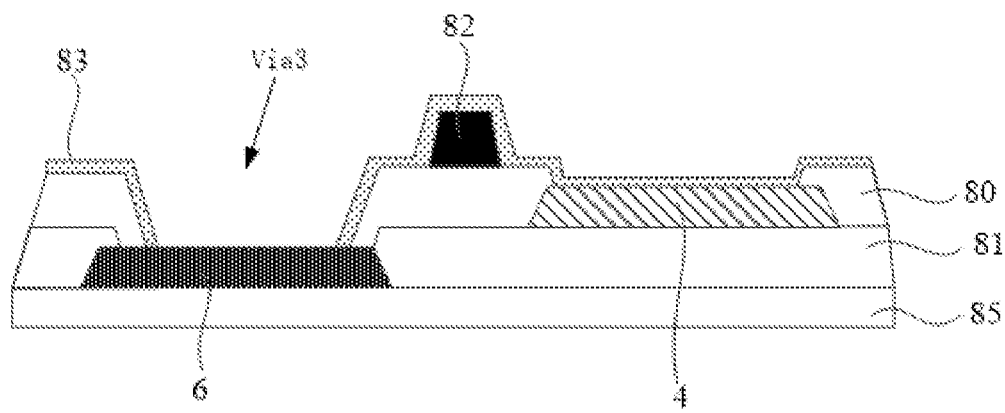
Figure 22E:
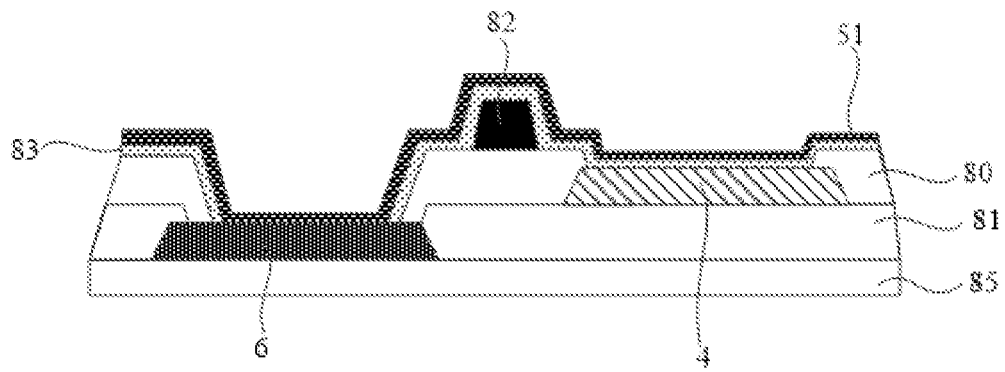

As shown in FIGS. 18 and 22e, the cathode layer 51 is continuously evaporated. The first part of the cathode layer 51 covers the plurality of pixel openings; the other part of the cathode layer 51 is located in the anode spacing area, which can be electrically connected to the auxiliary cathode layer 6 through the connection via hole Via3, the third part of the cathode layer 51 can be coupled to the second conductive pattern 32 of the second electrode 3 through the third via hole.

In the display substrate manufactured by the manufacturing method provided in the foregoing embodiment, by rationally arranging the auxiliary cathode layer 6 and interconnecting with the upper cathode layer 51, the resistance of the cathode layer 51 can be effectively reduced, thereby improving the IR Drop problem of the cathode layer 51. Moreover, the current path of VSS is changed from two-dimensional to three-dimensional distribution, that is, VSS current can not only converge from the cathode to the periphery to the second electrode 3, and then flow into the chip, but also can converge to the chip through the auxiliary cathode layer 6, that is, the cathode current in the display area has two layers of current paths.

It should be further appreciated that, the above embodiments have been described in a progressive manner, and the same or similar contents in the embodiments have not been repeated, i.e., each embodiment has merely focused on the difference from the others. Especially, the device embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, area or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate comprising: a substrate, and an auxiliary cathode layer, a first insulating layer, an anode layer, a second insulating layer, and a cathode layer that are sequentially stacked on the substrate in a direction away from the substrate; wherein
the anode layer includes a plurality of anode patterns spaced apart from each other, and an anode spacing area is formed between adjacent anode patterns;
an orthographic projection of the auxiliary cathode layer on the substrate and an orthographic projection of the cathode layer on the substrate have an auxiliary overlapping area, and the auxiliary cathode layer is electrically connected to the cathode layer through a connection via hole in the auxiliary overlapping area; an orthographic projection of the connection via hole on the substrate is located inside an orthographic projection of the anode spacing area on the substrate; and
the display substrate further comprises a plurality of repeating units, wherein each repeating unit includes at least three sub-pixels arranged at intervals, and each sub-pixel includes one anode pattern, an anode spacing area is formed between anode patterns of two adjacent sub-pixels.

2. The display substrate according to claim 1, wherein the auxiliary cathode layer is formed in a mesh structure, and the orthographic projection of the auxiliary cathode layer on the substrate is located inside the orthographic projection of the anode spacing area on the substrate.

3. The display substrate according to claim 2, wherein the auxiliary overlapping area includes a strip area extending in a first direction, and the orthographic projection of the connection via hole on the substrate is a strip pattern extending in the first direction.

4. The display substrate according to claim 1, wherein the auxiliary cathode layer is formed in a mesh structure, and an orthographic projection of a first part of the auxiliary cathode layer on the substrate is located inside the orthographic projection of the anode spacing area on the substrate, an orthographic projection of a second part of the auxiliary cathode layer on the substrate is located inside the orthographic projection of the anode pattern on the substrate.

5. The display substrate according to claim 4, wherein the anode pattern includes a body portion and a connection portion of an integral structure, the body portion has at least one symmetry axis, and an orthographic projection of a target portion in the second part of the auxiliary cathode layer on the substrate is axially symmetrical along the at least one symmetry axis and an orthographic projection of the target portion on the substrate is located inside an orthographic projection of the body portion on the substrate.

6. The display substrate according to claim 1, further comprising a second electrode located in a non-display area of the display substrate, and the second electrode is electrically connected to the auxiliary cathode layer and the cathode layer.

7. The display substrate according to claim 6, wherein
the second electrode includes a first conductive pattern and a second conductive pattern that are stacked, and the first conductive pattern is located between the substrate of the display substrate and the second conductive patterns;
the first conductive pattern includes:
an annular portion surrounding a display area and having an opening, and the opening of the annular portion having a first end and a second end;
a first wire inlet portion electrically connected to the first end; and
a second wire inlet portion electrically connected to the second end;
wherein the second conductive pattern has an annular shape, and an orthographic projection of the second conductive pattern on the substrate of the display substrate and an orthographic projection of the annular portion on the substrate have a first overlapping area, the second conductive pattern is electrically connected to the annular portion in the first overlapping area.

8. The display substrate according to claim 7, further comprising: a first conductive connection portion arranged on a same layer and made of a same material as the second conductive pattern, and the second conductive pattern being coupled to the auxiliary cathode layer through the first conductive connection portion;
wherein the orthographic projection of the second conductive pattern on the substrate and the orthographic projection of the cathode layer on the substrate have a third overlapping area, the second conductive pattern is electrically connected to the cathode layer in the third overlapping area.

9. The display substrate according to claim 8, further comprising:
a driving circuit layer located between the substrate and the anode layer, and the driving circuit layer includes pixel driving circuits corresponding to the anode patterns in a one-to-one manner;
the second conductive connection layer includes a plurality of second conductive connection patterns, and the second conductive connection patterns correspond to the anode patterns in a one-to-one manner, and the pixel driving circuit is electrically connected to a corresponding anode pattern through a corresponding second conductive connection pattern.

10. The display substrate according to claim 9, wherein the driving circuit layer includes a first source-drain metal layer and a second source-drain metal layer, the auxiliary cathode layer, the second conductive connection layer and the second source-drain metal layer are arranged in the same layer and made of the same material.

11. The display substrate according to claim 1, further comprising:
a second conductive connection layer located between the substrate and the anode layer, wherein the auxiliary cathode layer and the second conductive connection layer are arranged on the same layer and made of the same material, and the auxiliary cathode layer and the second conductive connection layer are insulated from each other.

12. The display substrate according to claim 11, wherein a minimum distance between the orthographic projection of the second conductive connection pattern on the substrate and the orthographic projection of the auxiliary cathode layer on the substrate is greater than a threshold.

13. The display substrate according to claim 1, wherein the auxiliary cathode layer is formed as a mesh structure, the mesh structure includes a body portion, the body portion defines a plurality of third enclosed areas, the third enclosed areas correspond to the repeating units in a one-to-one manner, and orthographic projections of the third enclosed areas on the substrate of the display substrate surround orthographic projections of the anode areas in the repeating units on the substrate in a one-to-one manner, and the anode area includes the anode pattern included in each sub-pixel in the repeating unit.

14. The display substrate according to claim 1, wherein the auxiliary cathode layer is formed as a mesh structure, and the mesh structure includes a body portion that defines a plurality of fourth enclosed areas;
all the sub-pixels included in the plurality of repeating units are divided into a plurality of sub-pixel groups, and each sub-pixel group includes at least one of the sub-pixels;
orthographic projections of the fourth enclosed areas on the substrate of the display substrate surround orthographic projections of the anode areas in the sub-pixel group on the substrate in a one-to-one manner, and the anode area includes the anode pattern included in each sub-pixel in the sub-pixel group,
wherein the sub-pixel group includes at least one sub-pixel of the same color; and/or,
the sub-pixel group includes at least two sub-pixels of different colors,
wherein each repeating unit includes one red sub-pixel, one blue sub-pixel, and two green sub-pixels; and
an orthographic projection of at least part of the body portion on the substrate of the display substrate is located between orthographic projections of the anode patterns in the two green sub-pixels on the substrate.

15. The display substrate according to claim 1, wherein the plurality of repeating units are arranged in an array, each repeating unit includes a plurality of sub-pixels, and the plurality of sub-pixels includes one red sub-pixel, one blue sub-pixel, and two green sub-pixels;
in each repeating unit, the two green sub-pixels are arranged along a first direction, the red sub-pixel is located on a first side of the two green sub-pixels, and the blue sub-pixel is located on a second side of the two green sub-pixels, the first side and the second side are opposite along a second direction, and the second direction is perpendicular to the first direction.

16. The display panel according to claim 15, wherein a line connecting centers of two green sub-pixels in each repeating unit is located between centers of two adjacent red and blue sub-pixels in adjacent repeating units,
wherein a size of a red or blue sub-pixel is larger than a size of the blue sub-pixel in the second direction;
wherein the plurality of repeating units are arranged in the second direction to form a repeating unit group, and a plurality of repeating unit groups are arranged in the first direction, to form a pixel arrangement structure of the display substrate; and
wherein adjacent repeating unit groups are staggered from each other along the second direction.

17. The display substrate according to claim 1, wherein the plurality of repeating units are distributed in array, each repeating unit includes a plurality of sub-pixels including one red sub-pixel, one blue sub-pixel and one green sub-pixel;
the green sub-pixel, the red sub-pixel, and the blue sub-pixel are sequentially arranged in the second direction.

18. A method of manufacturing a display substrate, comprising:
forming an auxiliary cathode layer on a substrate;
forming a first insulating layer on a side of the auxiliary cathode layer away from the substrate;
forming an anode layer on a side of the first insulating layer away from the substrate, wherein the anode layer includes a plurality of anode patterns spaced apart from each other, and an anode spacing area is formed between adjacent anode patterns;
forming a second insulating layer on a side of the anode layer away from the substrate;
forming a cathode layer on a side of the second insulating layer away from the substrate, wherein an orthographic projection of the auxiliary cathode layer on the substrate and an orthographic projection of the cathode layer on the substrate have an auxiliary overlapping area, the auxiliary cathode layer and the cathode layer are electrically connected through a connection via hole provided in the auxiliary overlapping area; an orthographic projection of the connection via hole on the substrate is located within an orthographic projection of the anode spacing area on the substrate;
wherein the forming the auxiliary cathode layer specifically includes:
forming the auxiliary cathode layer and the second conductive connection layer between the substrate and the anode layer in the display substrate through one patterning process at the same time, the auxiliary cathode layer being insulated from the second conductive connection layer; or
wherein the first insulating layer is a planarization layer, and forming the first insulating layer on a side of the auxiliary cathode layer away from the substrate includes:
forming the planarization layer on the side of the auxiliary cathode layer away from the substrate, wherein the planarization layer is provided with an auxiliary opening of the planarization layer capable of exposing at least part of the auxiliary cathode layer;
the forming an the anode layer on a side of the first insulating layer away from the substrate includes:

forming the anode layer on the side of the planarization layer away from the substrate, and an orthographic projection of each anode pattern included in the anode layer on the substrate does not overlap the auxiliary opening of the planarization layer;

the second insulating layer includes a pixel defining layer and an organic light-emitting material layer, and the forming the second insulating layer on the side of the anode layer away from the substrate includes:

forming the pixel defining layer on the side of the anode layer away from the substrate; wherein the pixel defining layer is provided with a defining layer auxiliary opening and a pixel opening; an orthographic projection of the defining layer auxiliary opening on the substrate is surrounded by an orthographic projection of the auxiliary opening of the planarization layer on the substrate, the defining layer auxiliary opening exposes at least part of the auxiliary cathode layer;

the pixel opening corresponds to the anode patterns in a one-to-one manner, and the pixel opening exposes at least part of the corresponding anode pattern;

forming a sacrificial pattern on an exposed surface of the auxiliary cathode layer away from the substrate;

forming the organic light-emitting material layer, wherein the organic light-emitting material layer includes a portion at least covering the anode pattern and a portion covering the sacrificial pattern, the portion at least covering the anode pattern and the portion covering the sacrificial pattern are independent of each other; and removing the sacrificial pattern and the portion of the organic light-emitting material layer covering the sacrificial pattern to form a connection via hole capable of exposing a part of the auxiliary cathode layer;

the forming the cathode layer on the side of the second insulating layer away from the substrate includes:

forming the cathode layer on the side of the organic light-emitting material layer away from the substrate, and the cathode layer is electrically connected to the auxiliary cathode layer through the connection via hole.

\* \* \* \* \*